US012666807B2

(12) United States Patent
Hodo et al.

(10) Patent No.: US 12,666,807 B2
(45) Date of Patent: Jun. 23, 2026

(54) DISPLAY DEVICE

(71) Applicant: SEMICONDUCTOR ENERGY LABORATORY CO., LTD., Atsugi (JP)

(72) Inventors: Ryota Hodo, Atsugi (JP); Yuichi Yanagisawa, Atsugi (JP); Hiromi Sawai, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 388 days.

(21) Appl. No.: 18/282,851

(22) PCT Filed: Mar. 25, 2022

(86) PCT No.: PCT/IB2022/052736
§ 371 (c)(1),
(2) Date: Sep. 19, 2023

(87) PCT Pub. No.: WO2022/214904
PCT Pub. Date: Oct. 13, 2022

(65) Prior Publication Data
US 2024/0172491 A1     May 23, 2024

(30) Foreign Application Priority Data

Apr. 8, 2021     (JP) ................................. 2021-065853

(51) Int. Cl.
*H10K 59/124*     (2023.01)
*H10K 59/121*     (2023.01)
(Continued)

(52) U.S. Cl.
CPC ......... *H10K 59/122* (2023.02); *H10K 59/121* (2023.02); *H10K 59/124* (2023.02); *H10K 59/351* (2023.02); *H10K 59/352* (2023.02)

(58) Field of Classification Search
CPC .. H10K 59/124; H10K 59/121; H10K 59/351; H10K 59/352
See application file for complete search history.

(56) References Cited

U.S. PATENT DOCUMENTS

| | | | |
|---|---|---|---|
| 5,953,985 A | 9/1999 | Kobayashi | |
| 6,120,338 A | 9/2000 | Hirano et al. | |
| (Continued) | | | |

FOREIGN PATENT DOCUMENTS

| | | | |
|---|---|---|---|
| CN | 001440015 A | 9/2003 | |
| CN | 001653855 A | 8/2005 | |
| (Continued) | | | |

OTHER PUBLICATIONS

International Search Report (Application No. PCT/IB2022/052736) Dated Jun. 28, 2022.
(Continued)

*Primary Examiner* — Joseph L Williams
(74) *Attorney, Agent, or Firm* — NIXON PEABODY LLP; Jeffrey L. Costellia

(57) ABSTRACT

Provided is a display device with high display quality. A first pixel, a second pixel provided adjacent to the first pixel, a first insulating layer, a second insulating layer over the first insulating layer, and a third insulating layer over the second insulating layer are included; the first pixel includes a first pixel electrode, a first EL layer over the first pixel electrode, and a common electrode over the first EL layer; the second pixel includes a second pixel electrode, a second EL layer over the second pixel electrode, and the common electrode over the second EL layer; the first insulating layer and the third insulating layer each contain an inorganic material; the second insulating layer contains an organic material; the second insulating layer overlaps with the side surface of the first EL layer and the side surface of the second EL layer with the first insulating layer therebetween; the second (Continued)

insulating layer overlaps with the common electrode with the third insulating layer therebetween; and the third insulating layer is in contact with the first insulating layer in a region not overlapping with the second insulating layer.

9 Claims, 24 Drawing Sheets

(51) Int. Cl.

| | |
|---|---|
| *H10K 59/122* | (2023.01) |
| *H10K 59/35* | (2023.01) |

(56) References Cited

U.S. PATENT DOCUMENTS

| | | | |
|---|---|---|---|
| 7,068,247 B2 | 6/2006 | Nakanishi | |
| 7,374,264 B2 | 5/2008 | Okano | |
| 7,399,991 B2 | 7/2008 | Seo et al. | |
| 7,534,557 B2 | 5/2009 | Tachikawa et al. | |
| 7,914,976 B2 | 3/2011 | Tachikawa et al. | |
| 9,929,220 B2 | 3/2018 | Yamazaki et al. | |
| 10,062,863 B2 | 8/2018 | Sakamoto | |
| 10,361,258 B2 | 7/2019 | Yamazaki et al. | |
| 11,367,763 B2 | 6/2022 | Ohchi | |
| 11,678,550 B2 | 6/2023 | Kato | |
| 11,793,036 B2 | 10/2023 | Ohchi | |
| 12,096,671 B2 | 9/2024 | Kato | |
| 2002/0072139 A1 | 6/2002 | Kashiwabara | |
| 2003/0122495 A1 | 7/2003 | Nakanishi | |
| 2005/0153058 A1 | 7/2005 | Tachikawa et al. | |
| 2005/0212841 A1 | 9/2005 | Okano | |
| 2009/0153042 A1 | 6/2009 | Izumi et al. | |
| 2010/0171138 A1 | 7/2010 | Yamazaki et al. | |
| 2011/0148290 A1 | 6/2011 | Oota | |
| 2012/0248467 A1 | 10/2012 | Yokoyama et al. | |
| 2012/0252149 A1 | 10/2012 | Hiroki et al. | |
| 2012/0252150 A1 | 10/2012 | Hiroki et al. | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0234126 A1 | 9/2013 | Nakatani | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2014/0197391 A1 | 7/2014 | Hatakeyama et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0006259 A1 | 1/2018 | Paek et al. | |
| 2018/0006267 A1 | 1/2018 | Sakamoto | |
| 2018/0190908 A1 | 7/2018 | Ke et al. | |
| 2019/0181368 A1 | 6/2019 | Kim et al. | |
| 2019/0288226 A1 | 9/2019 | Li et al. | |
| 2020/0057330 A1 | 2/2020 | Yamazaki et al. | |
| 2020/0135820 A1 | 4/2020 | Ohchi | |
| 2020/0176521 A1 | 6/2020 | Cho et al. | |
| 2020/0203662 A1 | 6/2020 | Mollard et al. | |
| 2023/0403881 A1 | 12/2023 | Yamazaki et al. | |
| 2024/0155871 A1* | 5/2024 | Yanagisawa | H05B 33/22 |
| 2024/0196712 A1* | 6/2024 | Yamazaki | H10K 59/124 |
| 2025/0008802 A1 | 1/2025 | Kato | |

FOREIGN PATENT DOCUMENTS

| | | |
|---|---|---|
| CN | 110832954 A | 2/2020 |
| JP | 2000-036385 A | 2/2000 |
| JP | 2002-324673 A | 11/2002 |
| JP | 2003-059663 A | 2/2003 |
| JP | 2003-241685 A | 8/2003 |
| JP | 2003-332051 A | 11/2003 |
| JP | 2005-270725 A | 10/2005 |
| JP | 2008-098106 | 4/2008 |
| JP | 2008-098106 A | 4/2008 |
| JP | 2008-147072 A | 6/2008 |
| JP | 2008-251270 A | 10/2008 |
| JP | 2010-033936 A | 2/2010 |
| JP | 2010-182668 A | 8/2010 |
| JP | 2011-014347 A | 1/2011 |
| JP | 2012-174356 A | 9/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2018-006115 A | 1/2018 |
| JP | 2019-179696 A | 10/2019 |
| JP | 2020-160305 A | 10/2020 |
| KR | 2003-0047848 A | 6/2003 |
| KR | 10-0931279 | 12/2009 |
| KR | 2010-0082311 A | 7/2010 |
| TW | 200301451 | 7/2003 |
| TW | 201031258 | 8/2010 |
| WO | WO-2003/096754 | 11/2003 |
| WO | WO-2018/087625 | 5/2018 |
| WO | WO-2019/012987 | 1/2019 |
| WO | WO-2020/004086 | 1/2020 |

OTHER PUBLICATIONS

Written Opinion (Application No. PCT/IB2022/052736) Dated Jun. 28, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of The Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of The 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International

(56) References Cited

OTHER PUBLICATIONS

Symposium Digest of Technical Papers, May 1, 2017, vol. 48, No. 1, pp. 623-626.

* cited by examiner

FIG. 1A
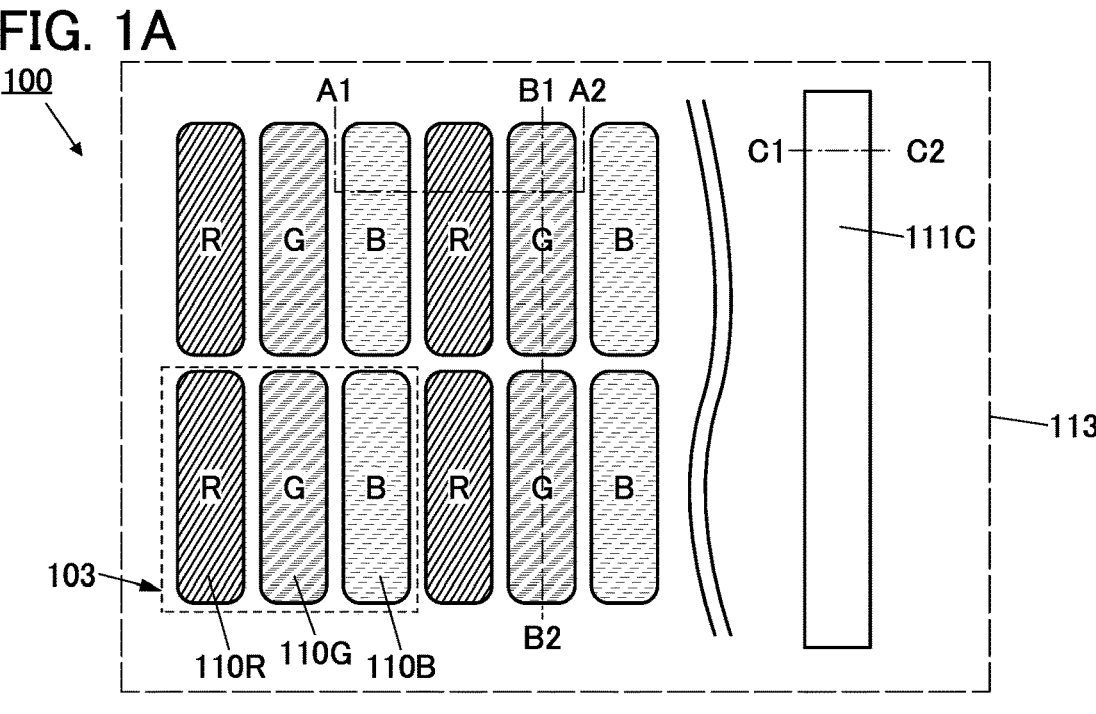
FIG. 1B
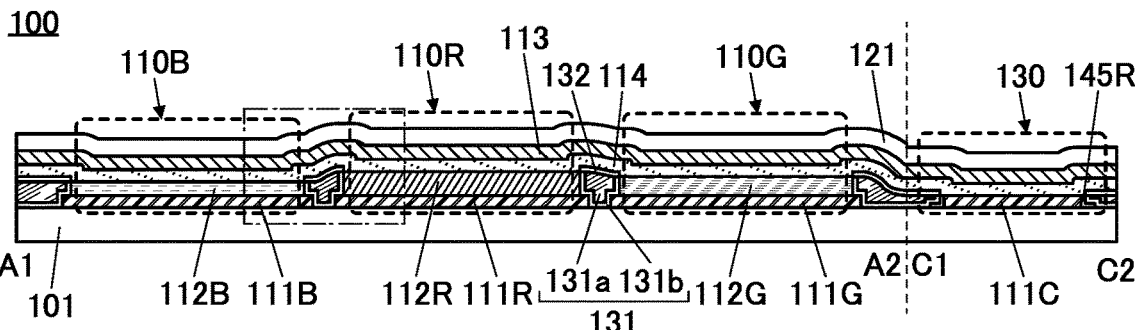
FIG. 1C
FIG. 1D
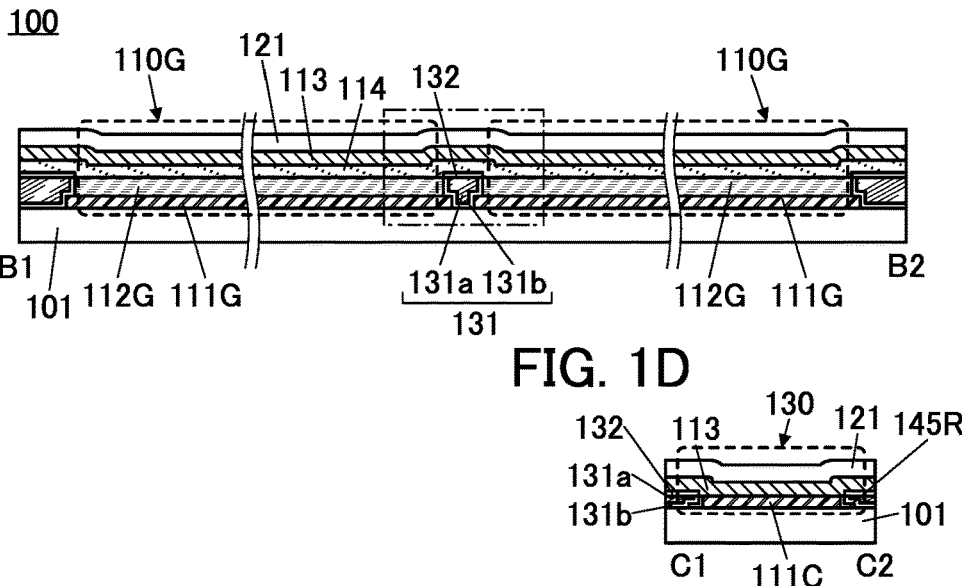

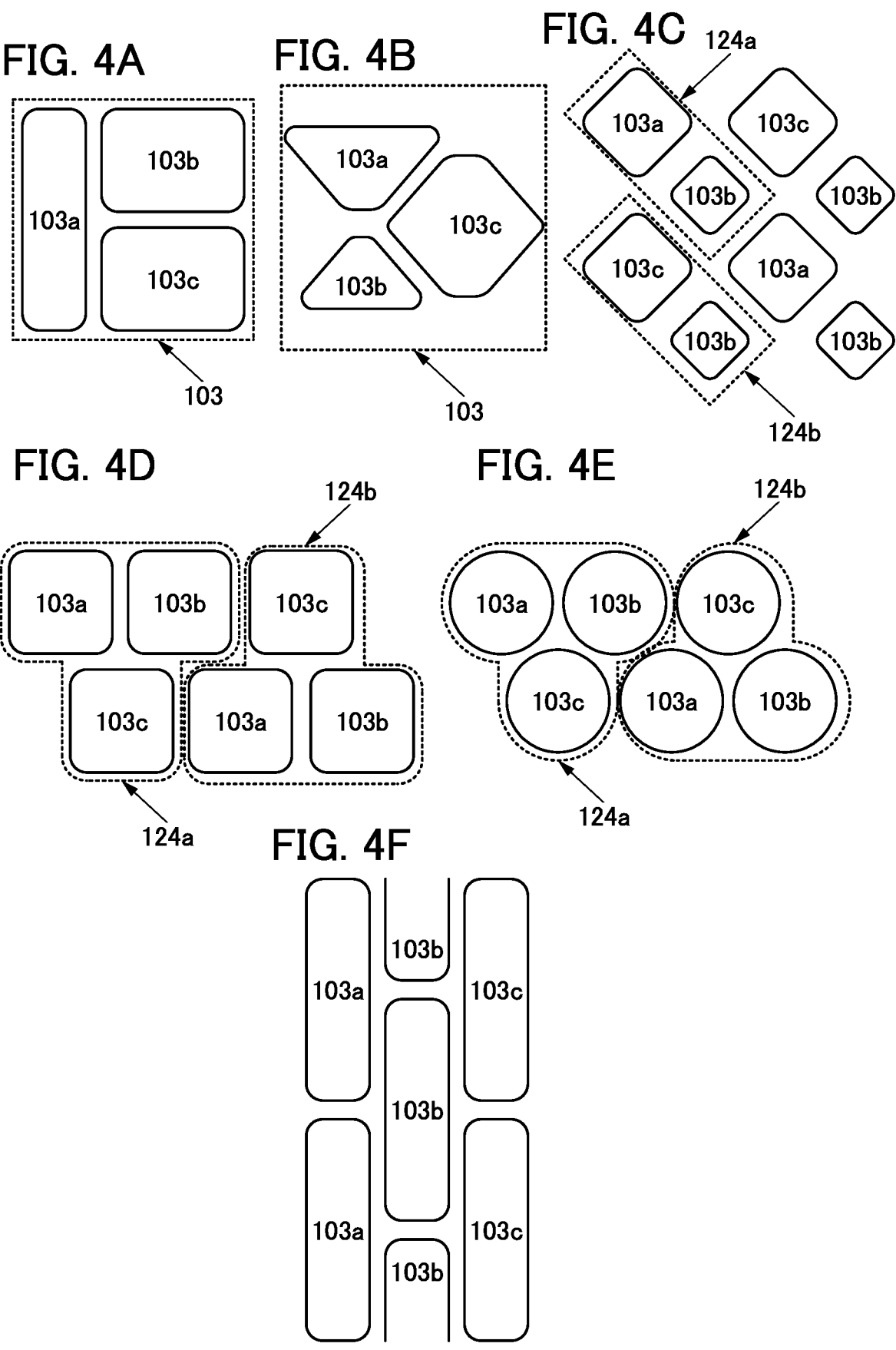

FIG. 5A
FIG. 5B
FIG. 5C
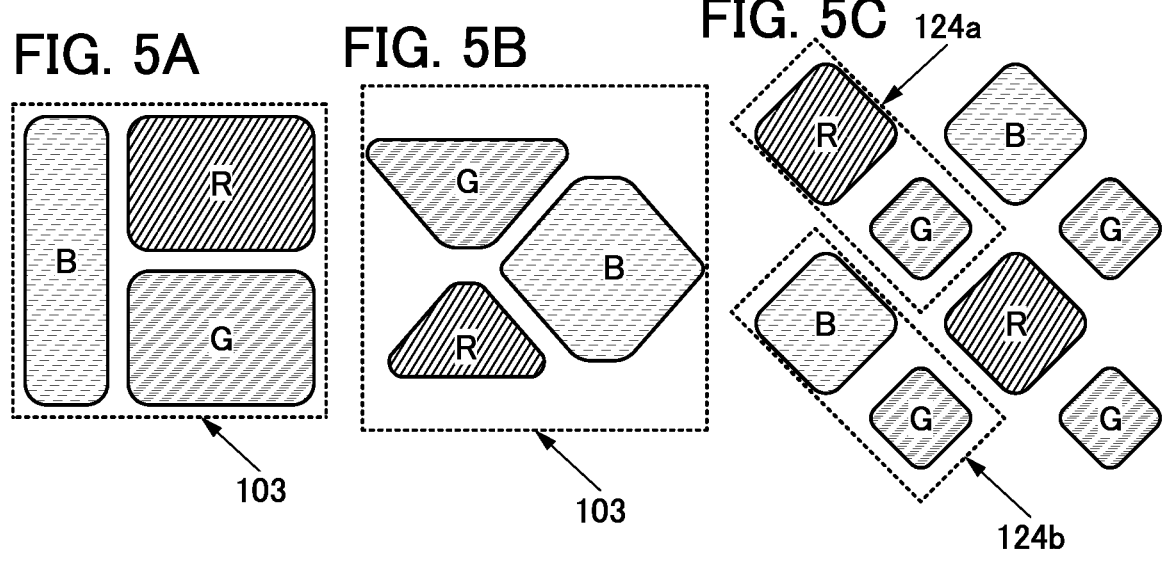
FIG. 5D
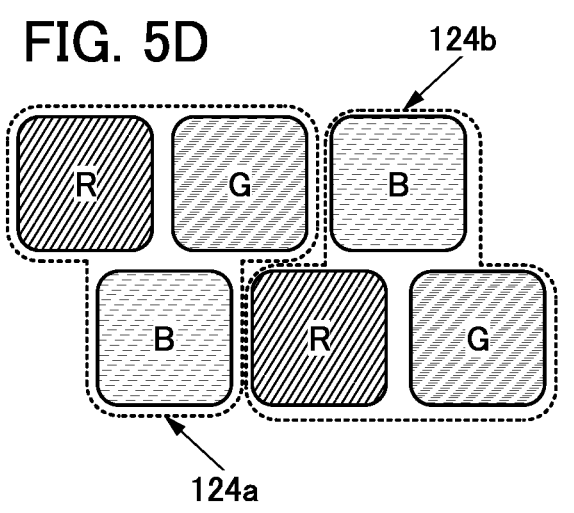
FIG. 5E
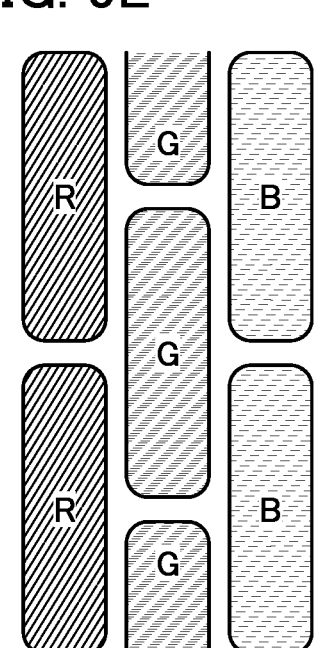

FIG. 22A
7100
7101
7000
7103
7111
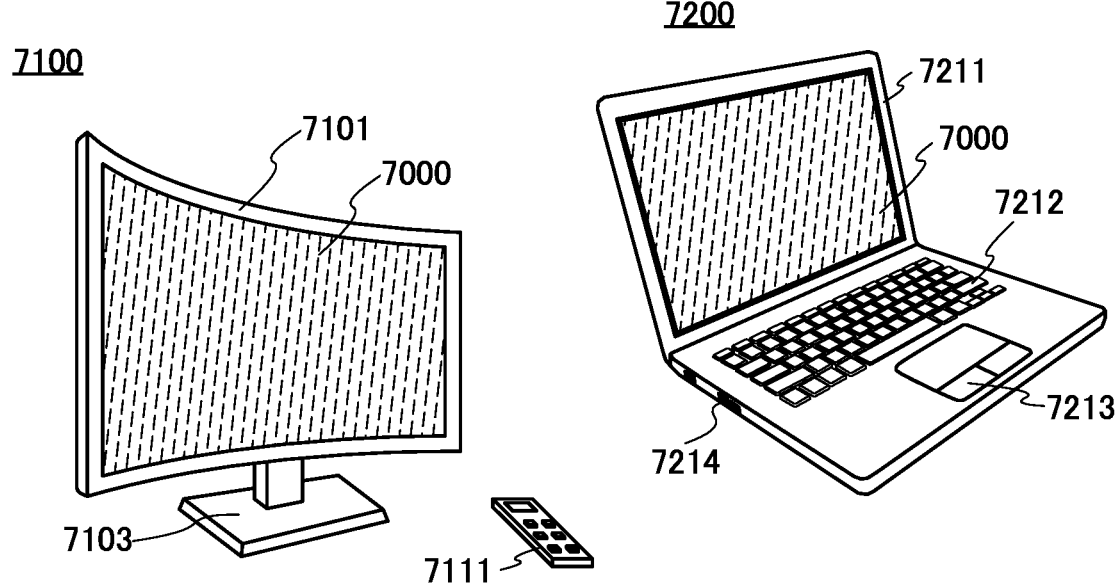
FIG. 22B
7200
7211
7000
7212
7213
7214
FIG. 22C
7300
7301
7303
7000
7311
FIG. 22D
7400
7401
7000
7411
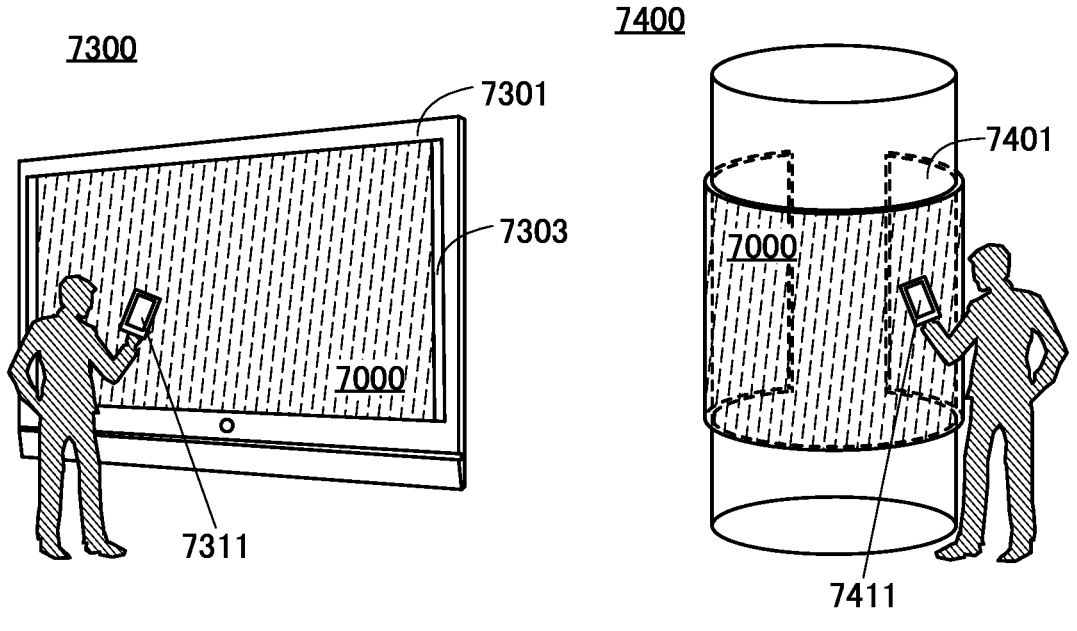

FIG. 23A
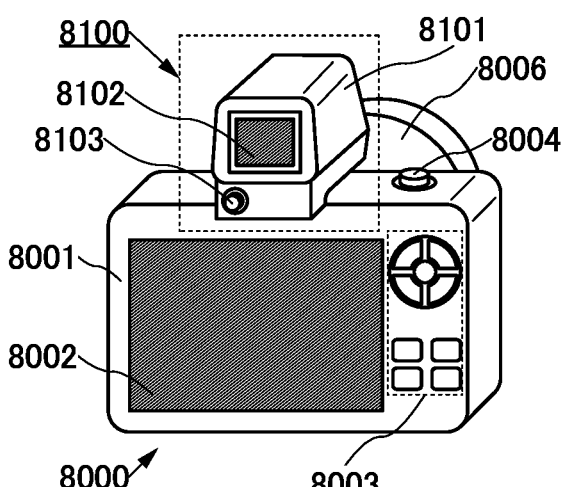
FIG. 23B
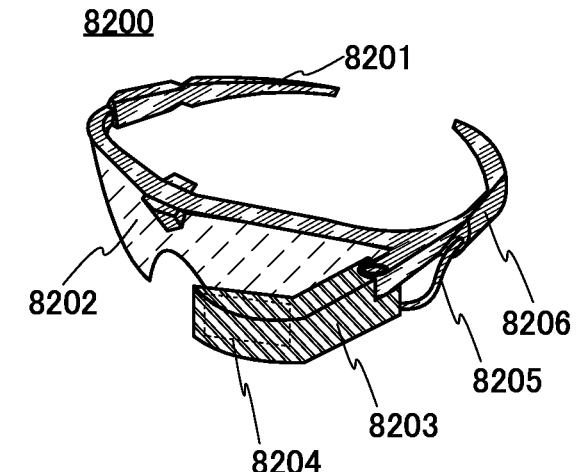
FIG. 23C
FIG. 23D
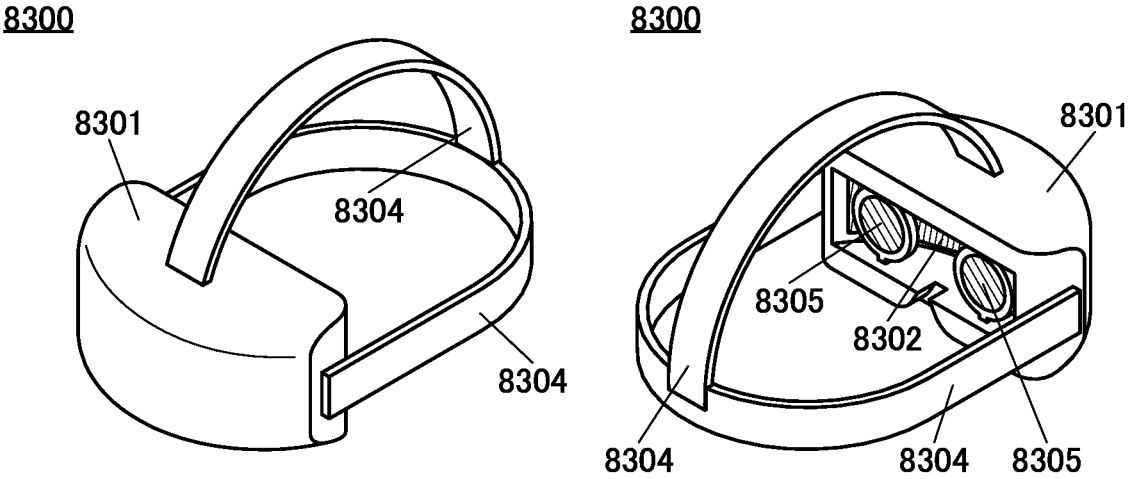
FIG. 23E
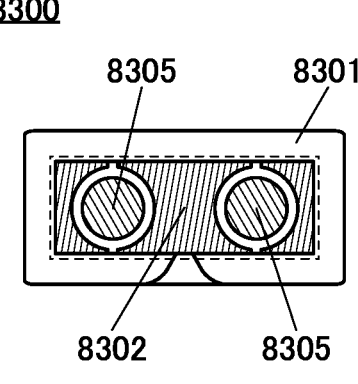
FIG. 23F
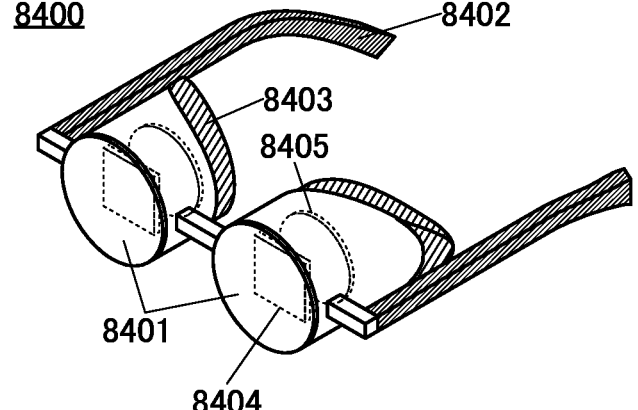

9101

9200

9102

9201

9201

9201

DISPLAY DEVICE

TECHNICAL FIELD

One embodiment of the present invention relates to a display device. One embodiment of the present invention relates to a method for manufacturing a display device.

Note that one embodiment of the present invention is not limited to the above technical field. Examples of a technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop computer. Furthermore, higher resolution has been required for a stationary display device such as a television device or a monitor device along with a higher definition. An example of a device required to have the highest resolution is a device for virtual reality (VR) or augmented reality (AR).

Examples of display devices that can be used for the display panels include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure where a layer containing a light-emitting organic compound is provided between a pair of electrodes. By voltage application to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

Patent Document 2 discloses a display device using an organic EL device for VR.

REFERENCES

Patent Documents

[Patent Document 1] Japanese Published Patent Application No. 2002-324673
[Patent Document 2] PCT International Publication No. 2018/087625

SUMMARY OF THE INVENTION

Problems to be Solved by the Invention

An object of one embodiment of the present invention is to provide a display device with high display quality. An object of one embodiment of the present invention is to provide a highly reliable display device. An object of one embodiment of the present invention is to provide a display device with low power consumption. An object of one embodiment of the present invention is to provide a display device that easily achieves a higher resolution. An object of one embodiment of the present invention is to provide a display device with both high display quality and a high resolution. An object of one embodiment of the present invention is to provide a display device with high contrast.

An object of one embodiment of the present invention is to provide a display device with a novel structure or a method for manufacturing a display device. An object of one embodiment of the present invention is to provide a method for manufacturing the above-described display device with high yield. An object of one embodiment of the present invention is to reduce at least one of problems of the conventional technique.

Note that the description of these objects does not preclude the existence of other objects. Note that one embodiment of the present invention does not have to achieve all these objects. Note that objects other than these can be derived from the description of the specification, the drawings, the claims, and the like.

Means for Solving the Problems

One embodiment of the present invention is a display device including a first pixel, a second pixel provided adjacent to the first pixel, a first insulating layer, a second insulating layer over the first insulating layer, and a third insulating layer over the second insulating layer. The first pixel includes a first pixel electrode, a first EL layer over the first pixel electrode, and a common electrode over the first EL layer; the second pixel includes a second pixel electrode, a second EL layer over the second pixel electrode, and the common electrode over the second EL layer; the first insulating layer and the third insulating layer each contain an inorganic material; the second insulating layer contains an organic material; the second insulating layer overlaps with a side surface of the first EL layer and a side surface of the second EL layer with the first insulating layer therebetween; the second insulating layer overlaps with the common electrode with the third insulating layer therebetween; and the third insulating layer is in contact with the first insulating layer in a region not overlapping with the second insulating layer.

In the above, the display device may have a structure in which the first insulating layer covers a side surface of the first pixel electrode, the side surface of the first EL layer, a side surface of the second pixel electrode, and the side surface of the second EL layer.

In the above, a bottom surface of the third insulating layer is preferably in contact with a top surface of the second insulating layer. In addition, in the above embodiment, the third insulating layer preferably contains silicon nitride.

In the above, preferably, the first insulating layer includes a fourth insulating layer and a fifth insulating layer over the fourth insulating layer; the fourth insulating layer contains aluminum oxide; and the fifth insulating layer contains silicon nitride.

In the above, the display device may have the following structure: a first region of the first insulating layer is positioned over the first EL layer and overlaps with a top surface of the first EL layer; a second region of the first insulating layer is positioned over the second EL layer and overlaps with a top surface of the second EL layer; a first layer containing an inorganic material is formed between the first region and the first EL layer; and a second layer containing an inorganic material is formed between the second region and the second EL layer.

In the above, the display device may have a structure in which the top surface of the first EL layer, the top surface of the second EL layer, and a top surface of the third insulating layer each include a region in contact with the common electrode.

In the above, the display device may have the following structure: the first pixel includes a common layer provided between the first EL layer and the common electrode; the second pixel includes the common layer provided between the second EL layer and the common electrode; and the top surface of the first EL layer, the top surface of the second EL layer, and the top surface of the third insulating layer each include a region in contact with the common layer.

In the above, in a cross-sectional view of the display device, the top surface of the second insulating layer preferably has a concave surface.

Effect of the Invention

According to one embodiment of the present invention, a display device with high display quality can be provided. A highly reliable display device can be provided. A display device with low power consumption can be provided. A display device that easily achieves a higher resolution can be provided. A display device with both high display quality and a high resolution can be provided. A display device with high contrast can be provided.

According to one embodiment of the present invention, a display device with a novel structure or a method for manufacturing a display device can be provided. A method for manufacturing the above-described display device with high yield can be provided. According to one embodiment of the present invention, at least one of problems of the conventional technique can be reduced.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 1A to FIG. 1D are diagrams illustrating a structure example of a display device.

FIG. 4A to FIG. 4F are top views each illustrating a structure example of a pixel.

FIG. 5A to FIG. 5E are top views each illustrating a structure example of a pixel.

FIG. 14A is a cross-sectional view illustrating an example of a display device. FIG. 14B to FIG. 14D are cross-sectional views each illustrating an example of a transistor.

FIG. 15A and FIG. 15B are perspective views illustrating an example of a display module.

FIG. 22A to FIG. 22D are diagrams illustrating examples of electronic devices.

FIG. 23A to FIG. 23F are diagrams illustrating examples of electronic devices.

MODE FOR CARRYING OUT THE INVENTION

Figure 2A:
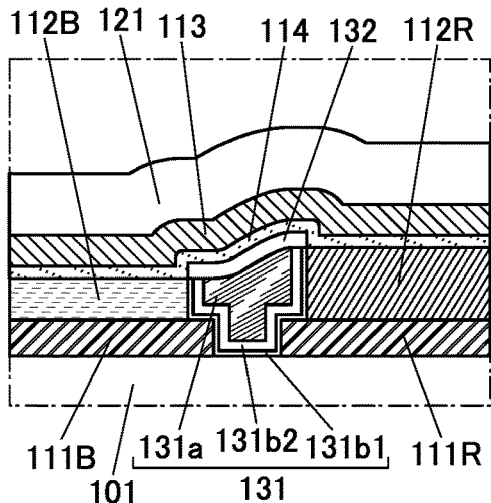
FIG. 2A to FIG. 2C are diagrams each illustrating a structure example of a display device.

Embodiments will be described below with reference to the drawings. Note that the embodiments can be implemented with many different modes, and it will be readily understood by those skilled in the art that modes and details thereof can be changed in various ways without departing from the spirit and scope thereof. Thus, the present invention should not be construed as being limited to the description of embodiments below.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Thus, they are not limited to the illustrated scale.

Note that in this specification and the like, ordinal numbers such as "first" and "second" are used in order to avoid confusion among components and do not limit the number.

In addition, in this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stack including the light-emitting layer provided between a pair of electrodes of a light-emitting element.

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

A light-emitting element of one embodiment of the present invention may include layers containing a substance with a high hole-injection property, a substance with a high hole-transport property, a substance with a high electron-transport property, a substance with a high electron-injection property, a substance with a bipolar property, and the like.

Note that the light-emitting layer and the layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dots can function as a light-emitting material.

Note that as the quantum dot material, a colloidal quantum dot material, an alloyed quantum dot material, a core-shell quantum dot material, a core quantum dot material, or the like can be used. The material containing elements belonging to Group 12 and Group 16, elements belonging to Group 13 and Group 15, or elements belonging to Group 14 and Group 16, may be used. Alternatively, a quantum dot material containing an element such as cadmium, selenium, zinc, sulfur, phosphorus, indium, tellurium, lead, gallium, arsenic, or aluminum may be used.

Embodiment 1

In this embodiment, a structure example of a display device of one embodiment of the present invention and an example of a method for manufacturing the display device will be described.

One embodiment of the present invention is a display device including a light-emitting element (also referred to as a light-emitting device). The display device includes at least two light-emitting elements that emit light of different colors. The light-emitting elements each include a pair of electrodes and an EL layer therebetween. As the light-emitting element, an electroluminescent element such as an organic EL element or an inorganic EL element can be used. Besides, a light-emitting diode (LED) can be used. The light-emitting element of one embodiment of the present invention is preferably an organic EL element (organic electroluminescent element). The two or more light-emitting elements that exhibit different colors include EL layers containing different materials. For example, three kinds of light-emitting elements emitting light of red (R), green (G), and blue (B) are included, whereby a full-color display device can be achieved.

Here, in the case where the EL layers are separately formed for light-emitting elements of different colors, an evaporation method using a shadow mask such as a metal mask is known. However, this method causes a deviation from the designed shape and position of an island-shaped organic film due to various influences such as the low accuracy of the metal mask, the positional deviation between the metal mask and a substrate, a warp of the metal mask, and the expansion of outline of the deposited film due to vapor scattering or the like; accordingly, it is difficult to achieve a high resolution and a high aperture ratio of the display device. In addition, dust derived from a material attached to the metal mask in evaporation is generated in some cases. Such dust might cause defective patterning of the light-emitting elements. In addition, a short circuit derived from the dust may occur. Moreover, a step of cleaning the material attached to the metal mask is necessary. Thus, a measure has been taken for pseudo improvement in resolution (also referred to as a pixel density) by employing a unique pixel arrangement method such as PenTile arrangement, for example.

In one embodiment of the present invention, fine patterning of an EL layer is performed without a shadow mask such as a metal mask. With this, a display device with high resolution and a high aperture ratio, which has been difficult to achieve, can be manufactured. Moreover, EL layers can be formed separately, enabling the display device to perform extremely clear display with high contrast and high display quality.

Here, description is made on the case where EL layers in light-emitting elements of two colors are separately formed, for simplicity. First, a stack of a first EL film and a first sacrificial film is formed to cover pixel electrodes. Next, a resist mask is formed over the first sacrificial film. Then, part of the first sacrificial film and part of the first EL film are etched using the resist mask, so that a first EL layer and a first sacrificial layer over the first EL layer are formed. Note that in this specification and the like, a sacrificial layer may be referred to as a mask layer. Note that in this specification and the like, a sacrificial film may be referred to as a mask film.

Next, a stack of a second EL film and a second sacrificial film is formed. Then, part of the second sacrificial film and part of the second EL film are etched using the resist mask, so that a second EL layer and a second sacrificial layer over the second EL layer are formed. In this manner, the first EL layer and the second EL layer can be formed separately. Finally, the first sacrificial layer and the second sacrificial layer are removed, and a common electrode is formed, whereby light-emitting elements of two colors can be formed separately.

Furthermore, by repeating the above-described steps, EL layers in light-emitting elements of three or more colors can be separately formed; thus, a display device including light-emitting elements of three colors or four or more colors can be achieved.

At an end portion of the EL layer, a step is generated owing to a region where the pixel electrode and the EL layer are provided and a region where the pixel electrode and the EL layer are not provided. At the time of forming the common electrode over the EL layer, coverage with the common electrode is degraded owing to the step at the end portion of the EL layer, which might cause disconnection of the common electrode. Furthermore, the common electrode becomes thinner, whereby electric resistance might be increased.

In the case where an end portion of the pixel electrode is substantially aligned with the end portion of the EL layer and the case where the end portion of the pixel electrode is positioned outside the end portion of the EL layer, the common electrode and the pixel electrode are sometimes short-circuited when the common electrode is formed over the EL layer.

In one embodiment of the present invention, a first insulating layer containing an organic material is provided between the first EL layer and the second EL layer, whereby unevenness on the surface where the common electrode is provided can be reduced. Thus, the coverage with the common electrode can be increased at the end portion of the first EL layer and the end portion of the second EL layer, which allows favorable conductivity of the common electrode. In addition, a short circuit between the common electrode and the pixel electrode can be inhibited.

In addition, in one embodiment of the present invention, a second insulating layer containing an inorganic material is provided between the first insulating layer containing an organic material, and the first EL layer and the second EL layer. Here, the second insulating layer has a barrier property against at least one of oxygen and moisture. Such second insulating layer separates the first insulating layer from the first EL layer and the second EL layer, so that oxygen, moisture, or constituent elements thereof can be inhibited from entering the inside of the first EL layer and the second EL layer through the side surfaces thereof, achieving a highly reliable display device.

In addition, in one embodiment of the present invention, a third insulating layer containing an inorganic material is provided between the first insulating layer containing an organic material and the common electrode. Here, the third insulating layer has a barrier property against at least one of oxygen and moisture. Such third insulating layer separate the first insulating layer and the common electrode, so that oxygen, moisture, or constituent elements thereof can be inhibited from entering the inside of the common electrode through the bottom surface thereof, achieving a highly reliable display device.

In addition, the third insulating layer is in contact with the second insulating layer in a region not overlapping with the first insulating layer. The top surface, side surface, and bottom surface of the first insulating layer are preferably surrounded by the second insulating layer and the third insulating layer. With this structure, the first insulating layer containing an organic material is sealed with the second insulating layer and the third insulating layer which have a barrier property against at least one of oxygen and moisture. Accordingly, oxygen, moisture, or constituent elements thereof contained in the first insulating layer can be inhibited from diffusing directly or indirectly into the EL layer, the common electrode, or the like.

In the case where EL layers for different colors are adjacent to each other, it is difficult to set the distance between the EL layers adjacent to each other to less than 10 μm with a formation method using a metal mask, for example; however, with the use of the above method, the distance can be decreased to less than or equal to 3 μm, less than or equal to 2 μm, or less than or equal to 1 μm. For example, with the use of a light exposure apparatus for LSI, the distance can be decreased to less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the EL layer itself (also referred to as processing size) can be made much smaller than that in the case of using a metal mask. For example, in the case of using a metal mask for forming EL layers separately, a variation in the thickness occurs between the center and the edge of the EL layer. This causes a reduction in an effective area that can be used as a light-emitting region with respect to the area of the EL layer. In contrast, in the above manufacturing method, an EL layer is formed by processing a film deposited to have a uniform thickness, which enables a uniform thickness in the EL layer. Thus, even in a fine pattern, almost the entire area can be used as a light-emitting region. Therefore, the above manufacturing method makes it possible to achieve both a high resolution and a high aperture ratio.

As described above, with the above manufacturing method, a display device in which minute light-emitting elements are integrated can be obtained, and it is not necessary to conduct a pseudo improvement in resolution by employing a unique pixel arrangement such as a PenTile arrangement; thus, the display device can achieve a resolution higher than or equal to 500 ppi, higher than or equal to 1000 ppi, higher than or equal to 2000 ppi, higher than or equal to 3000 ppi, or higher than or equal to 5000 ppi while having what is called a stripe arrangement where R, G, and B are arranged in one direction.

More specific structure examples and manufacturing method examples of a display device of one embodiment of the present invention will be described below with reference to drawings.

Structure Example

FIG. 1A is a schematic top view of a display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements. Hereinafter, the light-emitting element 110R, the light-emitting element 110G, and the light-emitting element 110B are collectively referred to as a light-emitting element 110 in some cases.

The light-emitting elements 110R, the light-emitting elements 110G, and the light-emitting elements 110B are arranged in a matrix. FIG. 1A illustrates a pixel 103 employing what is called stripe arrangement, in which the light-emitting elements of the same color are arranged in one direction. Note that the arrangement method of the light-emitting elements is not limited thereto; another arrangement method such as delta arrangement or zigzag arrangement may be used, or PenTile arrangement can be used.

As the light-emitting elements 110R, the light-emitting elements 110G, and the light-emitting elements 110B, light-emitting elements such as OLEDs (Organic Light Emitting Diodes) or QLEDs (Quantum-dot Light Emitting Diodes) are preferably used, for example. As a light-emitting substance contained in the light-emitting element, a substance that emits fluorescent light (a fluorescent material), a substance that emits phosphorescent light (a phosphorescent material), an inorganic compound (e.g., a quantum dot material), a substance that exhibits thermally activated delayed fluorescence (a thermally activated delayed fluorescent (TADF) material), and the like can be given.

FIG. 1B is a schematic cross-sectional view taken along dashed-dotted line A1-A2 and dashed-dotted line C1-C2 in FIG. 1A, and FIG. 1C is a schematic cross-sectional view taken along dashed-dotted line B1-B2.

FIG. 1B illustrates cross sections of the light-emitting element 110R, the light-emitting element 110G, and the light-emitting element 110B. In FIG. 1B, the light-emitting element 110R, the light-emitting element 110G, and the light-emitting element 110B are provided over the substrate 101. The light-emitting element 110R includes a pixel electrode 111R, an EL layer 112R, a common layer 114, and a common electrode 113. The light-emitting element 110G includes a pixel electrode 111G, an EL layer 112G, the common layer 114, and the common electrode 113. The light-emitting element 110B includes a pixel electrode 111B, an EL layer 112B, the common layer 114, and the common electrode 113. An insulating layer 131 (an insulating layer 131a and an insulating layer 131b) and an insulating layer 132 over the insulating layer 131 are provided to be embedded between the light-emitting elements. In addition, a protective layer 121 is provided over the common electrode 113. Note that the pixel electrode 111R, the pixel electrode 111G, and the pixel electrode 111B are collectively referred to as a pixel electrode 111 below in some cases. Furthermore, the EL layer 112R, the EL layer 112G, and the EL layer 112B are collectively referred to as an EL layer 112 in some cases.

FIG. 2A illustrates an enlarged view of a region surrounded by a dashed-dotted square in FIG. 1B. FIG. 2B to FIG. 3C illustrate modification examples of the vicinity of the insulating layer 131 illustrated in FIG. 2A. Note that in this specification and the like, the thicknesses of a layer and a film are sometimes drawn to be larger for easy viewing in a drawing that is not enlarged. In an enlarged drawing, the distance between components included in a display device or the like may be different from the actual distance or the like.

The light-emitting element 110R includes the EL layer 112R between the pixel electrode 111R and the common electrode 113. The EL layer 112R contains at least a light-emitting organic compound that emits light with intensity in a red wavelength range. The light-emitting element 110G includes the EL layer 112G between the pixel electrode 111G and the common electrode 113. The EL layer 112G contains at least a light-emitting organic compound that emits light with intensity in the green wavelength range. The light-emitting element 110B includes the EL layer 112B between the pixel electrode 111B and the common electrode 113. The EL layer 112B contains at least a light-emitting organic compound that emits light with intensity in the blue wavelength range.

In FIG. 1B and FIG. 1C, the common layer 114 is provided between the pixel electrode 111 and the common electrode 113 of the light-emitting element 110. The common layer 114 is provided as a continuous layer shared by the light-emitting elements. In this case, the common layer 114 is preferably provided in contact with the top surface of the EL layer 112. Furthermore, it is preferable that the common electrode 113 be provided in contact with the top surface of the common layer 114. Note that the light-emitting element 110 does not necessarily include the common layer 114. In this case, it is preferable that the common electrode 113 be provided in contact with the top surface of the EL layer 112.

FIG. 1A also illustrates a connection electrode 111C that is electrically connected to the common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged. In FIG. 1A, the common electrode 113 is denoted by a dashed line.

The connection electrode 111C can be provided along the outer periphery of the display region. For example, the connection electrode 111C may be provided along one side of the outer periphery of the display region or may be provided along two or more sides of the outer periphery of the display region. That is, in the case where the display region has a rectangular top surface, the top surface of the connection electrode 111C can have a belt-like shape, an L-like shape, a U-like shape (a square bracket shape), a quadrangular shape, or the like.

In a cross section of C1-C2 in FIG. 1B, a region 130 is also illustrated where a connection electrode 111C is electrically connected to the common electrode 113. Note that although FIG. 1B illustrates an example where the common layer 114 is provided between the connection electrode 111C and the common electrode 113, the common layer 114 is not necessarily provided in the region 130 as illustrated in FIG. 1D. In the structure illustrated in FIG. 1D, the connection electrode 111C is in contact with the common electrode 113, which can further reduce the contact resistance.

Also in the region 130, the protective layer 121 is provided to cover the common electrode 113.

The EL layer 112R, the EL layer 112G, and the EL layer 112B each include a layer containing a light-emitting organic compound (a light-emitting layer). The light-emitting layer may contain one or more kinds of compounds (e.g., a host material and an assist material) in addition to the light-emitting substance (a guest material). As the host material and the assist material, one or more kinds of substances whose energy gap is larger than the energy gap of the light-emitting substance (the guest material) can be selected and used. As the host material and the assist material, compounds that form an exciplex are preferably used in combination. In order to form an exciplex efficiently, it is particularly preferable to combine a compound that easily accepts holes (a hole-transport material) and a compound that easily accepts electrons (an electron-transport material).

Either a low molecular compound or a high molecular compound can be used for the light-emitting element, and an inorganic compound (e.g., a quantum dot material) may also be contained.

The EL layer 112R, the EL layer 112G, and the EL layer 112B may each include one or more of an electron-injection layer, an electron-transport layer, a hole-injection layer, and a hole-transport layer in addition to the light-emitting layer.

The pixel electrode 111R, the pixel electrode 111G, and the pixel electrode 111B are provided for the respective light-emitting elements. The common electrode 113 is provided as a continuous layer shared by the light-emitting elements. A conductive film having a transmitting property with respect to visible light is used for either the respective pixel electrodes or the common electrode 113, and a reflective conductive film is used for the other. When the pixel electrodes have light-transmitting properties and the common electrode 113 has a reflective property, a bottom-emission display device can be obtained. By contrast, when the pixel electrodes have reflective properties and the common electrode 113 has a light-transmitting property, a top-emission display device can be obtained. Note that when both the pixel electrodes and the common electrode 113 have light-transmitting properties, a dual-emission display device can be obtained.

In the case where a conductive film having a reflective property with respect to visible light is used as the pixel electrode 111, silver, aluminum, titanium, tantalum, molybdenum, platinum, gold, titanium nitride, tantalum nitride, or the like can be used, for example. Alternatively, an alloy can be used for the pixel electrode 111. For example, an alloy containing silver can be used. As the alloy containing silver, an alloy containing silver, palladium, and copper can be used, for example. Alternatively, an alloy containing aluminum can be used, for example. Alternatively, a stack including two or more of these materials may be used.

As the pixel electrode 111, a stack of a conductive film having a reflective property with respect to visible light and a conductive film thereover having a transmitting property with respect to visible light can be used. As a conductive material having a transmitting property with respect to visible light, a conductive oxide such as indium oxide, indium tin oxide, indium zinc oxide, zinc oxide, zinc oxide containing gallium, indium-tin oxide containing silicon, or an indium-zinc oxide containing silicon can be used. Some oxides obtained by oxidation of a conductive material having a reflective property with respect to visible light have a light-transmitting property. Accordingly, the oxide may be used as a conductive material having a transmitting property with respect to visible light. The oxide may be formed by oxidation of the surface of the conductive material having a reflective property with respect to visible light. Specifically, titanium oxide may be used, for example. Titanium oxide may be formed by oxidation of the surface of titanium, for example.

Providing an oxide over the surface of the pixel electrode 111 can inhibit, for example, an oxidation reaction with the pixel electrode 111 in formation of the EL layer 112.

When a stack of a conductive film having a reflective property with respect to visible light and a conductive film thereover having a transmitting property with respect to visible light is provided as the pixel electrode 111, the conductive film having a transmitting property with respect to visible light can function as an optical adjustment layer.

When the pixel electrode 111 includes an optical adjustment layer, an optical path length can be adjusted. The optical path length of the light-emitting element corresponds to, for example, the sum of the thickness of the optical adjustment layer and the thicknesses of the layers provided below the film including a light-emitting compound in the EL layer 112.

The optical path length is set different among the light-emitting elements using a microcavity structure, whereby light of a specific wavelength can be intensified. This can achieve a display device having a high color purity.

For example, the thickness of the EL layer 112 is set different among the light-emitting elements, whereby a microcavity structure can be achieved. For example, the EL layer 112R of the light-emitting element 110R emitting light whose wavelength is the longest can be made to have the largest thickness, and the EL layer 112B of the light-emitting element 110B emitting light whose wavelength is the shortest can be made to have the smallest thickness. Without limitation to this, the thickness of the EL layer can be adjusted in consideration of the wavelength of light emitted by the light-emitting element, the optical characteristics of the layer included in the light-emitting element, the electrical characteristics of the light-emitting element, and the like.

As illustrated in FIG. 1B, FIG. 1C, and the like, preferably, the EL layer 112 is formed only over a flat portion of the pixel electrode 111 and is not formed to extend beyond an end portion of the pixel electrode 111. In other words, an end portion of the EL layer 112 is preferably positioned inside the end portion of the pixel electrode 111. Such a structure can inhibit generation of disconnection of the EL layer 112 due to a step of the pixel electrode 111. Furthermore, the disconnection can be prevented from generating additional disconnection of the common layer 114 and the common electrode 113.

Figure 6A:
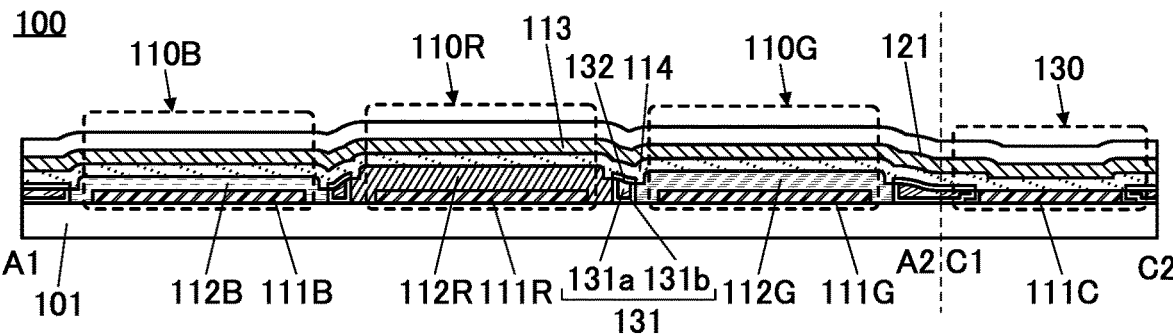
FIG. 6A to FIG. 6D are diagrams illustrating structure examples of a display device.
Figure 6B:
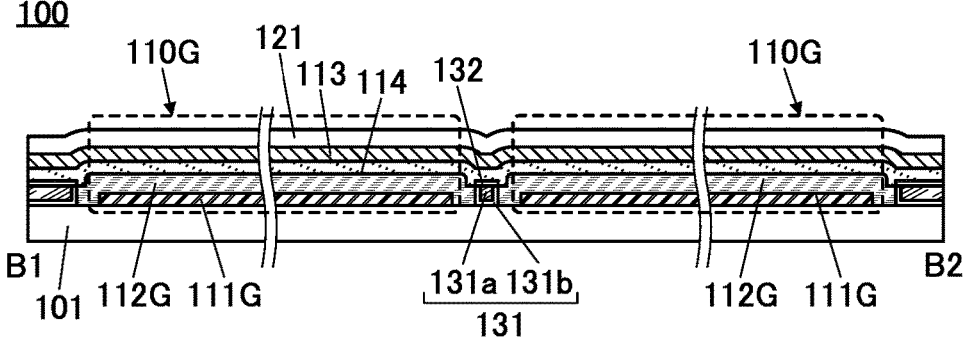

Note that the present invention is not limited to the above. As illustrated in FIG. 6A and FIG. 6B, the top surface and end portion of the pixel electrode 111 may be covered with the EL layer 112. In this case, the end portion of the EL layer 112 is positioned outside the end portion of the pixel electrode 111. Here, FIG. 6A is a schematic cross-sectional view taken along dashed-dotted line A1-A2 and dashed-dotted line C1-C2 in FIG. 1A, and FIG. 6B is a schematic cross-sectional view taken along dashed-dotted line B1-B2.

The EL layer 112 covering the top and end portion of the pixel electrode 111 makes it possible to perform a step for forming the EL layer 112, a step for forming the insulating layer 131, and the like without the pixel electrode 111 being exposed. Thus, damage to the pixel electrode 111 in the step for forming the EL layer 112, the step for forming the insulating layer 131, and the like can be reduced, leading to improvement in the yield of the light-emitting element 110 and improvement in the display quality of the light-emitting element 110.

Figure 6C:
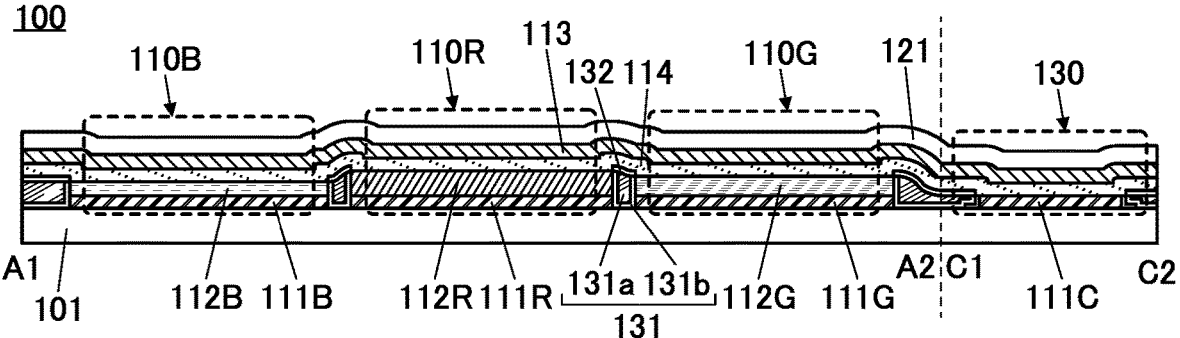
Figure 6D:
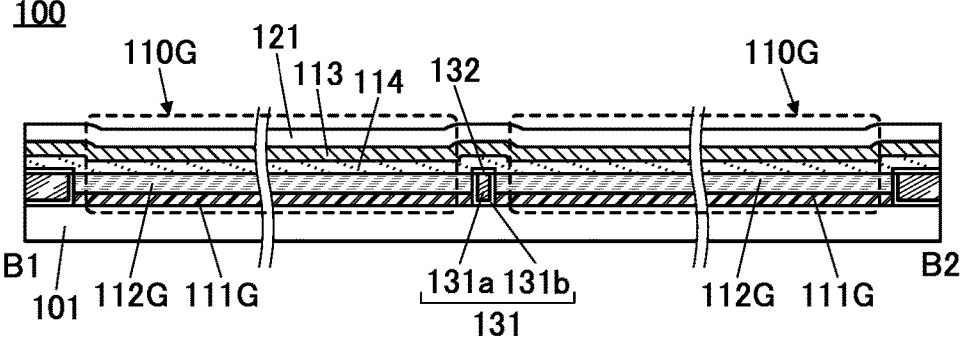

As illustrated in FIG. 6C and FIG. 6D, the end portion of the EL layer 112 and the end portion of the pixel electrode 111 may be substantially aligned with each other. Here, FIG. 6C is a schematic cross-sectional view taken along dashed-dotted line A1-A2 and dashed-dotted line C1-C2 in FIG. 1A, and FIG. 6D is a schematic cross-sectional view taken along dashed-dotted line B1-B2.

An insulating layer 131 is provided between adjacent light-emitting elements 110. The insulating layer 131 is positioned between the EL layers 112 included in the light-emitting elements 110. The insulating layer 132 is provided over the insulating layer 131. The common electrode 113 is provided over the insulating layer 132. That is, the insulating layer 131 overlaps with the common electrode 113 with the insulating layer 132 therebetween.

The insulating layer 131 and the insulating layer 132 are provided, for example, between two EL layers 112 exhibiting different colors. Alternatively, the insulating layer 131 and the insulating layer 132 are provided, for example, between two EL layers 112 exhibiting the same color. Alternatively, the following structure may be employed: the insulating layer 131 and the insulating layer 132 are provided between two EL layers 112 exhibiting different colors and is not provided between two EL layers 112 exhibiting the same color.

For example, as illustrated in FIG. 1A to FIG. 1C, the insulating layer 131 and the insulating layer 132 are positioned between the EL layers 112 of adjacent pixels so as to have a mesh (also referred to as grid or matrix) shape in a top view.

It is preferable that the EL layer 112R, the EL layer 112G, and the EL layer 112B each include a region in contact with the top surface of the pixel electrode and a region in contact with the side surface of the insulating layer 131. The end portions of the EL layer 112R, the EL layer 112G, and the EL layer 112B are preferably in contact with the side surface of the insulating layer 131. Furthermore, as illustrated in FIG. 1B, FIG. 1C, and the like, the end portions of the pixel electrode 111R, the pixel electrode 111G, and the pixel electrode 111B are also preferably in contact with the side surface of the insulating layer 131.

When the insulating layer 131 is provided between the light-emitting elements of different colors, the EL layer 112R, the EL layer 112G, and the EL layer 112G can be inhibited from being in contact with each other. This can suitably prevent unintentional light emission due to a current flowing through the two adjacent EL layers. As a result, the contrast can be increased to achieve a display device with high display quality.

The insulating layer 131 may be provided not between adjacent pixels exhibiting the same color but only between pixels exhibiting different colors. In this case, the insulating layer 131 can have a stripe shape in a top view. When the insulating layer 131 has a stripe shape, the space necessary to form the insulating layer 131 becomes unnecessary and a high aperture ratio can be achieved compared with the case where the insulating layer 131 has a grid shape. In the case where the insulating layer 131 has a stripe shape, the adjacent EL layers of the same color may be processed in a band shape so as to be continuous in a column direction.

Between the adjacent light-emitting elements, a step is generated at the vicinity of the end portion of the EL layer 112 due to a region where the EL layer 112 is provided, a region where the pixel electrode 111 is provided, and a region where the EL layer 112 and the pixel electrode 111 are not provided. In the display device of one embodiment of the present invention including the insulating layer 131, the step can be planarized and coverage with the common electrode 113 can be improved as compared with the case where the common electrode 113 is provided in contact with the substrate 101 between the adjacent light-emitting elements; accordingly, connection defects due to disconnection can be inhibited. Alternatively, it is possible to inhibit an increase in electric resistance caused by local thinning of the common electrode 113 due to the step.

In one embodiment of the present invention, providing the insulating layer 131 between the adjacently positioned EL layers 112 can make the unevenness on the formation surface of the common electrode 113 smaller, whereby coverage with the common electrode 113 at the vicinity of the end portion of the EL layer 112 can be increased and favorable conductivity of the common electrode 113 can be achieved.

The insulating layer 131 includes the insulating layer 131a and the insulating layer 131b provided under the insulating layer 131a. The insulating layer 131b is provided so as to be in contact with the side surfaces of the EL layers 112 included in the light-emitting elements 110. In addition, the insulating layer 131b is preferably provided so as to be in contact with the side surfaces of the pixel electrodes 111 included in the light-emitting elements 110. For example, as illustrated in FIG. 1B and FIG. 1C, the insulating layer 131b is preferably provided to cover the side surfaces of the EL layers 112 and the side surfaces of the pixel electrodes 111 included in the light-emitting elements 110.

The insulating layer 131b is provided in contact with the side surface and bottom surface of the insulating layer 131a. In other words, in a cross-sectional view, the insulating layer 131a is provided over and in contact with the insulating layer 131b so as to fill a depressed portion of the insulating layer 131b.

With the structure described above, as illustrated in FIG. 1B and FIG. 1C, the insulating layer 131a is provided so as to overlap with (i.e., face) the side surface of the EL layer 112 with the insulating layer 131b therebetween. That is, the insulating layer 131a is isolated from the EL layer 112 by the insulating layer 131b.

The insulating layer 131b includes a region in contact with the side surface of the EL layer 112 and functions as a protective insulating layer of the EL layer 112. The insulating layer 131b preferably has a barrier property against at least one of oxygen and moisture. With the insulating layer 131b isolating the insulating layer 131a and the EL layer 112 each other, oxygen, moisture, or constituent elements thereof is inhibited from entering the inside of the EL layer 112 through the side surface thereof, whereby a highly reliable display device can be provided.

If the width of the insulating layer 131b in the region in contact with the side surface of the EL layer 112 is large in a cross-sectional view, the distance between the EL layers 112 is increased and the aperture ratio is lowered in some cases. If the width of the insulating layer 131b is small, the effect of inhibiting the entry of oxygen, moisture, or constituent elements thereof into the inside of the EL layer 112 through the side surface thereof becomes small in some cases. The width of the insulating layer 131b in the region in contact with the side surface of the EL layer 112 is preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the width of the insulating layer 131b is within the above-described range, a highly reliable display device with a high aperture ratio can be obtained.

The insulating layer 131b can be an insulating layer containing an inorganic material. As the insulating layer 131b, a single layer or stacked layers of aluminum oxide, magnesium oxide, hafnium oxide, gallium oxide, indium gallium zinc oxide, silicon oxide, silicon oxynitride, silicon nitride, silicon nitride oxide, or the like can be used, for example. In particular, aluminum oxide is preferable because it has high selectivity with respect to the EL layer 112 in etching and has a function of protecting the EL layer 112 in forming the insulating layer 131b which is to be described later. In particular, with the use of an inorganic insulating material such as aluminum oxide, hafnium oxide, or silicon oxide formed by an atomic layer deposition (ALD) method for the insulating layer 131b, the insulating layer 131b can be a film with few pinholes and can have an excellent function of protecting the EL layer 112.

Note that in this specification, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The insulating layer 131b can be formed by a sputtering method, a chemical vapor deposition (CVD) method, a molecular beam epitaxy (MBE) method, a pulsed laser deposition (PLD) method, an ALD method, or the like. An ALD method achieving favorable coverage can be suitably used for forming the insulating layer 131b.

The insulating layer 131b is preferably a stacked film of an insulating layer 131b1 and an insulating layer 131b2 over the insulating layer 131b1 as illustrated in FIG. 2A. For the insulating layer 131b1 and the insulating layer 131b2, the above-described inorganic material that can be used for the insulating layer 131b may be used as appropriate. For example, aluminum oxide deposited by an ALD method may be used as the insulating layer 131b1, and silicon nitride deposited by a sputtering method is used as the insulating layer 131b2. In the above structure, the insulating layer 131b1 is formed as a film with excellent coverage and few pinholes and silicon nitride is provided for the insulating layer 131b2, leading to an improvement in the barrier property against oxygen and moisture.

Figure 2B:
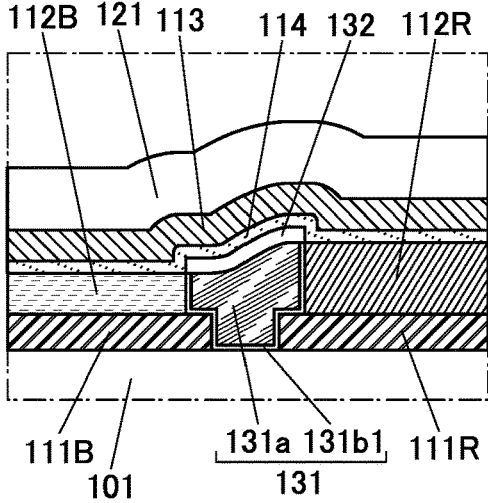

Note that the present invention is not limited to the structure illustrated in FIG. 2A. For example, as illustrated in FIG. 2B, the insulating layer 131b1 may be a single layer of an aluminum oxide deposited by an ALD method.

The insulating layer 131a provided over the insulating layer 131b has a planarization function for the depressed portion of the insulating layer 131b, which is formed between the adjacent light-emitting elements. In other words, the insulating layer 131a has an effect of improving the planarity of the formation surface of the common electrode 113. An insulating layer containing an organic material can be suitably used as the insulating layer 131a. As the insulating layer 131a, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example. Moreover, the insulating layer 131a can be formed using a photosensitive resin. As the photosensitive resin, a positive photosensitive material or a negative photosensitive material can be used.

By forming the insulating layer 131a using the photosensitive resin, the insulating layer 131a can be formed only by light exposure and development steps.

For higher planarity of the formation surface of the common electrode 113, at the end portion of the EL layer 112, the top surface of the insulating layer 131a and the top surface of the insulating layer 131b may be substantially aligned with the top surface of the EL layer 112. In addition, the top surface of the insulating layer 131 preferably has a flat shape. Note that it is not always necessary that the top surface of the insulating layer 131a, the top surface of the insulating layer 131b, and the top surface of the EL layer 112 are aligned with each other.

For example, the difference in level between the top surface of the insulating layer 131a and the top surface of the EL layer 112 is preferably less than or equal to 0.5 times as larger as the thickness of the insulating layer 131a, further preferably less than or equal to 0.3 times as larger as the thickness of the insulating layer 131a. In addition, for example, the insulating layer 131a may be provided so that the top surface of the EL layer 112 is higher than the top surface of the insulating layer 131a. Furthermore, for example, the insulating layer 131a may be provided so that the top surface of the insulating layer 131a is higher than the top surface of the light-emitting layer included in the EL layer 112.

In the case where the top surfaces of the EL layers 112 corresponding to different colors are not level with each other, the top surface of the insulating layer 131a may be substantially level with the top surface of each EL layer in the vicinity of the EL layer. Alternatively, the top surface of the insulating layer 131b may be substantially level with each EL layer in a region in contact with the side surface of the EL layer. For example, as illustrated in FIG. 2A and the like, the top surface of the insulating layer 131a may be substantially level with the top surface of the EL layer 112B in the vicinity of the EL layer 112B and may be substantially level with the top surface of the EL layer 112R in the vicinity of the EL layer 112R. Alternatively, for example, the top surface of the insulating layer 131b may be substantially level with the top surface of the EL layer 112B in a region in contact with the side surface of the EL layer 112B and may be substantially level with the top surface of the EL layer 112R in a region in contact with the side surface of the EL layer 112R.

Figure 2C:
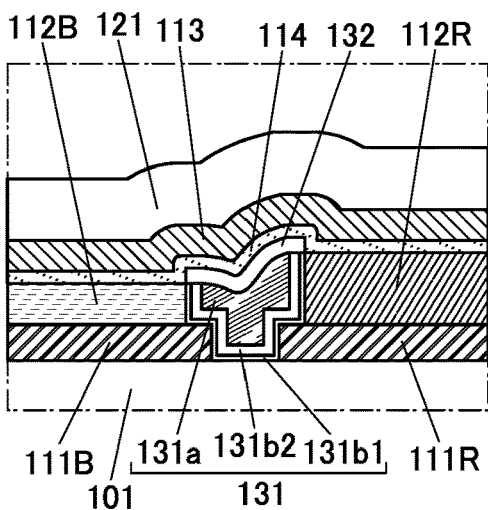

Alternatively, as illustrated in FIG. 2C, the top surface of the insulating layer 131a may have a hollow shape (sometimes referred to as a concave shape) in the center and the vicinity thereof. Furthermore, without limitation to this, the top surface of the insulating layer 131a may have a bulging shape (sometimes referred to as a convex shape) in the center and the vicinity thereof.

Moreover, the insulating layer 132 is provided over the insulating layer 131a and the insulating layer 131b. The insulating layer 132 is provided between the insulating layer 131 and the common electrode 113. Note that in the case where the common layer 114 is not provided, the top surface of the insulating layer 132 is preferably in contact with the bottom surface of the common electrode 113 like the top surface of each EL layer 112. In this manner, the insulating layer 131a overlaps with the common electrode 113 with the insulating layer 132 therebetween. That is, the insulating layer 131a is isolated from the common electrode 113 by the insulating layer 132.

Note that in the case where the common layer 114 is provided, the top surface of the insulating layer 132 is preferably in contact with the bottom surface of the common layer 114 like the top surface of each EL layer 112. In this case, the insulating layer 131a overlaps with the common layer 114 and the common electrode 113 with the insulating layer 132 therebetween. That is, the insulating layer 131a is isolated from the common layer 114 and the common electrode 113 by the insulating layer 132.

The insulating layer 132 includes a region in contact with the bottom surface of the common electrode 113 or the common layer 114, and functions as a protective insulating layer of the common electrode 113 and the common layer 114. It is preferable that the insulating layer 132 have a barrier property against at least one of oxygen and moisture. With the insulating layer 132 isolating the insulating layer 131a, the common electrode 113, and the common layer 114 from each other, oxygen, moisture, or constituent elements thereof can be inhibited from entering the inside of the common electrode 113 and the common layer 114 through the bottom surfaces thereof, whereby oxidation of the common electrode 113 and the common layer 114 can be suppressed. Accordingly, the display device illustrated in FIG. 1 or the like can be a highly reliable display device with high display quality.

For the insulating layer 132, the above-described inorganic material which has a barrier property against at least one of oxygen and moisture and can be used for the insulating layer 131b may be used. It is particularly preferable to use a nitride such as silicon nitride, aluminum nitride, hafnium nitride, or the like having a relatively high barrier property against oxygen and moisture. In addition, as a deposition method for the insulating layer 132, the above-described deposition method that can be used for the insulating layer 131b may be used. For example, silicon nitride deposited by a sputtering method may be used as the insulating layer 132.

The insulating layer 132 preferably has a thickness large enough to have a barrier property against at least one of oxygen and moisture. For example, the thickness of the insulating layer 132 is preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the thickness of the insulating layer 132 is within the above-described range, a highly reliable display device can be obtained.

The insulating layer 132 is preferably in contact with the insulating layer 131*b* in a region not overlapping with the insulating layer 131*a*. In particular, in the case where the insulating layer 131*b* includes the insulating layer 131*b*2 containing a nitride with a high barrier property as illustrated in FIG. 2A or the like, the insulating layer 131*b*2 is preferably in contact with the insulating layer 132. Furthermore, in a top view, a region where the insulating layer 132 and the insulating layer 131*b* are in contact with each other is preferably formed to surround the insulating layer 131*a*. With this structure, the top surface, side surface, and bottom surface of the insulating layer 131*a* are surrounded by the insulating layer 132 and the insulating layer 131*b*. In other words, the insulating layer 131*a* is sealed with the insulating layer 131*b* and the insulating layer 132 each of which has a barrier property against at least one of oxygen and moisture.

By sealing the insulating layer 131*a* containing an organic substance with the insulating layer 131*b* and the insulating layer 132, oxygen, moisture, or constituent elements thereof is inhibited from directly or indirectly diffusing into the EL layer 112, the common layer 114, and the common electrode 113 from the insulating layer 131*a*. Accordingly, the display quality and the reliability of the display device of one embodiment of the present invention can be improved.

Note that the insulating layer 132 preferably includes no or a small region overlapping with the adjacent EL layer 112 (the EL layer 112B and the EL layer 112R in FIG. 2A or the like). For example, as illustrated in FIG. 2A to FIG. 2C, or the like, the side surface of the insulating layer 131*b* and the side surface of the insulating layer 132 may be substantially aligned with each other.

Figure 3A:
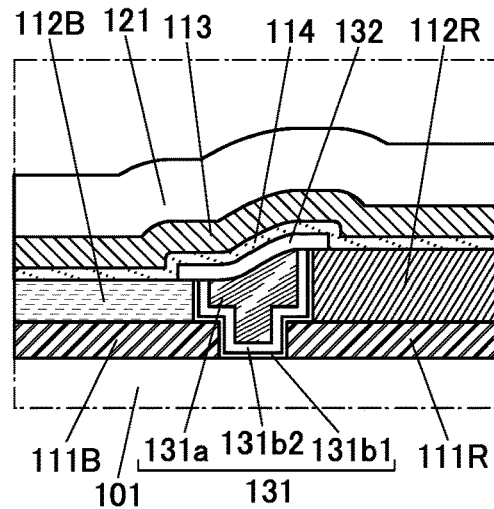
FIG. 3A to FIG. 3C are diagrams each illustrating a structure example of a display device.

Note that the present invention is not limited thereto, and part of the insulating layer 132 may overlap with the adjacent EL layer 112 (the EL layer 112B and the EL layer 112R in FIG. 3A) as illustrated in FIG. 3A.

In the case where part of the insulating layer 132 overlaps with the adjacent EL layer 112, part of the insulating layer 131*b* and part of a sacrificial layer 145 are formed between part of the insulating layer 132 and the EL layer 112 in some cases. Note that the sacrificial layer 145 is a layer containing an inorganic material and functioning as a hard mask when the EL layer 112 is formed. Details of the sacrificial layer 145 will be described in a method for manufacturing a display device described later.

Figure 3B:
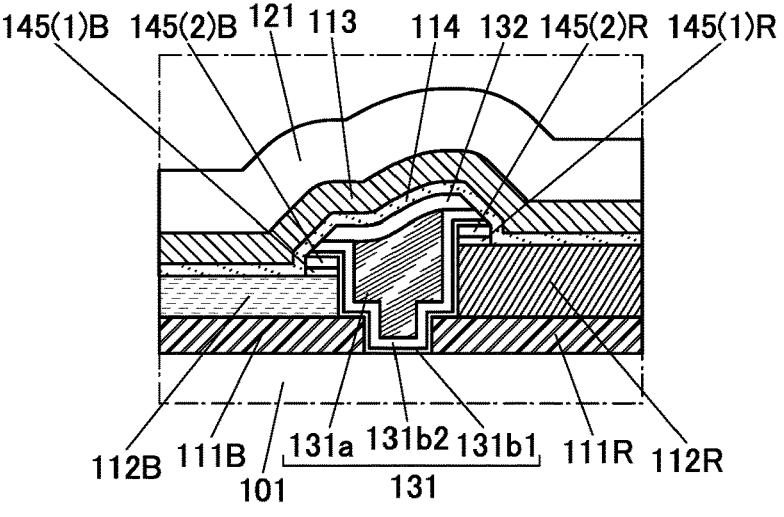

For example, as illustrated in FIG. 3B, the insulating layer 131*b* (the insulating layer 131*b*1 and the insulating layer 131*b*2) includes a first region which is positioned over the EL layer 112B and overlaps with the top surface of the EL layer 112B and a second region which is positioned over the EL layer 112R and overlaps with the top surface of the EL layer 112R. A sacrificial layer 145B (a sacrificial layer 145(1)B and a sacrificial layer 145(2)B) is formed between the first region of the insulating layer 131*b* and the EL layer 112B. A sacrificial layer 145R (a sacrificial layer 145(1)R and a sacrificial layer 145(2)R) is formed between the second region of the insulating layer 131*b* and the EL layer 112R.

Here, as illustrated in FIG. 3B, end portions of the insulating layer 132 and the insulating layer 131*b* each preferably have a tapered shape in a cross-sectional view. With such a structure, the common layer 114 and the common electrode 113, which are formed over the insulating layer 132 and the insulating layer 131*b*, can be deposited with excellent coverage, whereby generation of disconnection can be suppressed. Note that although not illustrated, an end portion of the sacrificial layer 145B and an end portion of the sacrificial layer 145R may also each be processed into a tapered shape in a cross-sectional view.

Figure 3C:
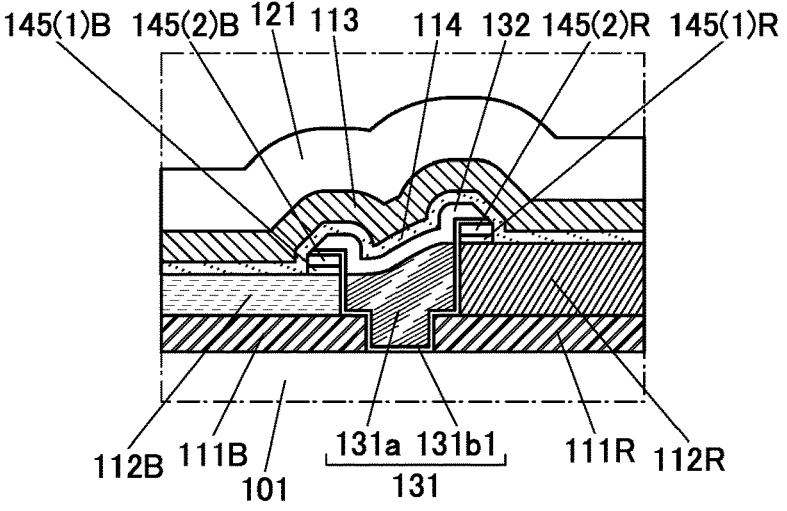

Note that in the structure illustrated in FIG. 3B, the top surface of the insulating layer 131*a* is substantially aligned with the top surface of the first region and the top surface of the second region of the insulating layer 131*b*; however, the present invention is not limited thereto. For example, as illustrated in FIG. 3C, the top surface of the insulating layer 131*a* may be positioned at a lower level than the top surface of the first region and the top surface of the second region of the insulating layer 131*b*. In addition, as illustrated in FIG. 3C, the insulating layer 131*b* may be a single layer of the insulating layer 131*b*1 as illustrated in FIG. 2B.

As illustrated in FIG. 1B and FIG. 1D, the insulating layer 131 and the insulating layer 132 are sometimes formed on the side surface of the connection electrode 111C. In this case, the sacrificial layer 145R might be formed between the connection electrode 111C and the insulating layer 131.

A protective layer 121 is provided over the common electrode 113 to cover the light-emitting element 110R, the light-emitting element 110G, and the light-emitting element 110B. The protective layer 121 has a function of preventing diffusion of impurities such as water into the light-emitting elements from above.

The protective layer 121 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as an indium gallium oxide or an indium gallium zinc oxide may be used for the protective layer 121.

As the protective layer 121, a stacked-layer film of an inorganic insulating film and an organic insulating film can be used. For example, a structure where an organic insulating film is provided between a pair of inorganic insulating films is preferably employed. Furthermore, the organic insulating film preferably functions as a planarization film. This enables the top surface of the organic insulating film to be flat, and accordingly coverage with the inorganic insulating film thereover is improved, leading to an improvement in barrier properties. Moreover, this structure is preferable because when a component (e.g., a color filter, an electrode of a touch sensor, a lens array, or the like) is provided above the protective layer 121, the flat top surface of the protective layer 121 allows the component to be less affected by an uneven shape caused by the lower components.

Like the common electrode 113, the common layer 114 is provided across a plurality of light-emitting elements. The common layer 114 is provided to cover the EL layer 112R, the EL layer 112G, and the EL layer 112B. The structure including the common layer 114 can simplify the manufacturing process, reducing the manufacturing cost. The common layer 114 and the common electrode 113 can be formed successively without an etching step or the like. Thus, the interface between the common layer 114 and the common electrode can be clean, and the light-emitting element can have favorable characteristics.

Each of the EL layer 112R, the EL layer 112G, and the EL layer 112B preferably includes at least a light-emitting layer containing a light-emitting material emitting light of one color, for example. The common layer 114 preferably includes one or more of an electron-injection layer, an electron-transport layer, a hole-injection layer, and a hole-transport layer, for example. In the light-emitting element in which the pixel electrode serves as an anode and the common electrode serves as a cathode, a structure including the electron-injection layer or a structure including the electron-injection layer and the electron-transport layer can be used as the common layer 114.

[Pixel Layout]

Next, pixel layouts different from that in FIG. 1A will be described. There is no particular limitation on the arrangement of subpixels, and a variety of methods can be employed. Examples of the arrangement of subpixels include stripe arrangement, S stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting element.

The pixel 103 illustrated in FIG. 4A employs an S-stripe arrangement. The pixel 103 illustrated in FIG. 4A consists of three subpixels: a subpixel 103a, a subpixel 103b, and a subpixel 103c. For example, as illustrated in FIG. 5A, the subpixel 103a may be a blue subpixel B, the subpixel 103b may be a red subpixel R, and the subpixel 103c may be a green subpixel G.

The pixel 103 illustrated in FIG. 4B includes the subpixel 103a that has a rough trapezoidal top surface shape with rounded corners, the subpixel 103b that has a rough triangular top surface shape with rounded corners, and the subpixel 103c that has a rough quadrangular or rough hexagonal top surface shape with rounded corners. The subpixel 103a has a larger light-emitting area than the subpixel 103b. In this manner, the shapes and sizes of the subpixels can be determined independently. For example, the size of a subpixel including a light-emitting element with higher reliability can be smaller. For example, as illustrated in FIG. 5B, the subpixel 103a may be a green subpixel G, the subpixel 103b may be a red subpixel R, and the subpixel 103c may be a blue subpixel B.

A pixel 124a and a pixel 124b illustrated in FIG. 4C employ PenTile arrangement. FIG. 4C illustrates an example where the pixels 124a including the subpixels 103a and the subpixels 103b and the pixels 124b including the subpixels 103b and the subpixels 103c are alternately arranged. For example, as illustrated in FIG. 5C, the subpixel 103a may be a red subpixel R, the subpixel 103b may be a green subpixel G, and the subpixel 103c may be a blue subpixel B.

The pixel 124a and the pixel 124b illustrated in FIG. 4D and FIG. 4E employ a delta arrangement. The pixel 124a includes two subpixels (the subpixel 103a and the subpixel 103b) in the upper row (first row) and one subpixel (the subpixel 103c) in the lower row (second row). The pixel 124b includes one subpixel (the subpixel 103c) in the upper row (first row) and two subpixels (the subpixel 103a and the subpixel 103b) in the lower row (second row). For example, as illustrated in FIG. 5D, the subpixel 103a may be a red subpixel R, the subpixel 103b may be a green subpixel G, and the subpixel 103c may be a blue subpixel B.

FIG. 4D is an example where each subpixel has a rough quadrangular top surface shape with rounded corners, and FIG. 4E is an example where each subpixel has a circular top surface shape.

FIG. 4F illustrates an example where subpixels of different colors are arranged in a zigzag manner. Specifically, the positions of the top sides of two subpixels arranged in the column direction (e.g., the subpixel 103a and the subpixel 103b or the subpixel 103b and the subpixel 103c) are not aligned in a top view. For example, as illustrated in FIG. 5E, the subpixel 103a may be a red subpixel R, the subpixel 103b may be a green subpixel G, and the subpixel 103c may be a blue subpixel B.

In a photolithography method, as a pattern to be formed by processing becomes finer, the influence of light diffraction becomes more difficult to ignore; accordingly, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel sometimes has a polygonal shape with rounded corners, an elliptical shape, a circular shape, or the like.

Furthermore, in the method for manufacturing the display device of one embodiment of the present invention, the EL layer is processed into an island shape with the use of a resist mask. A resist film formed over the EL layer needs to be cured at a temperature lower than the upper temperature limit of the EL layer. Thus, the resist film is insufficiently cured in some cases depending on the upper temperature limit of the material of the EL layer and the curing temperature of the resist material. An insufficiently cured resist film may have a shape different from a desired shape when processed. As a result, the top surface of the EL layer sometimes has a polygonal shape with rounded corners, an elliptical shape, a circular shape, or the like. For example, when a resist mask with a square top surface shape is intended to be formed, a resist mask with a circular top surface shape might be formed and the top surface shape of the EL layer might be circular.

To obtain a desired top surface shape of the EL layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

Manufacturing Method Example 1

An example of a method for manufacturing the display device of one embodiment of the present invention will be described below with reference to drawings. Here, the description is made with the use of the display device 100 illustrated in FIG. 1 and FIG. 3B above in Structure example described above. FIG. 7A to FIG. 11C are schematic cross-sectional views in steps of the method for manufacturing the display device exemplified below.

Note that thin films that form the display device (insulating films, semiconductor films, conductive films, and the like) can be formed by a sputtering method, a CVD method, a vacuum evaporation method, a PLD method, an ALD method, or the like. Examples of the CVD method include a plasma-enhanced chemical vapor deposition (PECVD) method and a thermal CVD method. As an example of the thermal CVD method, a metal organic chemical vapor deposition (MOCVD: Metal Organic CVD) method can be given.

Alternatively, thin films that constitute the display device (insulating films, semiconductor films, conductive films, or the like) can be formed by a method such as spin coating, dipping, spray coating, ink-jetting, dispensing, screen printing, offset printing, a doctor knife method, a slit coater, a roll coater, a curtain coater, or a knife coater.

Thin films that constitute the display device can be processed by a photolithography method or the like. Besides, a nanoimprinting method, a sandblasting method, a lift-off method, or the like may be used for the processing of the thin films. Alternatively, island-shaped thin films may be directly formed by a deposition method using a shielding mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is deposited and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Alternatively, ultraviolet light, KrF laser light, ArF laser light, or the like can be used. In addition, light exposure may be performed by liquid immersion exposure technique. As the light used for light exposure, extreme ultraviolet (EUV) light or X-rays may also be used. Furthermore, instead of the light used for the light exposure, an electron beam can also be used. It is preferable to use extreme ultraviolet light, X-rays, or an electron beam because they can perform extremely fine processing. Note that in the case of performing light exposure by scanning of a beam such as an electron beam, a photomask need not be used.

For etching of thin films, a dry etching method, a wet etching method, a sandblasting method, or the like can be used.

[Preparation for Substrate 101]

As a substrate 101, a substrate having at least heat resistance high enough to withstand heat treatment performed later can be used. In the case where an insulating substrate is used as the substrate 101, a glass substrate, a quartz substrate, a sapphire substrate, a ceramic substrate, an organic resin substrate, or the like can be used. Alternatively, a single crystal semiconductor substrate or a polycrystalline semiconductor substrate using silicon, silicon carbide, or the like as a material, a compound semiconductor substrate of silicon germanium or the like, or a semiconductor substrate such as an SOI substrate can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

Figures 7A, 7B, 7C, 7D, 7E, 7F:
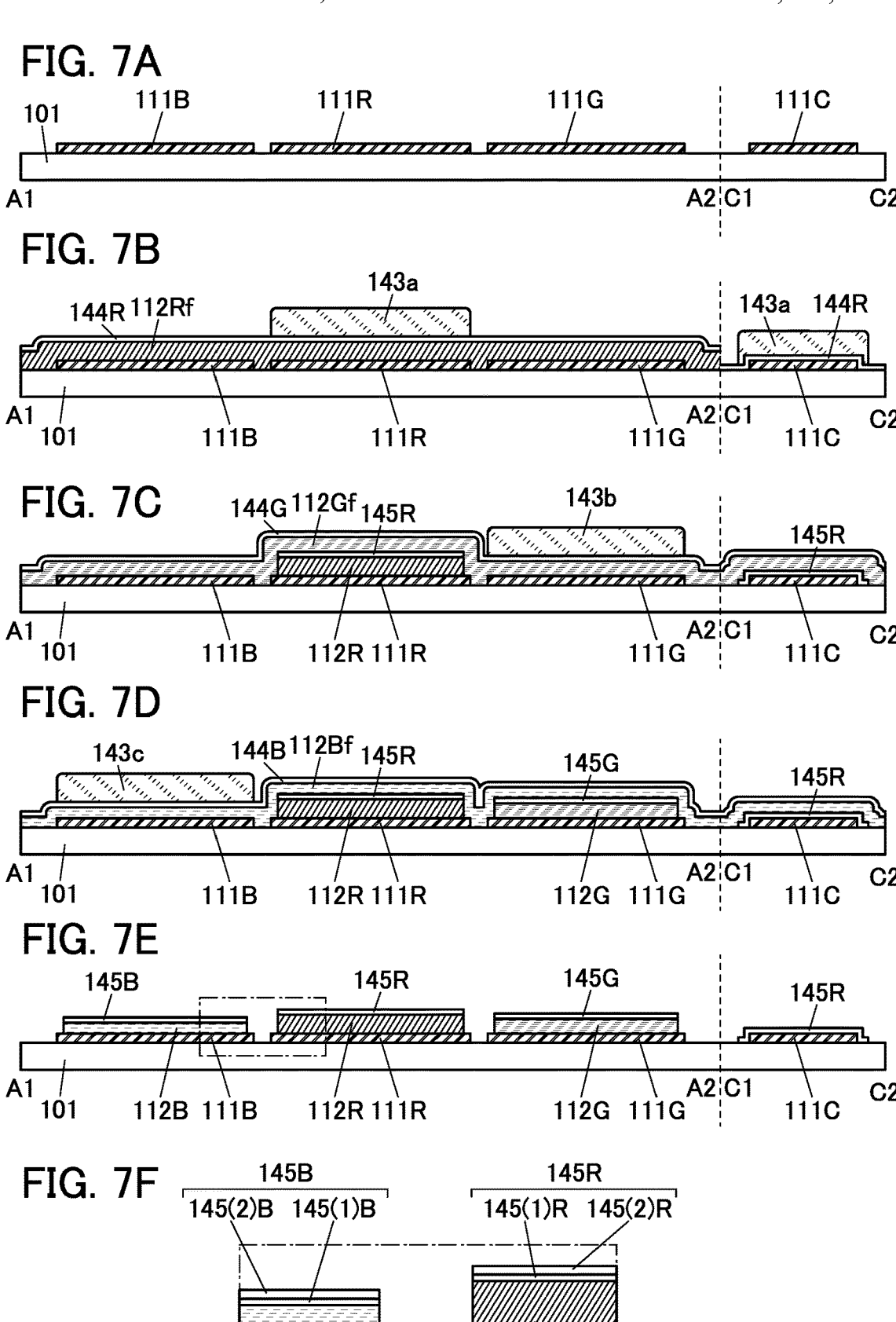
FIG. 7A to FIG. 7F are diagrams illustrating an example of a method for manufacturing a display device.

Next, a conductive film to be the pixel electrode 111 and the connection electrode 111C is deposited over the substrate 101. Subsequently, part of the conductive film is etched, so that the pixel electrode 111R, the pixel electrode 111G, the pixel electrode 111B, and the connection electrode 111C are formed over the substrate 101 (FIG. 7A).

In the case where a conductive film having a reflective property with respect to visible light is used as the pixel electrode, a material that has a reflectance as high as possible in the whole wavelength range of visible light (e.g., silver, aluminum, or the like) is preferably used. This can increase color reproducibility as well as light extraction efficiency of the light-emitting elements.

[Formation of EL Film 112Rf]

Next, an EL film 112Rf to be the EL layer 112R later is deposited over the pixel electrode 111R, the pixel electrode 111G, and the pixel electrode 111B.

The EL film 112Rf includes at least a film containing a light-emitting compound. Besides, a structure where one or more of films functioning as an electron-injection layer, an electron-transport layer, a charge generation layer, a hole-transport layer, and a hole-injection layer are stacked may be employed. The EL film 112Rf can be formed by, for example, an evaporation method, a sputtering method, an inkjet method, or the like. Note that without limitation to this, the above deposition method can be used as appropriate.

[Formation of Sacrificial Film 144(1)R and Sacrificial Film 144(2)R]

Next, the deposition step of sacrificial films will be described.

A sacrificial film 144R is a film to be the sacrificial layer 145R. In addition, a sacrificial film 144G described later is a film to be the sacrificial layer 145G, and a sacrificial film 144B is a film to be the sacrificial layer 145B. The sacrificial layer 145R, the sacrificial layer 145G, and the sacrificial layer 145B are collectively referred to as the sacrificial layer 145 in some cases. The sacrificial layer 145 may have a single-layer structure or a stacked-layer structure of two or more layers.

An example in which a sacrificial layer with a two-layer structure is used will be described below.

In the example described below, a stacked-layer structure of a sacrificial film 144(1)R and a sacrificial film 144(2)R is used for the sacrificial film 144R, a stacked-layer structure of a sacrificial film 144(1)G and a sacrificial film 144(2)G is used as the sacrificial film 144G, and a stacked-layer structure of a sacrificial film 144(1)B and a sacrificial film 144(2)B is used as the sacrificial film 144B.

The sacrificial film 144(1)R is a film to be the sacrificial layer 145(1)R, and the sacrificial film 144(2)R is a film to be the sacrificial layer 145(2)R. The sacrificial film 144(1)G is a film to be the sacrificial layer 145(1)G, and the sacrificial film 144(2)G is a film to be the sacrificial layer 145(2)G. The sacrificial film 144(1)B is a film to be the sacrificial layer 145(1)B, and the sacrificial film 144(2)B is a film to be the sacrificial layer 145(2)B.

In the deposition step of the sacrificial film, first, the sacrificial film 144(1)R is formed to cover the EL film 112Rf. Moreover, the sacrificial film 144(1)R is provided in contact with the top surface of the connection electrode 111C. Next, the sacrificial film 144(2)R is formed over the sacrificial film 144(1)R.

The sacrificial film 144(1)R and the sacrificial film 144(2)R can be formed by a sputtering method, an ALD method (including a thermal ALD method or a PEALD method), or a vacuum evaporation method, for example. Note that the sacrificial film 144(1)R formed directly on the EL film 112Rf is preferably formed by a method which cause less damage to the EL layer. Thus, an ALD method or a vacuum evaporation method is more suitable for the formation of the sacrificial film 144(1)R than a sputtering method.

An inorganic film such as a metal film, an alloy film, a metal oxide film, a semiconductor film, or an inorganic insulating film can be suitably used as the sacrificial film 144(1)R.

Alternatively, an oxide film can be used as the sacrificial film 144(1)R. Typically, an oxide film or an oxynitride film such as silicon oxide, silicon oxynitride, aluminum oxide, aluminum oxynitride, hafnium oxide, or hafnium oxynitride can be used. Alternatively, a nitride film can be used as the sacrificial film 144(1)R, for example. Specifically, it is possible to use a nitride such as silicon nitride, aluminum nitride, hafnium nitride, titanium nitride, tantalum nitride, tungsten nitride, gallium nitride, or germanium nitride. Such an inorganic insulating material can be formed by a sputtering method, a CVD method, or an ALD method, for example. In particular, an ALD method is preferably used for the sacrificial film 144(1)R formed directly on the EL film 112Rf.

For the sacrificial film 144(1)R, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, a metal oxide such as an indium gallium zinc oxide (In—Ga—Zn oxide, also referred to as IGZO) can be used for the sacrificial film 144(1)R. It is also possible to use indium oxide, indium zinc oxide (In—Zn oxide), indium tin oxide (In—Sn oxide, also referred to as ITO), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium.

Any of the above-described materials usable for the sacrificial film 144(1)R can be used for the sacrificial film 144(2)R. From the above materials usable for the sacrificial film 144(1)R, one material can be selected for the sacrificial film 144(1)R and another material can be selected for the sacrificial film 144(2)R. Alternatively, one or more materials can be selected for the sacrificial film 144(1)R from the above materials usable for the sacrificial film 144(1)R, and a material selected form materials excluding the material(s) selected for the sacrificial film 144(1)R can be used for the sacrificial film 144(2)R.

As the sacrificial film 144(1)R, it is possible to use a film highly resistant to etching treatment performed on various EL films such as the EL film 112Rf, i.e., a film having high etching selectivity. Moreover, as the sacrificial film 144(1)R, it is particularly preferable to use a film that can be removed by a wet etching method that is less likely to cause damage to the EL film.

Moreover, a material that can be dissolved in a solvent chemically stable with respect to at least a film positioned in the uppermost portion of the EL film 112Rf may be used for the sacrificial film 144(1)R. In particular, a material that is dissolved in water or alcohol can be suitably used for the sacrificial film 144(1)R. In deposition of the sacrificial film 144(1)R, it is preferable that application of such a material dissolved in a solvent such as water or alcohol be performed by a wet deposition method and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

Examples of a wet deposition method usable for forming the sacrificial film 144(1)R include spin coating, dipping, spray coating, ink-jetting, dispensing, screen printing, offset printing, a doctor knife method, a slit coater, a roll coater, a curtain coater, a knife coater, and the like.

For the sacrificial film 144(1)R, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

As the sacrificial film 144(2)R, a film having high etching selectivity with respect to the sacrificial film 144(1)R is used.

For the sacrificial film 144(1)R, an inorganic insulating material, such as aluminum oxide, hafnium oxide, or silicon oxide, formed by an ALD method is particularly preferably used; and for the sacrificial film 144(2)R, a metal oxide containing indium, such as IGZO formed by a sputtering method is particularly preferably used. Furthermore, tungsten formed by a sputtering method may be used as the sacrificial film 144(2)R.

Alternatively, an organic film that can be used as the EL film 112Rf or the like can be used as the sacrificial film 144(2)R. For example, the organic film that is used as the EL film 112Rf, an EL film 112Gf, or an EL film 112Bf can be used as the sacrificial film 144(2)R. The use of such an organic film is preferable, in which case the deposition apparatus for the EL film 112Rf or the like can be used in common. Furthermore, a sacrificial layer 145(2)R can be removed at the same time as the etching of the EL film 112Rf or the like; thus, the process can be simplified.

For example, in the case where dry etching using a gas containing fluorine (also referred to as a fluorine-based gas) is used for the etching of the EL film 112Rf, silicon, silicon nitride, silicon oxide, tungsten, titanium, molybdenum, tantalum, tantalum nitride, an alloy containing molybdenum and niobium, an alloy containing molybdenum and tungsten, or the like can be used for the sacrificial film 144(2)R. Here, a metal oxide film such as IGZO or ITO is given as a film having high etching selectivity (that is, enabling low etching rate) in dry etching using the fluorine-based gas, and such a film can be used as the sacrificial film 144(1)R.

[Formation of Resist Mask 143a]

Next, a resist mask 143a is formed over the sacrificial film 144(2)R (FIG. 7B). Note that FIG. 7B illustrates an example where the EL film 112Rf is not deposited in the region 130. In the case where the region 130 is shielded in deposition of the EL film 112Rf, a metal mask can be used. Since the metal used here does not need to shield a pixel region of the display portion, a fine mask does not need to be used.

For the resist mask 143a, a resist material containing a photosensitive resin such as a positive resist material or a negative resist material can be used.

Here, in the case where the resist mask 143a is formed over the sacrificial film 144(2)R, if a defect such as a pinhole exists in the sacrificial film 144(2)R, the EL film 112Rf might be dissolved in a solvent of the resist material. With the use of an inorganic insulating material such as aluminum oxide, hafnium oxide, or silicon oxide formed by an ALD method for the sacrificial film 144(1)R, a film with few pinholes can be formed and generation of such a defect can be prevented.

[Etching of Sacrificial Film 144(1)R and Sacrificial Film 144(2)R]

Next, part of the sacrificial film 144(2)R and part of the sacrificial film 144(1)R that are not covered with the resist mask 143a is removed by etching, whereby the island-shaped or band-shaped sacrificial layer 145R (the sacrificial layer 145(1)R and the sacrificial layer 145(2)R) is formed. Here, the sacrificial layer 145(1)R and the sacrificial layer 145(2)R are formed over the pixel electrode 111R. Furthermore, the sacrificial layer 145(1)R and the sacrificial layer 145(2)R are formed to cover the connection electrode 111C.

Here, preferably, part of the sacrificial film 144(2)R is removed by etching using the resist mask 143a to form the sacrificial layer 145(2)R, the resist mask 143a is removed, and then the sacrificial film 144(1)R is etched using the sacrificial layer 145(2)R as a hard mask. The etching of the sacrificial film 144(2)R preferably employs etching conditions with high selectivity with respect to the sacrificial film 144(1)R. Although a wet etching or a dry etching can be used for the etching for forming the hard mask, a shrinkage of the pattern can be inhibited by a dry etching method. For example, in the case where an inorganic insulating material such as aluminum oxide, hafnium oxide, or silicon oxide formed by an ALD method is used for the sacrificial film 144(1)R and a metal oxide containing indium, such as IGZO formed by a sputtering method is used for the sacrificial film 144(2)R, the sacrificial film 144(2)R formed by a sputtering method is etched here to form a hard mask.

The removal of the resist mask 143a can be performed by wet etching or dry etching. It is particularly preferable to perform dry etching (also referred to as plasma ashing) using an oxygen gas as an etching gas to remove the resist mask 143a.

When the sacrificial film 144(1)R is etched using the sacrificial layer 145(2)R as a hard mask, the removal of the resist mask 143a can be performed while the EL film 112Rf is covered with the sacrificial film 144(1)R. This is particularly suitable in the case where etching using an oxygen gas, such as plasma ashing, is performed because the electrical characteristics might be adversely affected when the EL film 112Rf is exposed to oxygen.

Next, the sacrificial film 144(1)R is removed by etching using the sacrificial layer 145(2)R as a mask, so that the island-shaped or band-shaped sacrificial layer 145(1)R is formed. Note that in the method for manufacturing the display device of one embodiment of the present invention, a structure may be employed where either the sacrificial layer 145(1)R and the sacrificial layer 145(2)R is not used.

[Etching of EL Film 112Rf]

Next, part of the EL film 112Rf that is not covered with the sacrificial layer 145(1)R is removed by etching, so that the island-shaped or band-shaped EL layer 112R is formed.

For the etching of the EL film 112Rf, it is preferable to use dry etching using an etching gas that does not contain oxygen as its main component. This can inhibit the alteration of the EL film 112Rf to achieve a highly reliable display device. Examples of the etching gas that does not contain oxygen as its main component include $CF_4$, $C_4F_8$, $SF_6$, $CHF_3$, $Cl_2$, $H_2O$, $BCl_3$, and a noble gas such as He. Alternatively, a mixed gas of the above gas and a dilution gas that does not contain oxygen can be used as the etching gas. Here, in the etching of the EL film 112Rf, part of the sacrificial layer 145(2)R may be removed.

Note that etching of the EL film 112Rf is not limited to the above and may be performed by dry etching using another gas or wet etching.

When dry etching using an oxygen gas or an etching gas containing an oxygen gas is employed for the etching of the EL film 112Rf, the etching rate can be increased. Consequently, etching under a low-power condition can be performed while the etching rate is kept adequately high; hence, damage due to the etching can be reduced. Furthermore, a defect such as attachment of a reaction product generated in the etching can be inhibited. For example, an etching gas obtained by adding an oxygen gas to the etching gas that does not contain oxygen as its main component can be used.

In the above-described step, when the etching of the EL film 112Rf is performed using a gas containing oxygen, the surface state of the pixel electrode 111G and the pixel electrode 111B may be changed. For example, the surfaces of the pixel electrode 111G and the pixel electrode 111B become hydrophilic. Here, an EL film to be formed so as to include a region in contact with the pixel electrode 111G in a later step and an EL film to be formed so as to include a region in contact with the pixel electrode 111B are hydrophobic. Accordingly, adhesion between an EL film to be formed in a later step and the pixel electrode 111G and the pixel electrode 111B is lowered, so that film peeling might be caused.

In view of the above, the surface of the pixel electrode 111G and the surface of the pixel electrode 111B are subjected to hydrophobic treatment, whereby peeling of the EL film to be formed in a later step can be suppressed. Thus, the display device 100 can be a highly reliable display device. In addition, the yield in manufacturing the display device 100 can be improved, and the manufacturing cost of the display device 100 can be reduced. The hydrophobic treatment is preferably performed before the formation of the EL film 112Gf and the EL film 112Bf described later.

The hydrophobic treatment can be performed by fluorine modification of the pixel electrode 111G and the pixel electrode 111B, for example. The fluorine modification can be performed by, for example, treatment or heat treatment using a fluorine-containing gas, plasma treatment in a fluorine-containing gas atmosphere, or the like. As the gas containing fluorine, a fluorine gas such as a fluorocarbon gas can be used, for example. As the fluorocarbon gas, a low carbon fluoride gas such as a carbon tetrafluoride ($CF_4$) gas, a $C_4F_6$ gas, a $C_2F_6$ gas, a $C_4F_8$ gas, or a $C_5F_8$ gas can be used, for example. Alternatively, as the gas containing fluorine, an $SF_6$ gas, an $NF_3$ gas, a $CHF_3$ gas, or the like can be used, for example. Alternatively, a helium gas, an argon gas, a hydrogen gas, or the like can be added to any of the above gases as appropriate.

In addition, treatment using a silylating agent is performed on the surface of the pixel electrode 111G and the surface of the pixel electrode 111B after plasma treatment is performed in a gas atmosphere containing a Group 18 element such as argon, so that the surface of the pixel electrode 111G and the surface of the pixel electrode 111B can become hydrophobic. As the silylating agent, hexamethyldisilazane (HMDS), N-trimethylsilylimidazole (TMSI), or the like can be used. Alternatively, treatment using a silane coupling agent is performed on the surface of the pixel electrode 111G and the surface of the pixel electrode 111B after plasma treatment is performed in a gas atmosphere containing a Group 18 element such as argon, so that the surface of the pixel electrode 111G and the surface of the pixel electrode 111B can become hydrophobic. Note that the treatment using a silylating agent, a silane coupling agent, or the like can be performed by a spin coating method, a dipping method, a vapor deposition method, or the like.

[Formation of EL Layer 112G and EL Layer 112B]

Subsequently, the EL film 112Gf to be the EL layer 112G is deposited over the sacrificial layer 145(2)R, over the pixel electrode 111G, and over the pixel electrode 111B. For the EL film 112Gf, the description of the EL film 112Rf can be referred to.

Next, the sacrificial film 144(1)G is deposited over the EL film 112Gf. For the sacrificial film 144(1)G, the description of the sacrificial film 144(1)R can be referred to.

Subsequently, the sacrificial film 144(2)G is deposited over the sacrificial film 144(1)G. For the sacrificial film 144(2)G, the description of the sacrificial film 144(2)R can be referred to. Next, a resist mask 143b is formed over the sacrificial film 144(2)G (FIG. 7C).

Subsequently, the sacrificial layer 145(1)G, the sacrificial layer 145(2)G, and the EL layer 112G are formed. For the formation of the sacrificial layer 145(1)G, the sacrificial layer 145(2)G, and the EL layer 112G, the formation of the sacrificial layer 145(1)R, the sacrificial layer 145(2)R, and the EL layer 112R can be referred to.

Next, the EL film 112Bf to be the EL layer 112B is deposited over the sacrificial layer 145(2)R, over the sacrificial layer 145(2)G, and over the pixel electrode 111B. For the EL film 112Bf, the description of the EL film 112Rf can be referred to.

Subsequently, the sacrificial film 144(1)B is deposited over the EL film 112Bf. For the sacrificial film 144(1)B, the description of the sacrificial film 144(1)R can be referred to.

Next, the sacrificial film 144(2)B is deposited over the sacrificial film 144(1)B. For the sacrificial film 144(2)B, the description of the sacrificial film 144(2)R can be referred to.

Subsequently, a resist mask 143c is formed over the sacrificial film 144(2)B (FIG. 7D).

Next, the sacrificial layer 145(1)B, the sacrificial layer 145(2)B, and the EL layer 112B are formed (FIG. 7E). For the formation of the sacrificial layer 145(1)B, the sacrificial layer 145(2)B, and the EL layer 112B, the formation of the sacrificial layer 145(1)R, the sacrificial layer 145(2)R, and the EL layer 112R can be referred to.

FIG. 7F illustrates an enlarged view of a region surrounded by a dashed-dotted square in FIG. 7E.

[Formation of Insulating Layer 131]

Figure 8A:
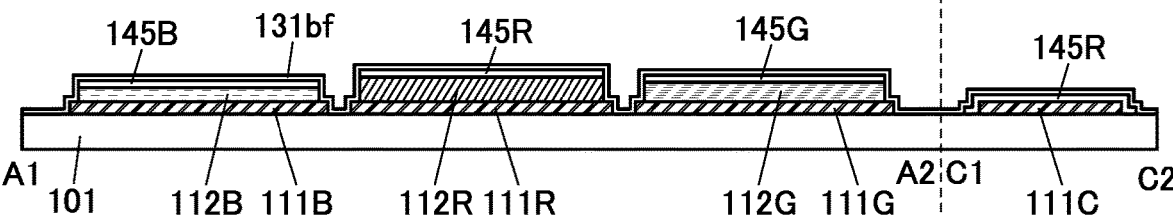
FIG. 8A to FIG. 8D are diagrams illustrating an example of a method for manufacturing a display device.

Next, an insulating film 131bf to be the insulating layer 131b is formed (FIG. 8A). A film containing an inorganic material is preferably used as the insulating film 131bf. For example, a single layer or stacked layers of a film containing aluminum oxide, magnesium oxide, hafnium oxide, gallium oxide, indium gallium zinc oxide, silicon oxide, silicon oxynitride, silicon nitride, silicon nitride oxide, or the like can be used.

For the formation of the insulating film 131bf, a sputtering method, a chemical vapor deposition (CVD) method, a molecular beam epitaxy (MBE) method, a pulsed laser deposition (PLD) method, an atomic layer deposition (ALD) method, or the like can be used. An ALD method achieving favorable coverage can be suitably used for formation of the insulating film 131bf.

As the insulating film 131bf, a single layer or stacked layers of aluminum oxide, magnesium oxide, hafnium oxide, gallium oxide, indium gallium zinc oxide, silicon oxide, silicon oxynitride, silicon nitride, silicon nitride oxide, or the like can be used. In particular, aluminum oxide is preferable because it has high selectivity with respect to the EL layer 112 in etching and has a function of protecting the EL layer 112 in forming the insulating layer 131b which is to be described later.

The insulating film 131bf formed by an ALD method can be a film with few pinholes, and the insulating layer 131b can have an excellent function of protecting the EL layer 112.

In addition, the deposition temperature of the insulating film 131bf is preferably lower than the upper temperature limit of the EL layer 112. For example, aluminum oxide is preferably formed by an ALD method as the insulating film 131bf. The formation temperature of the insulating film 131bf by an ALD method is preferably higher than or equal to 60° C. and lower than or equal to 150° C., further preferably higher than or equal to 70° C. and lower than or equal to 115° C., still further preferably higher than or equal to 80° C. and lower than or equal to 100° C. By depositing the insulating film 131bf at such a temperature, a dense insulating film can be obtained and damage to the EL layer 112 can be reduced.

Furthermore, the insulating film 131bf preferably has a stacked-layer structure. For example, as illustrated in FIG. 3B, the insulating film 131bf can have a stacked-layer structure of an insulating film 131b if including aluminum oxide deposited by an ALD method and an insulating film 131b2f including silicon nitride deposited by a sputtering method. Providing the insulating film 131b2f including silicon nitride can further improve the barrier property of the insulating film 131bf. In addition, since the insulating film 131b2f is deposited over the insulating film 131b if by a sputtering method, damage to the EL layer 112 or the like can be reduced.

Figure 8B:
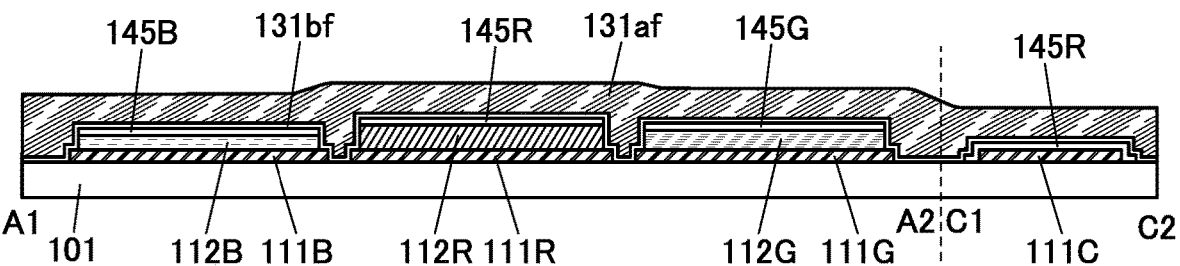

Next, an insulating film 131af to be the insulating layer 131a is formed (FIG. 8B). The insulating film 131af is provided so as to fill the depressed portion of the insulating film 131bf. Furthermore, the insulating film 131af is provided so as to cover the sacrificial layer 145, the EL layer 112, and pixel electrode 111. The insulating film 131af is preferably a planarization film.

As the insulating film 131af, an insulating film containing an organic material is preferably used, and a resin is preferably used as the organic material.

As a material that can be used for the insulating film 131af, an acrylic resin, a polyimide resin, an epoxy resin, a polyamide resin, a polyimide-amide resin, a siloxane resin, a benzocyclobutene-based resin, a phenol resin, and precursors of these resins can be given, for example. A photosensitive resin can be used for the insulating film 131af. As the photosensitive resin, a positive photosensitive material or a negative photosensitive material can be used.

When the insulating film 131af is formed using a photosensitive resin, the insulating film 131a can be manufactured only by light exposure and development steps, so that damage to the layers included in the light-emitting element 110, especially the EL layers can be reduced.

As illustrated in FIG. 8B, the insulating film 131af has a slight unevenness reflecting unevenness of the formation surface in some cases. Alternatively, the insulating film 131af may be less affected by the unevenness of the formation surface and may have higher planarity than that in FIG. 8B.

Next, the insulating layer 131a is formed. Here, when a photosensitive resin is used for the insulating film 131af, the insulating layer 131a can be formed without providing an etching mask such as a resist mask or a hard mask. Since a photosensitive resin can be processed only by light exposure and development steps, the insulating layer 131a can be formed without using a dry etching method or the like. Thus, the process can be simplified. In addition, damage to the EL layer due to etching of the insulating film 131*af* can be reduced. Furthermore, an upper portion of the insulating layer 131*a* may be partly etched to adjust the level of the surface.

The insulating layer 131*a* may alternatively be formed by performing etching substantially uniformly on the top surface of the insulating film 131*af*. Such uniform etching for planarization is also referred to as etch back. Here, as the etch back of the insulating film 131*af*, ashing using oxygen plasma may be performed, for example.

To form the insulating layer 131*a*, the light exposure and development steps and the etch back step may be used in combination.

Figure 8C:
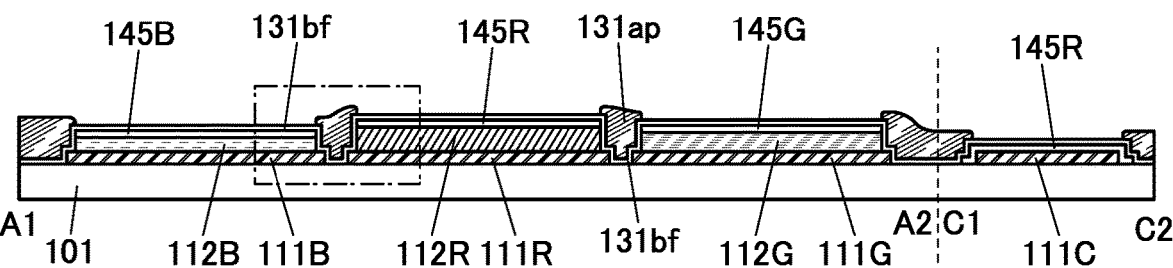
Figure 8D:
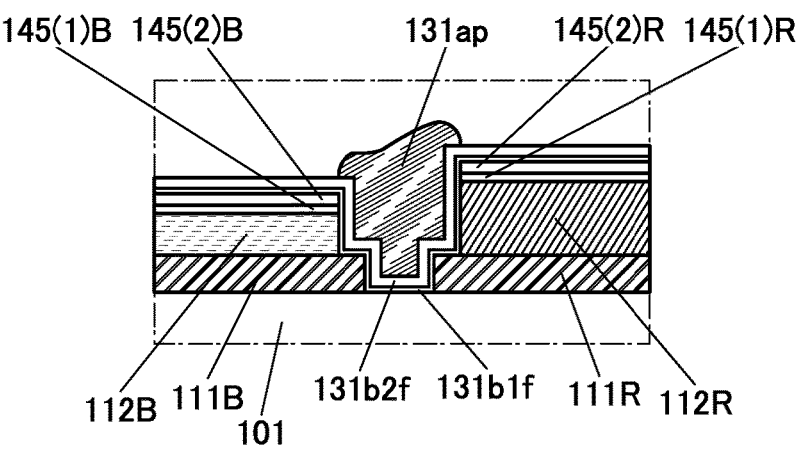
Figure 9A:
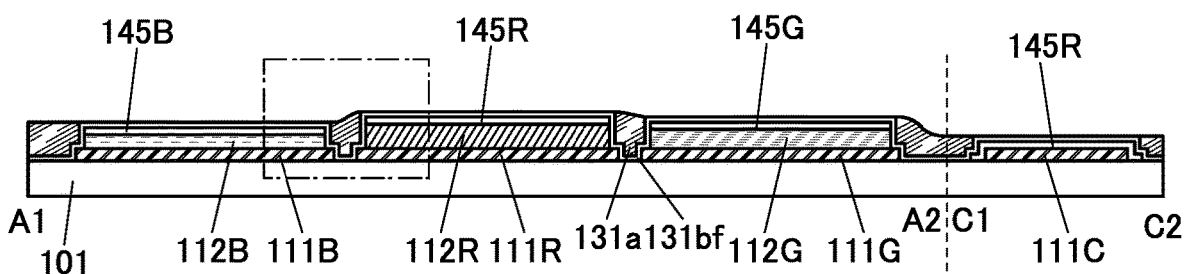
FIG. 9A to FIG. 9D are diagrams illustrating an example of a method for manufacturing a display device.
Figure 9B:
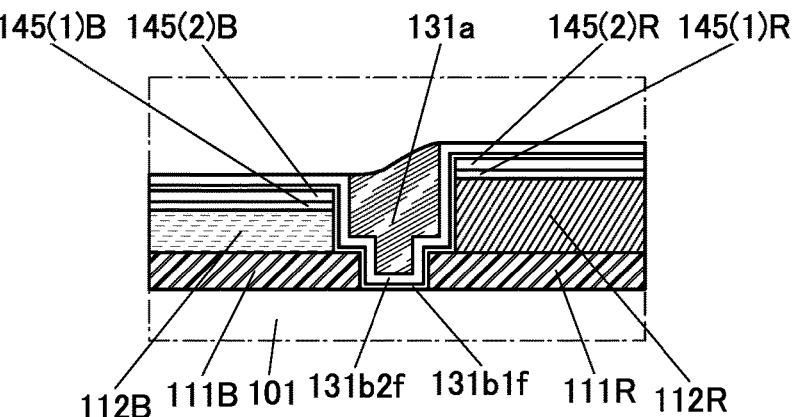

An example of a formation method of the insulating layer 131*a* is described with reference to FIG. 8C to FIG. 9B. FIG. 8C illustrates an example in which an insulating layer 131*ap* is formed with the use of a photosensitive resin as the insulating film 131*af* by processing the insulating film 131*af* in light exposure and development steps. FIG. 8D is an enlarged view of a region surrounded by a dashed-dotted square in FIG. 8C. The insulating layer 131*a* illustrated in FIG. 9A can be formed by further etching the insulating layer 131*ap* illustrated in FIG. 8C. FIG. 9B is an enlarged view of a region surrounded by a dashed-dotted square in FIG. 9A.

Note that the etch back of the insulating film 131*bf* can be performed in the formation of the insulating layer 131*a*. A dry etching method or a wet etching method can be used for the etch back of the insulating film 131*bf*. The etching may be performed by ashing using oxygen plasma or the like. In addition, chemical mechanical polishing (CMP) may be used for the etch back of the insulating film 131*bf*.

Here, the insulating layer 131*a* has a shape having a concave (a hollow shape), a shape having a convex (a bulging shape), or the like in a region between the plurality of EL layers 112 in some cases.

Note that in the case where the insulating layer 131*ap* illustrated in FIG. 8C can be used as the insulating layer 131*a*, the sacrificial layer 145 sometimes remains between the insulating layer 131*a* and the EL layer 112 in the light-emitting element 110.

[Formation of Insulating Film 132*f*]

Figure 9C:
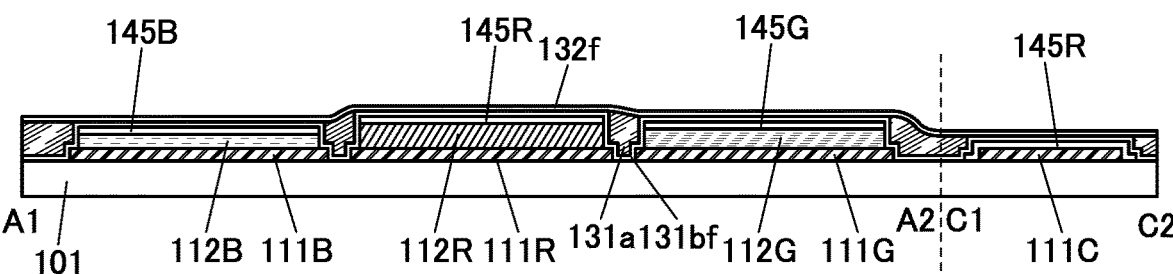

Next, an insulating film 132*f* to be the insulating layer 132 is formed (FIG. 9C). For the insulating film 132*f*, the above-described inorganic materials that can be used for the insulating film 131*bf* may be used. Similarly, the above-described deposition method that can be used for the insulating film 131*bf* may be used for the insulating film 132*f*. For example, silicon nitride may be deposited by a sputtering method as the insulating film 132*f*. Since the insulating layer 131*a* is formed in the previously mentioned step and the planarity of the formation surface is improved, the insulating film 132*f* can be formed without disconnection by a sputtering method.

[Formation of Resist Mask 148]

Figure 9D:
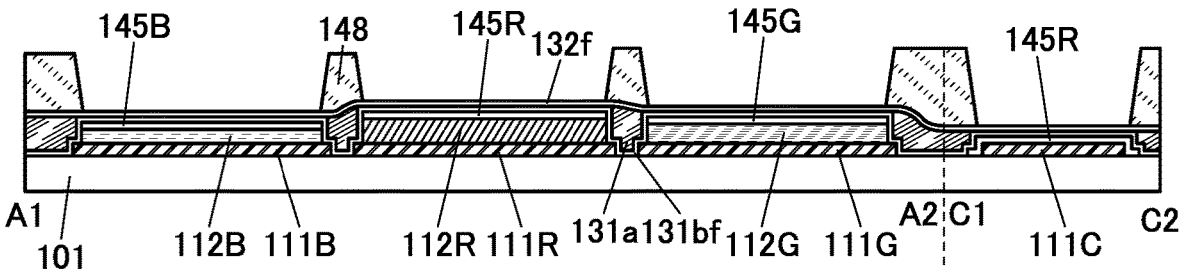

Next, a resist mask 148 is formed over the insulating film 132*f* (FIG. 9D). Here, the resist mask 148 is formed to overlap with at least the insulating layer 131*a*. The resist mask 148 can be formed using a material and a method similar to those of the above-described resist mask 143*a* or the like.

[Etching of Insulating Film 132*f*, Insulating Film 131*Bf*, and Sacrificial Layer 145(2)]

Figure 10A:
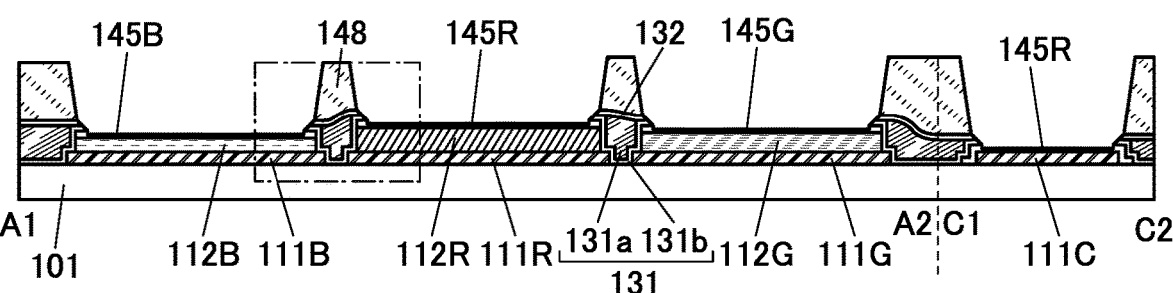
FIG. 10A to FIG. 10C are diagrams illustrating an example of a method for manufacturing a display device.

Subsequently, regions of the insulating film 132*f*, the insulating film 131*bf*, the sacrificial layer 145(2)R, the sacrificial layer 145(2)G, and the sacrificial layer 145(2)B (hereinafter, collectively referred to as a sacrificial layer 145(2)) which do not overlap with the resist mask 148 are removed by etching or the like (FIG. 10A). Note that FIG. 10B is an enlarged view of a region surrounded by a dashed-dotted square in FIG. 10A.

With this structure, the insulating layer 132 and the insulating layer 131*b* (the insulating layer 131*b*1 and the insulating layer 131*b*2) are formed below the resist mask 148. The insulating layer 131*b* is formed so as to cover the side surfaces of the EL layer 112 and the pixel electrode 111. In addition, the insulating layer 132 is formed in a region not overlapping with the insulating layer 131*a* so as to be in contact with the insulating layer 131*b*. In this manner, the insulating layer 131*a* can be sealed with the insulating layer 131*b* and the insulating layer 132. Accordingly, oxygen, moisture, or constituent elements thereof can be inhibited from directly or indirectly diffusing into the EL layer 112, the common layer 114, and the common electrode 113 from the insulating layer 131*a*.

Figure 10B:
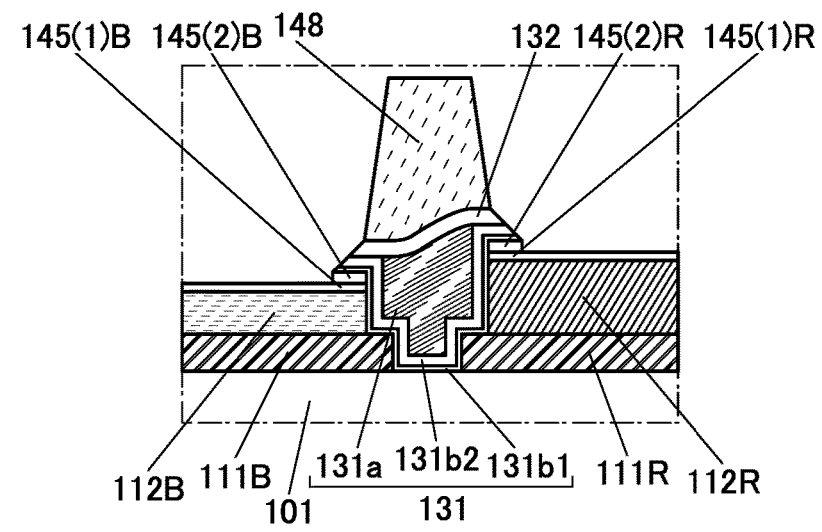

Furthermore, part of the sacrificial layer 145(2) (the sacrificial layer 145(2)B and the sacrificial layer 145(2)R in FIG. 10B) sometimes remains over the sacrificial layer 145(1). A dry etching method or a wet etching method can be used for the etching of the insulating film 132*f*, the insulating film 131*bf*, and the sacrificial layer 145(2).

As illustrated in FIG. 10B and the like, the end portions of the insulating layer 132 and the insulating layer 131*b* each preferably have a tapered shape in a cross-sectional view. With such a structure, the common layer 114 and the common electrode 113, which are formed over the insulating layer 132 and the insulating layer 131*b*, can be deposited with excellent coverage, whereby generation of disconnection can be suppressed.

In addition, for the etching of the sacrificial layer 145(2), the condition that can provide high selectivity with respect to the sacrificial layer 145(1)R, the sacrificial layer 145(1)G, and the sacrificial layer 145(1)B (hereinafter, collectively referred to as a sacrificial layer 145(1)) is preferably employed. Note that the sacrificial layer 145(2) is not necessarily removed.

Figure 10C:
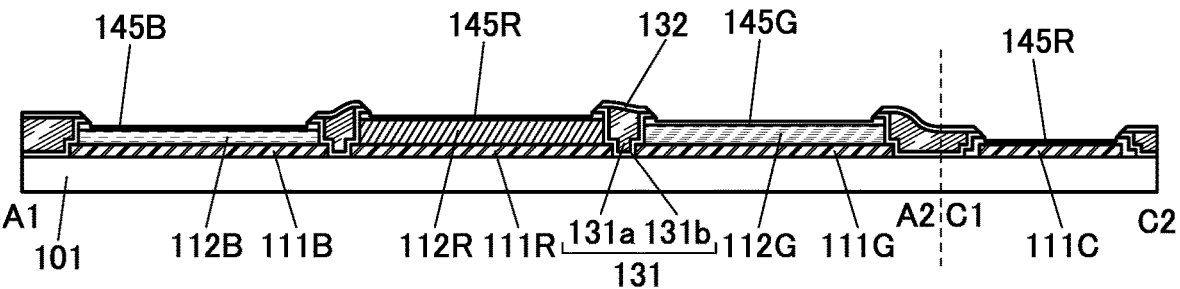

After the above-described etching, the resist mask 148 is removed (FIG. 10C). The removal of the resist mask 148 can be performed in a manner similar to that for the resist mask 143*a* or the like. Here, even in the case where the removal of the resist mask 148 is performed by ashing using oxygen plasma, the removal can be performed without causing damage to the EL layer 112 because the EL layer 112 is covered with the sacrificial layer 145(1), the insulating layer 132, and the insulating layer 131.

[Etching of Sacrificial Layer 145(1)]

Figure 11A:
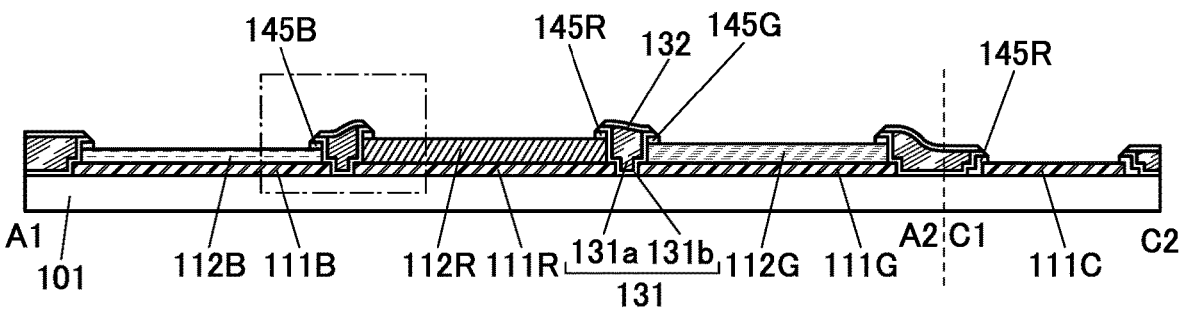
FIG. 11A to FIG. 11C are diagrams illustrating an example of a method for manufacturing a display device.
Figure 11B:
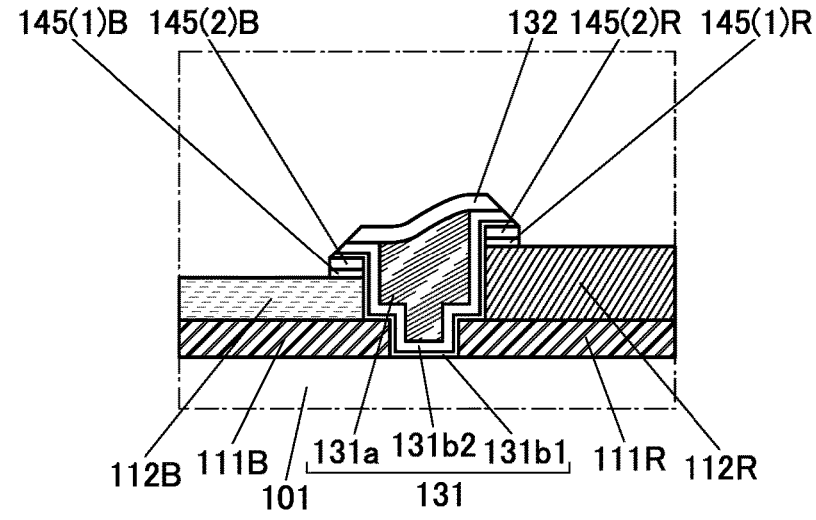

Next, the sacrificial layer 145(1) is etched (FIG. 11A). Note that FIG. 11B is an enlarged view of a region surrounded by a dashed-dotted square in FIG. 11A. At this time, a method that causes damage to the EL layer 112R, the EL layer 112G, and the EL layer 112B as little as possible is preferably employed. For example, by using an inorganic material for the sacrificial layer 145(1), the selectivity with respect to the EL layer 112 can be increased in some cases.

As illustrated in FIG. 11B, the insulating layer 131*b* (the insulating layer 131*b*1 and the insulating layer 131*b*2) is sometimes formed over the first region which is positioned over the EL layer 112B and overlaps with the top surface of the EL layer 112B and the second region which is positioned over the EL layer 112R and overlaps with the top surface of the EL layer 112R. In this case, the sacrificial layer 145B (the sacrificial layer 145(1)B and the sacrificial layer 145

(2)B) is formed between the first region of the insulating layer 131*b* and the EL layer 112B. Moreover, the sacrificial layer 145R (the sacrificial layer 145(1)R and the sacrificial layer 145(2)R) is formed between the second region of the insulating layer 131*b* and the EL layer 112R.

[Formation of Common Layer 114]

Next, the common layer 114 is formed. Note that in the case where the common layer 114 is not provided over the connection electrode 111C, a metal mask that shields the upper portion of the connection electrode 111C may be used in depositing the common layer 114. The metal mask used here does not need to shield a pixel region of the display portion; hence, a fine mask does not need to be used.

[Formation of Common Electrode 113]

Subsequently, the common electrode 113 is formed over the common layer 114. The common electrode 113 can be formed by a sputtering method or a vacuum evaporation method, for example. In the case of a structure not including the common layer 114, the common electrode 113 is formed to cover the EL layer 112R, the EL layer 112G, and the EL layer 112B.

Through the above steps, the light-emitting element 110R, the light-emitting element 110G, and the light-emitting element 110B can be manufactured.

[Formation of Protective Layer 121]

Figure 11C:
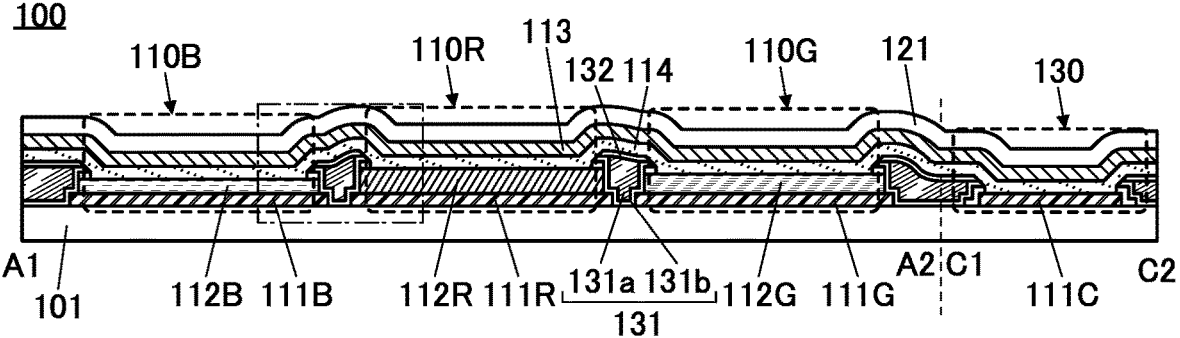

Next, the protective layer 121 is formed over the common electrode 113 (FIG. 11C). An inorganic insulating film used for the protective layer 121 is preferably deposited by a sputtering method, a PECVD method, or an ALD method. In particular, an ALD method is preferable because it provides excellent step coverage and is less likely to cause a defect such as a pinhole. In addition, an organic insulating film is preferably deposited by an inkjet method because a uniform film can be formed in a desired area.

Through the above steps, the display device 100 illustrated in FIG. 1A can be manufactured.

Modification Example

Note that in the above description, the insulating film 131*bf* and the sacrificial layer 145(2) are etched after the formation of the insulating film 132*f*; however, the present invention is not limited thereto. For example, it is possible that the insulating layer 131*a* is formed, the insulating film 131*bf* and the sacrificial layer 145(2) are etched, and then the insulating film 132*f* is deposited. Hereinafter, a manufacturing method in the case of etching the insulating film 131*bf* and the sacrificial layer 145(2) first will be described with reference to FIG. 12A to FIG. 12D.

First, the steps in FIG. 7A to FIG. 9D are performed as described above. Here, when the insulating layer 131*a* is etched back in the step in FIG. 9A, the etch back is preferably performed so that the top surface of the insulating layer 131*a* is lower than that of the insulating layer 131*a* illustrated in FIG. 9A and FIG. 9B. For example, the top surface of the insulating layer 131*a* is preferably lower than the top surface of the adjacent sacrificial layer 145(1).

Figure 12A:
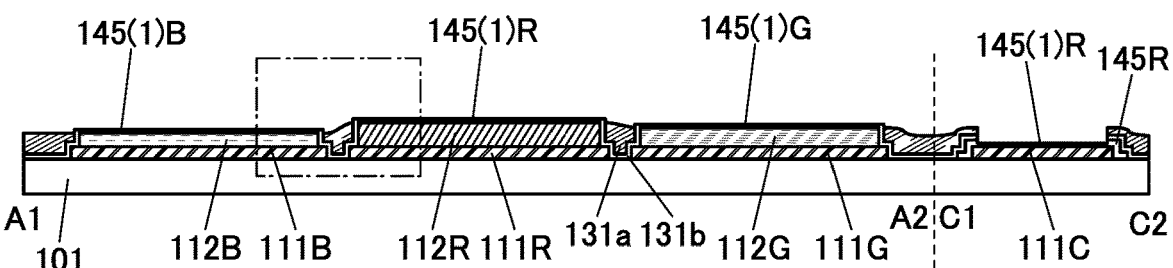
FIG. 12A to FIG. 12D are diagrams illustrating an example of a method for manufacturing a display device.
Figure 12B:
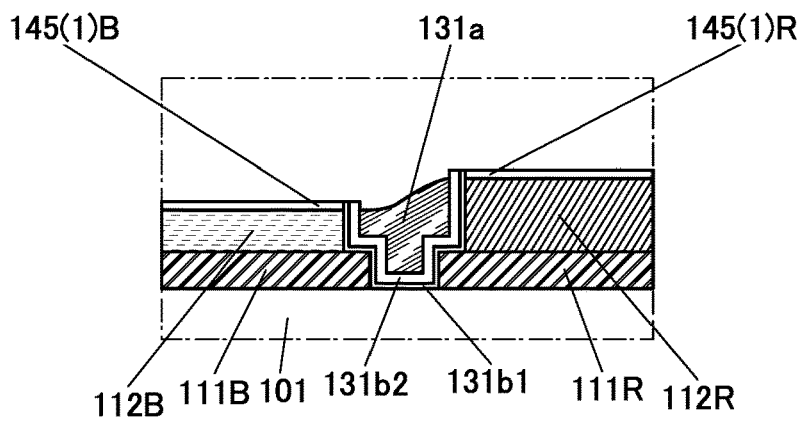

Next, the etch back of the insulating film 131*bf* and the removal of the sacrificial layer 145(2) are performed (FIG. 12A). Note that FIG. 12B is an enlarged view of a region surrounded by a dashed-dotted square in FIG. 12A. The insulating film 131*bf* and the sacrificial layer 145(2) may be etched in a manner similar to the manner for the above-described step in FIG. 10A. Accordingly, part of the insulating film 131*bf* which is above the top surface of the sacrificial layer 145(1) is removed to form the insulating layer 131*b* (the insulating layer 131*b*1 and the insulating layer 131*b*2); and the sacrificial layer 145(2) is also removed.

Here, as illustrated in FIG. 12A and FIG. 12B, it is preferable that the insulating layer 131*b*1 and the insulating layer 131*b*2 do not overlap with the EL layer 112 (the EL layer 112B and the EL layer 112R in FIG. 12B).

Note that as illustrated in the region 130 of FIG. 12A, the sacrificial layer 145R is formed and remains on the side surface of the connection electrode 111C in some cases.

Hereinafter, the steps in FIG. 9C to FIG. 11A may be performed as described above. Note that since the etch back of the insulating film 131*bf* and the removal of the sacrificial layer 145(2) have already been performed in the steps illustrated in FIG. 12A and FIG. 12B, the step in FIG. 10A only has a step for processing the insulating film 132*f* to form the insulating layer 132.

Figure 12C:
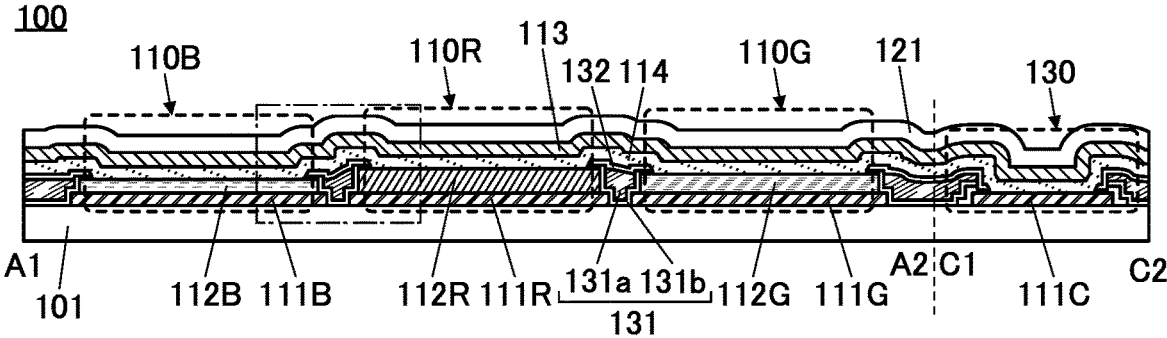

FIG. 12C illustrates the display device 100 manufactured in such a manner. Note that FIG. 12D is an enlarged view of a region surrounded by a dashed-dotted square in FIG. 12C.

Figure 12D:
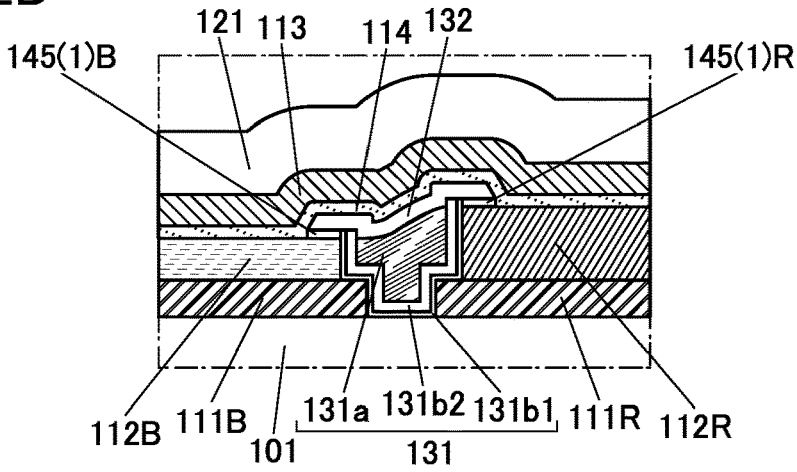

As illustrated in FIG. 12C and FIG. 12D, even in the case where the insulating film 131*bf* and the sacrificial layer 145(2) are etched first, the top surface of the insulating layer 131*b* can be in contact with the insulating layer 132 in a region not overlapping with the insulating layer 131*a*. In this manner, the insulating layer 131*a* can be sealed with the insulating layer 131*b* and the insulating layer 132.

Furthermore, in that structure, only the sacrificial layer 145(1) (the sacrificial layer 145(1)B and the sacrificial layer 145(1)R in FIG. 12B) is formed between the insulating layer 132 and the EL layer 112 (the EL layer 112B and the EL layer 112R in FIG. 12B). Accordingly, the step formed between the insulating layer 132 and the adjacent EL layer can be lowered, leading to reduction in possibility of disconnection of the common layer 114 and the common electrode 113.

At least part of this embodiment can be implemented in combination with the other embodiments described in this specification as appropriate.

Embodiment 2

In this embodiment, structure examples of a display device of one embodiment of the present invention are described.

The display device in this embodiment can be a high-definition display device or a large-sized display device. Accordingly, the display device in this embodiment can be used for display portions of electronic devices such as a digital camera, a digital video camera, a digital photo frame, a mobile phone, a portable game machine, a smartphone, a watch-type terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

Structure Example of Display Device

Figure 13:
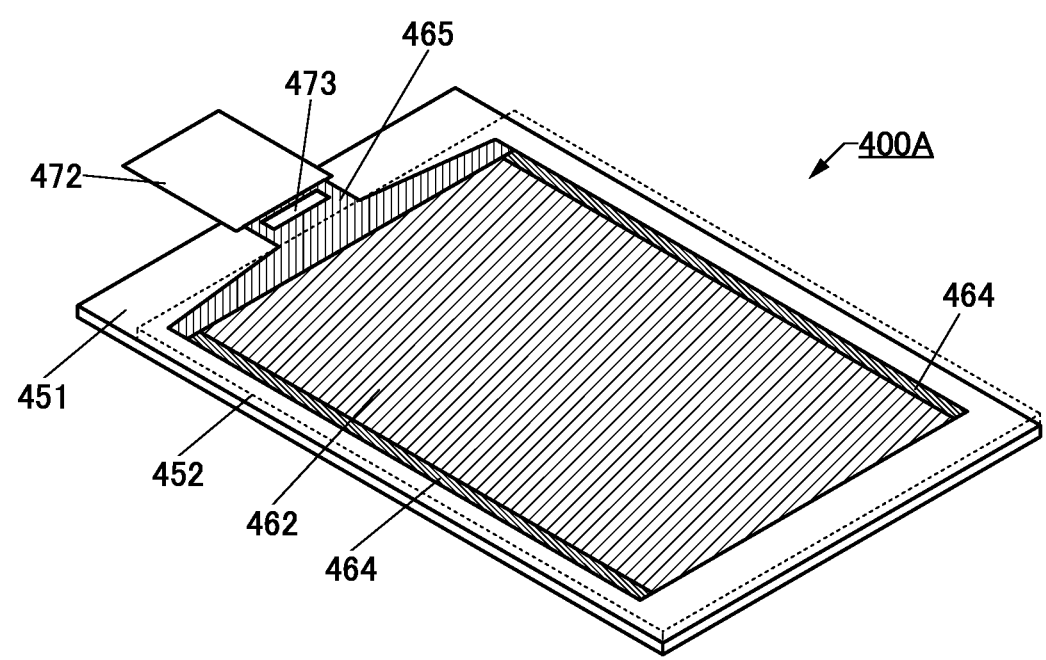
FIG. 13 is a perspective view illustrating an example of a display device.
Figures 14A, 14B, 14C, 14D:
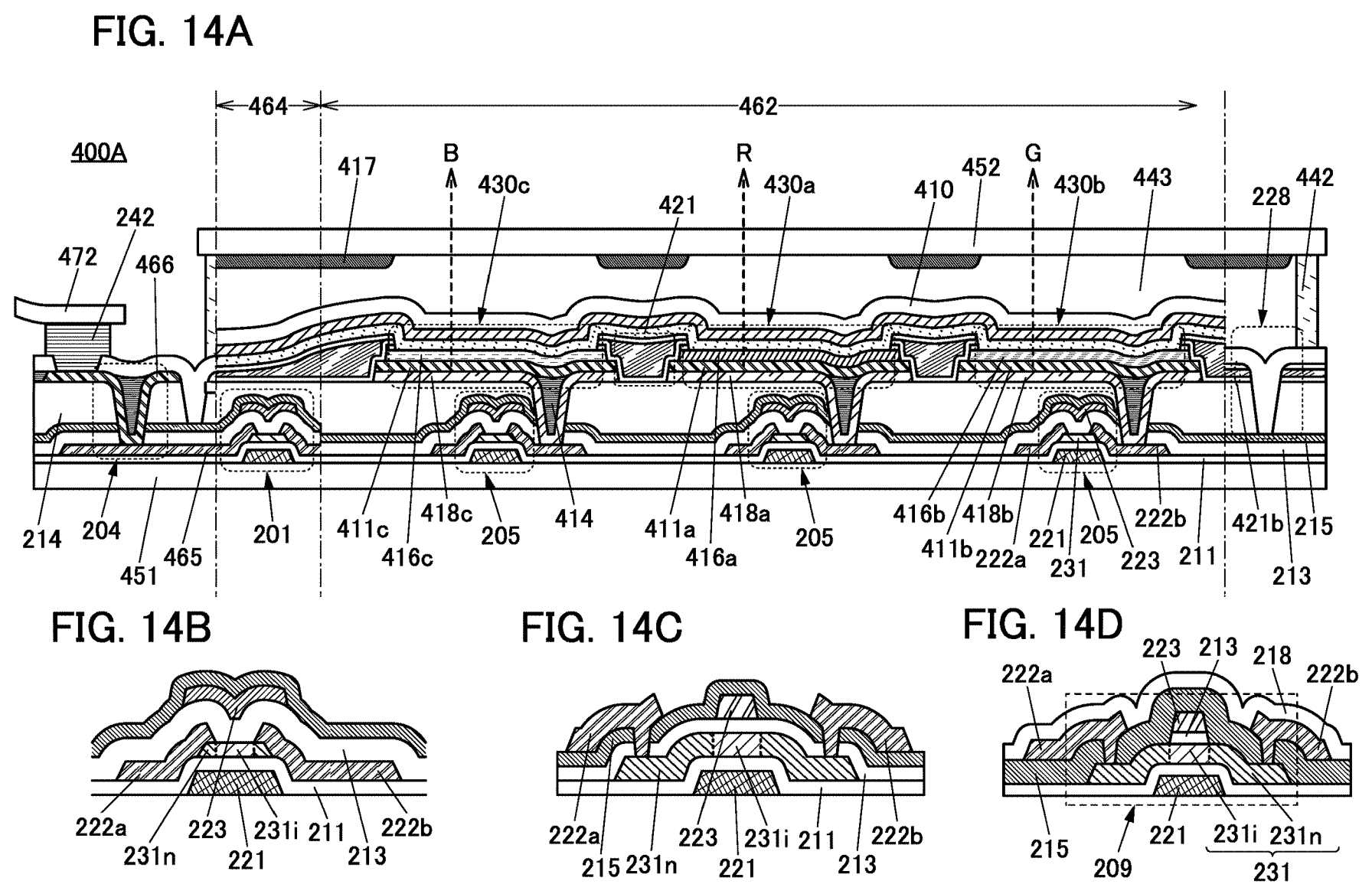

FIG. 13 illustrates a perspective view of a display device 400A, and FIG. 14A illustrates a cross-sectional view of the display device 400A.

The display device 400A has a structure where a substrate 452 and a substrate 451 are bonded to each other. In FIG. 13, the substrate 452 is denoted by a dashed line.

The display device 400A includes a display portion 462, a circuit 464, a wiring 465, and the like. FIG. 13 illustrates an example in which an IC 473 and an FPC 472 are mounted on the display device 400A. Thus, the structure illustrated in FIG. 13 can be regarded as a display module including the display device 400A, the IC (integrated circuit), and the FPC.

As the circuit 464, a scan line driver circuit can be used, for example.

The wiring 465 has a function of supplying a signal and electric power to the display portion 462 and the circuit 464. The signal and electric power are input to the wiring 465 from the outside through the FPC 472 or input to the wiring 465 from the IC 473.

FIG. 13 illustrates an example where the IC 473 is provided over the substrate 451 by a COG (Chip On Glass) method, a COF (Chip On Film) method, or the like. An IC including a scan line driver circuit, a signal line driver circuit, or the like can be used as the IC 473, for example. Note that the display device 400A and the display module are not necessarily provided with an IC. The IC may be mounted on the FPC by a COF method or the like.

FIG. 14A illustrates an example of cross sections of part of a region including the FPC 472, part of the circuit 464, part of the display portion 462, and part of a region including an end portion in the display device 400A.

The display device 400A illustrated in FIG. 14A includes a transistor 201, a transistor 205, a light-emitting element 430a which emits red light, a light-emitting element 430b which emits green light, a light-emitting element 430c which emits blue light, and the like between the substrate 451 and the substrate 452.

The light-emitting element described in Embodiment 1 as an example can be used as the light-emitting element 430a, the light-emitting element 430b, and the light-emitting element 430c.

In the case where a pixel of the display device includes three kinds of subpixels including light-emitting elements emitting different colors from each other, as the three subpixels, subpixels of three colors of R, G, and B, subpixels of three colors of yellow (Y), cyan (C), and magenta (M), and the like can be given. In the case where four subpixels are included, as the four subpixels, subpixels of four colors of R, G, B, and white (W), subpixels of four colors of R, G, B, and Y, and the like can be given.

A protective layer 410 and the substrate 452 are bonded to each other with an adhesive layer 442. A solid sealing structure, a hollow sealing structure, or the like can be employed to seal the light-emitting elements. In FIG. 14A, a hollow sealing structure is employed in which a space 443 surrounded by the substrate 452, the adhesive layer 442, and the substrate 451 is filled with an inert gas (e.g., nitrogen or argon). The adhesive layer 442 may be provided to overlap with the light-emitting element. The space 443 surrounded by the substrate 452, the adhesive layer 442, and the substrate 451 may be filled with a resin different from that of the adhesive layer 442.

In an opening portion provided in an insulating layer 214 so as to expose the top surface of a conductive layer 222b included in the transistor 205, parts of conductive layers 418a, 418b, and 418c are formed along the bottom surface and side surface of the opening portion. The conductive layers 418a, 418b, and 418c are each connected to the conductive layer 222b included in the transistor 205 through the opening provided in the insulating layer 214. The pixel electrodes each contain a material reflecting visible light, and a counter electrode contains a material transmitting visible light. In addition, other parts of the conductive layers 418a, 418b, and 418c are provided over the insulating layer 214.

Pixel electrodes 411a, 411b, and 411c are provided over the conductive layers 418a, 418b, and 418c, respectively. The pixel electrode 111 described in the above embodiment can be used as the pixel electrodes 411a, 411b, and 411c.

As illustrated in FIG. 14A, an insulating layer 414 may be provided between the conductive layers 418a, 418b, and 418c and the pixel electrodes 411a, 411b, and 411c.

In addition, an EL layer 416a included in the light-emitting element 430a, an EL layer 416b included in the light-emitting element 430b, and an EL layer 416c included in the light-emitting element 430c are provided over the pixel electrodes 411a, 411b, and 411c, respectively.

An insulating layer 421 is provided in each of a region that is between the light-emitting element 430a and the light-emitting element 430b and over the insulating layer 214, and a region that is between the light-emitting element 430b and the light-emitting element 430c and over the insulating layer 214. For the insulating layer 421, the insulating layer 131a, the insulating layer 131b, and the insulating layer 132 described in the above embodiment can be referred to.

Light from the light-emitting element is emitted toward the substrate 452 side. For the substrate 452, a material having a high transmitting property with respect to visible light is preferably used.

The transistor 201 and the transistor 205 are formed over the substrate 451. These transistors can be fabricated using the same material in the same step.

An insulating layer 211, an insulating layer 213, an insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This allows the insulating layer to serve as a barrier layer. Such a structure can effectively inhibit diffusion of impurities into the transistors from the outside and increase the reliability of a display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating film is suitable for the insulating layer 214 functioning as a planarization layer. Examples of a material that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

Here, an organic insulating film often has a lower barrier property than an inorganic insulating film. Thus, the organic insulating film preferably has an opening in the vicinity of the end portion of the display device 400A. This can inhibit entry of impurities from the end portion of the display device 400A through the organic insulating film. Alternatively, the organic insulating film may be formed such that its end portion is positioned inside the end portion of the display device 400A, to prevent the organic insulating film from being exposed at the end portion of the display device 400A.

In a region 228 illustrated in FIG. 14A, an opening is formed in a two-layer stacked structure of the insulating layer 214 and an insulating layer 421b over the insulating layer 214. The insulating layer 421b can be formed using the same material as the insulating layer 421. In addition, the insulating layer 421b is formed using the same steps as the insulating layer 421, for example. The protective layer 410 is formed to cover the opening. The use of an inorganic layer as the protective layer 410 can inhibit entry of impurities into the display portion 462 from the outside through the insulating layer 214 even when an organic insulating film is used for the insulating layer 214. Consequently, the reliability of the display device 400A can be increased.

FIG. 14B illustrates an enlarged view of the transistor 201 and the transistor 205. The transistor 201 and the transistor 205 each include a conductive layer 221 functioning as a gate, the insulating layer 211 functioning as a gate insulating layer, a semiconductor layer 231 including a channel formation region 231i and a pair of low-resistance regions 231n, a conductive layer 222a connected to one of the low-resistance regions 231n, the conductive layer 222b connected to the other low-resistance region 231n, the insulating layer 213 functioning as a gate insulating layer, a conductive layer 223 functioning as a gate, and the insulating layer 215 covering the conductive layer 223. One of the conductive layer 222a and the conductive layer 222b functions as a source, and the other functions as a drain. The insulating layer 211 is positioned between the conductive layer 221 and the channel formation region 231i. The insulating layer 213 is positioned between the conductive layer 223 and the channel formation region 231i.

There is no particular limitation on the structures of the transistors included in the display device of this embodiment. For example, a planar transistor, a staggered transistor, or an inverted staggered transistor can be used. Either of a top-gate transistor structure and a bottom-gate transistor structure may be employed. Alternatively, gates may be provided above and below a semiconductor layer where a channel is formed.

The structure where the semiconductor layer where a channel is formed is provided between two gates is used for the transistor 201 and the transistor 205. The two gates may be connected to each other and supplied with the same signal to drive the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and either of an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

A semiconductor layer of a transistor preferably includes a metal oxide (also referred to as an oxide semiconductor). That is, a transistor using a metal oxide in its channel formation region (hereinafter, an OS transistor) is preferably used for the display device of this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used as the semiconductor layer. Alternatively, an oxide containing indium (In), aluminum (Al), and zinc (Zn) (also referred to as IAZO) may be used for the semiconductor layer. Alternatively, an oxide containing indium (In), aluminum (Al), gallium (Ga), and zinc (Zn) (IAGZO) may be used for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 not overlapping with the substrate 452. In the connection portion 204, the wiring 465 is electrically connected to the FPC 472 through a conductive layer 466 and a connection layer 242. For the conductive layer 466, a conductive film obtained by processing the same conductive film as the pixel electrode or a conductive film obtained by processing a stacked-layer film of the same conductive film as the pixel electrode and the same conductive film as the optical adjustment layer can be used. On the top surface of the connection portion 204, the conductive layer 466 is exposed. Thus, the connection portion 204 and the FPC 472 can be electrically connected to each other through the connection layer 242.

A light-blocking layer 417 is preferably provided on the surface of the substrate 452 on the substrate 451 side. A variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided on the outer side of the substrate 452.

Providing the protective layer 410 covering the light-emitting elements inhibits entry of impurities such as water into the light-emitting elements, thereby increasing the reliability of the light-emitting elements.

In the region 228 in the vicinity of the end portion of the display device 400A, the insulating layer 215 and the protective layer 410 are preferably in contact with each other through an opening in the insulating layer 214. In particular, the inorganic insulating film included in the insulating layer 215 and the inorganic insulating film included in the protective layer 410 are preferably in contact with each other. This can inhibit entry of impurities into the display portion 462 from the outside through the organic insulating film. Consequently, the reliability of the display device 400A can be increased.

For each of the substrate 451 and the substrate 452, glass, quartz, ceramics, sapphire, a resin, a metal, an alloy, a semiconductor, or the like can be used. The substrate on the side where light from the light-emitting element is extracted is formed using a material that transmits the light. When the substrate 451 and the substrate 452 are formed using a flexible material, the flexibility of the display device can be increased and a flexible display can be achieved. Furthermore, a polarizing plate may be used as the substrate 451 or the substrate 452.

For each of the substrate 451 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like.

Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

In the case where a film is used for the substrate and the film absorbs water, the shape of the display panel might be changed, e.g., wrinkles are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a photocurable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. Alternatively, a two-liquid-mixture-type resin may be used. An adhesive sheet or the like may be used.

As the connection layer 242, an anisotropic conductive film (ACF), an anisotropic conductive paste (ACP), or the like can be used.

As materials for the gate, the source, and the drain of a transistor and conductive layers such as a variety of wirings and electrodes included in the display device, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Furthermore, a stacked-layer film of the above materials can be used for a conductive layer. For example, a stacked-layer film of indium tin oxide and an alloy of silver and magnesium is preferably used because conductivity can be increased. They can also be used for conductive layers such as a variety of wirings and electrodes included in the display device, and conductive layers (e.g., conductive layers functioning as the pixel electrode or the common electrode) included in the light-emitting element.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

FIG. 14C illustrates an example in which the insulating layer 213 covers the top surface and side surface of a semiconductor layer in the transistor 201 and the transistor 205. The conductive layer 222a and the conductive layer 222b are connected to the corresponding low-resistance regions 231n through openings provided in the insulating layer 213 and the insulating layer 215.

On the other hand, in a transistor 209 illustrated in FIG. 14D, the insulating layer 213 overlaps with the channel formation region 231i of the semiconductor layer 231 and does not overlap with the low-resistance regions 231n. The structure illustrated in FIG. 14D is obtained by processing the insulating layer 213 with the conductive layer 223 as a mask, for example. In FIG. 14D, the insulating layer 215 is provided to cover the insulating layer 213 and the conductive layer 223, and the conductive layer 222a and the conductive layer 222b are connected to the corresponding low-resistance regions 231n through the openings in the insulating layer 215. Furthermore, an insulating layer 218 covering the transistor may be provided.

Transistors containing silicon in their semiconductor layers where channels are formed (hereinafter, also referred to as Si transistor) may be used as all transistors included in the pixel circuit for driving the light-emitting element. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of transistors containing silicon, such as LTPS transistors, a circuit required to be driven at a high frequency (e.g., a source driver circuit) can be formed on the same substrate as the display portion. Thus, external circuits mounted on the display device can be simplified, and costs of parts and mounting costs can be reduced.

It is preferable to use transistors including a metal oxide (hereinafter also referred to as an oxide semiconductor) in their semiconductor layers where channels are formed (such transistors are hereinafter also referred to as OS transistors) as at least one of the transistors included in the pixel circuit. An OS transistor has extremely higher field-effect mobility than amorphous silicon. In addition, the OS transistor has an extremely low leakage current between a source and a drain in an off state (hereinafter, also referred to as off-state current), and charge accumulated in a capacitor that is connected in series to the transistor can be retained for a long period. Furthermore, power consumption of the display device can be reduced with the use of an OS transistor.

The off-state current value per micrometer of channel width of the OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10^{-24}$ A). Note that the off-state current value per micrometer of channel width of a Si transistor at room temperature is higher than or equal to 1 fA ($1 \times 10^{-15}$ A) and lower than or equal to 1 pA ($1 \times 10^{-12}$ A). In other words, the off-state current of an OS transistor is lower than that of a Si transistor by approximately ten orders of magnitude.

When an LTPS transistor is used as some of the transistors included in the pixel circuit and an OS transistor is used as the rest, a display device with low power consumption and high driving capability can be achieved. Note that a structure where an LTPS transistor and an OS transistor are used in combination is referred to as LTPO in some cases. Note that as a more preferable example, it is preferable to use an OS transistor as, for example, a transistor functioning as a switch for controlling electrical continuity between wirings and an LTPS transistor as, for example, a transistor for controlling current.

For example, one of the transistors included in the pixel circuit functions as a transistor for controlling current flowing through the light-emitting element and can be referred to as a driving transistor. One of a source and a drain of the driving transistor is electrically connected to the pixel electrode of the light-emitting element. An LTPS transistor is preferably used as the driving transistor. In this case, the amount of current flowing through the light-emitting element can be increased in the pixel circuit.

Another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display device of one embodiment of the present invention can have all of a high aperture ratio, a high resolution, high display quality, and low power consumption.

Note that the display device of one embodiment of the present invention has a structure including the OS transistor and the light-emitting element having a MML (metal maskless) structure. Here, a light-emitting element having an MML structure refers to a light-emitting element manufactured without using a metal mask or an FMM (fine metal mask or high-resolution metal mask). With the above-described structure, the leakage current that might flow through the transistor and the leakage current that might flow between adjacent light-emitting elements (also referred to as a lateral leakage current, a side leakage current, or the like) can become extremely low. With the structure, a viewer can notice any one or more of the image crispness, the image sharpness, and a high contrast ratio in an image displayed on the display device. With the structure where the leakage current that might flow through the transistor and the lateral leakage current between light-emitting elements are extremely low, display with little leakage of light at the time of black display (such display is also referred to as deep black display) can be achieved.

At least part of any of the structure examples, the drawings corresponding thereto, and the like described in this embodiment can be combined with the other structure examples, the other drawings, and the like as appropriate.

Embodiment 3

In this embodiment, a structure example of a display device different from those described above will be described.

The display device in this embodiment can be a high-resolution display device. Accordingly, the display device in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figures 15A, 15B:
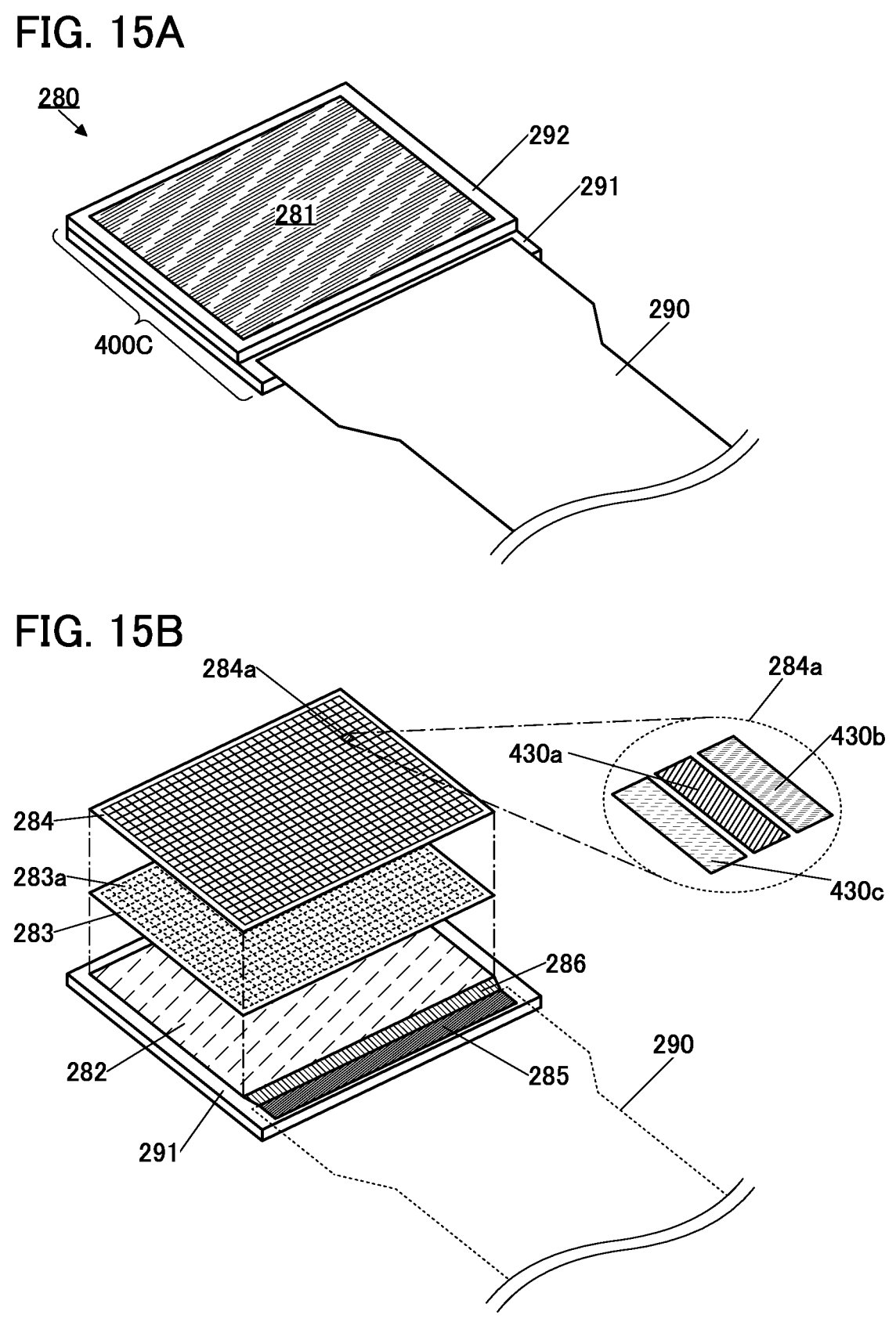

FIG. 15A is a perspective view of a display module 280. The display module 280 includes a display device 400C and an FPC 290. Note that the display device included in the display module 280 is not limited to the display device 400C and may be a display device 400D, a display device 400E, or the display device 400F described later.

The display module 280 includes a substrate 291 and a substrate 292. The display module 280 includes a display portion 281. The display portion 281 is a region of the display module 280 where an image is displayed, and is a region where light from pixels provided in a pixel portion 284 described later can be seen.

FIG. 15B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 which does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side of FIG. 15B. The pixel 284a includes the light-emitting elements 430a, 430b, and 430c that emit light of different colors. The plurality of light-emitting elements are preferably arranged in a stripe arrangement as illustrated in FIG. 15B. With the stripe arrangement that enables high-density arrangement of the light-emitting elements of one embodiment of the present invention over pixel circuits, a high-resolution display device can be provided. Alternatively, any of a variety of arrangement methods such as delta arrangement and PenTile arrangement can be employed.

The pixel circuit portion 283 includes a plurality of pixel circuits 283a arranged periodically.

One pixel circuit 283a is a circuit that controls light emission of three light-emitting elements included in one pixel 284a. One pixel circuit 283a may be provided with three circuits each of which controls light emission of one light-emitting element. For example, the pixel circuit 283a can include at least one selection transistor, one current control transistor (driving transistor), and a capacitor for one light-emitting element. In this case, a gate signal is input to a gate of the selection transistor and a source signal is input to one of a source and a drain thereof. With such a structure, an active-matrix display device is achieved.

The circuit portion 282 includes a circuit for driving the pixel circuits 283a in the pixel circuit portion 283. For example, one or both of a gate line driver circuit and a source line driver circuit are preferably included. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure where one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have an extremely high resolution. For example, the pixels 284a are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has an extremely high resolution, and thus can be suitably used for a VR device such as a head-mounted display or a glasses-type AR device. For example, even with a structure where the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a watch.

[Display Device 400C]

Figure 16:
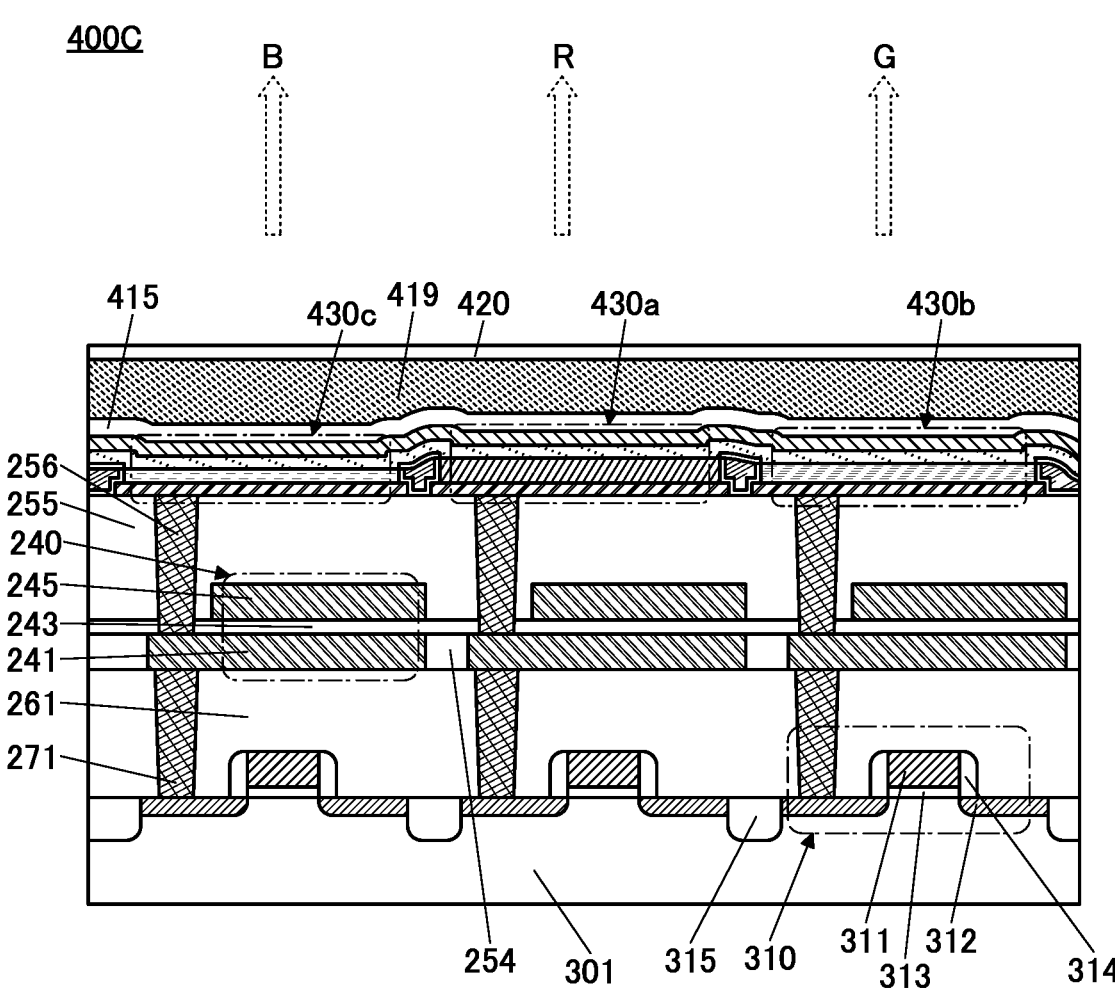
FIG. 16 is a cross-sectional view illustrating an example of a display device.

The display device 400C illustrated in FIG. 16 includes a substrate 301, the light-emitting elements 430a, 430b, and 430c, a capacitor 240, and a transistor 310.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 240, and the light-emitting elements 430a, 430b, and 430c and the like are provided over the insulating layer 255. A protective layer 415 is provided over the light-emitting elements 430a, 430b, and 430c, and a substrate 420 is bonded to the top surface of the protective layer 415 with a resin layer 419. The substrate 420 corresponds to the substrate 292 illustrated in FIG. 15A.

The pixel electrode of the light-emitting element is electrically connected to one of the source and the drain of the transistor 310 through a plug 256 embedded in the insulating layer 255, the conductive layer 241 embedded in the insulating layer 254, and the plug 271 embedded in the insulating layer 261.

[Display Device 400D]

Figure 17:
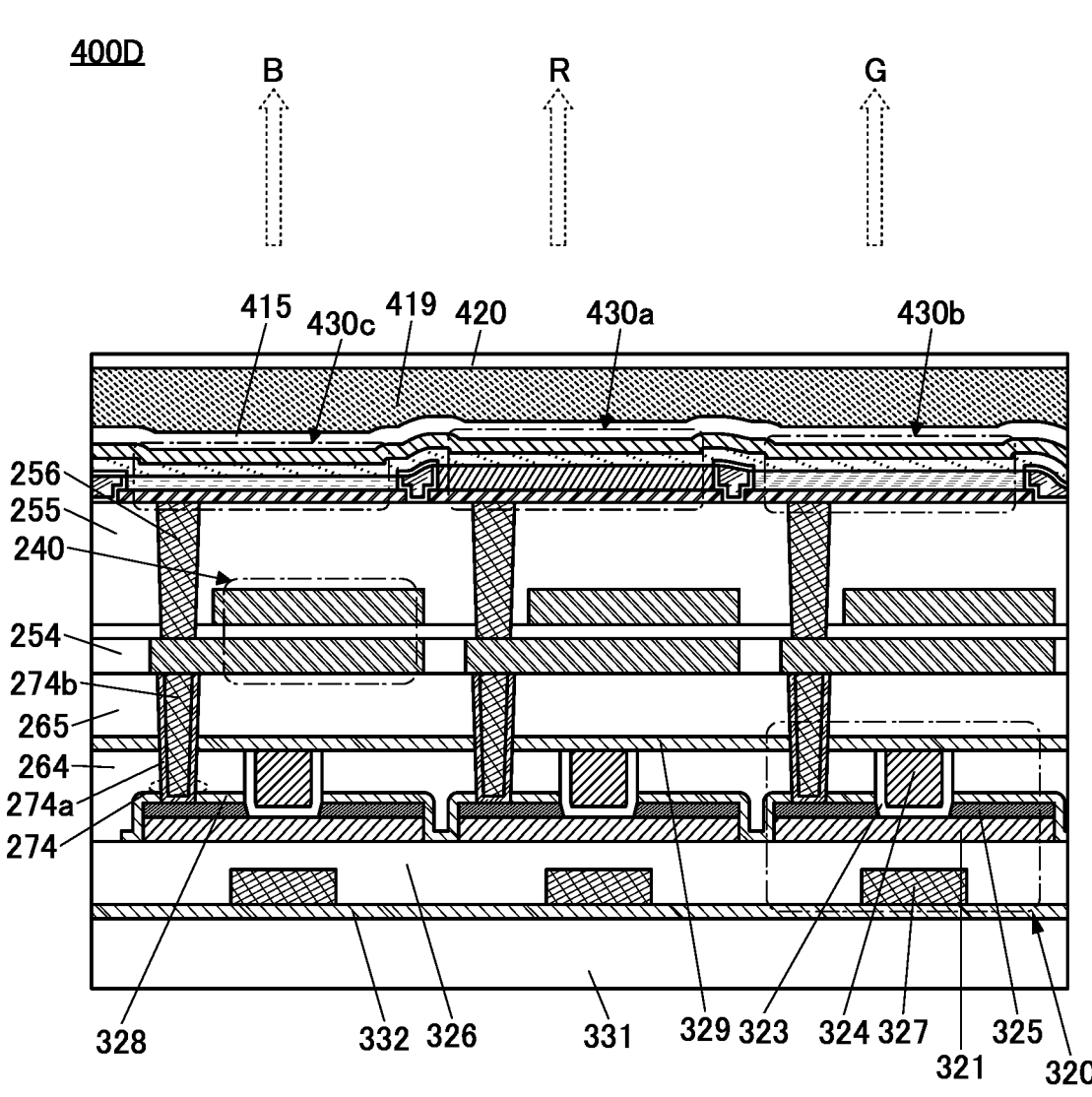
FIG. 17 is a cross-sectional view illustrating an example of a display device.

The display device 400D illustrated in FIG. 17 differs from the display device 400C mainly in a structure of a transistor. Note that portions similar to those of the display device 400C are not described in some cases.

A transistor 320 is a transistor that contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 15A and FIG. 15B. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. A material that can be suitably used for the semiconductor layer 321 will be described in detail later.

The pair of conductive layers 325 are provided over and in contact with the semiconductor layer 321 and function as a source electrode and a drain electrode.

An insulating layer 328 is provided to cover the top surfaces and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided so as to be embedded in the insulating layer 265, the insulating layer 329, and the insulating layer 264. Here, the plug 274 preferably includes a conductive layer 274a that covers the side surface of an opening in the insulating layer 265, the insulating layer 329, the insulating layer 264, and the insulating layer 328 and part of the top surface of the conductive layer 325, and a conductive layer 274b in contact with the top surface of the conductive layer 274a. In this case, a conductive material through which hydrogen and oxygen are less likely to diffuse is preferably used for the conductive layer 274a.

The structures of the insulating layer 254 and the components thereover up to the substrate 420 in the display device 400D are similar to those in the display device 400C.

[Display Device 400E]

Figure 18:
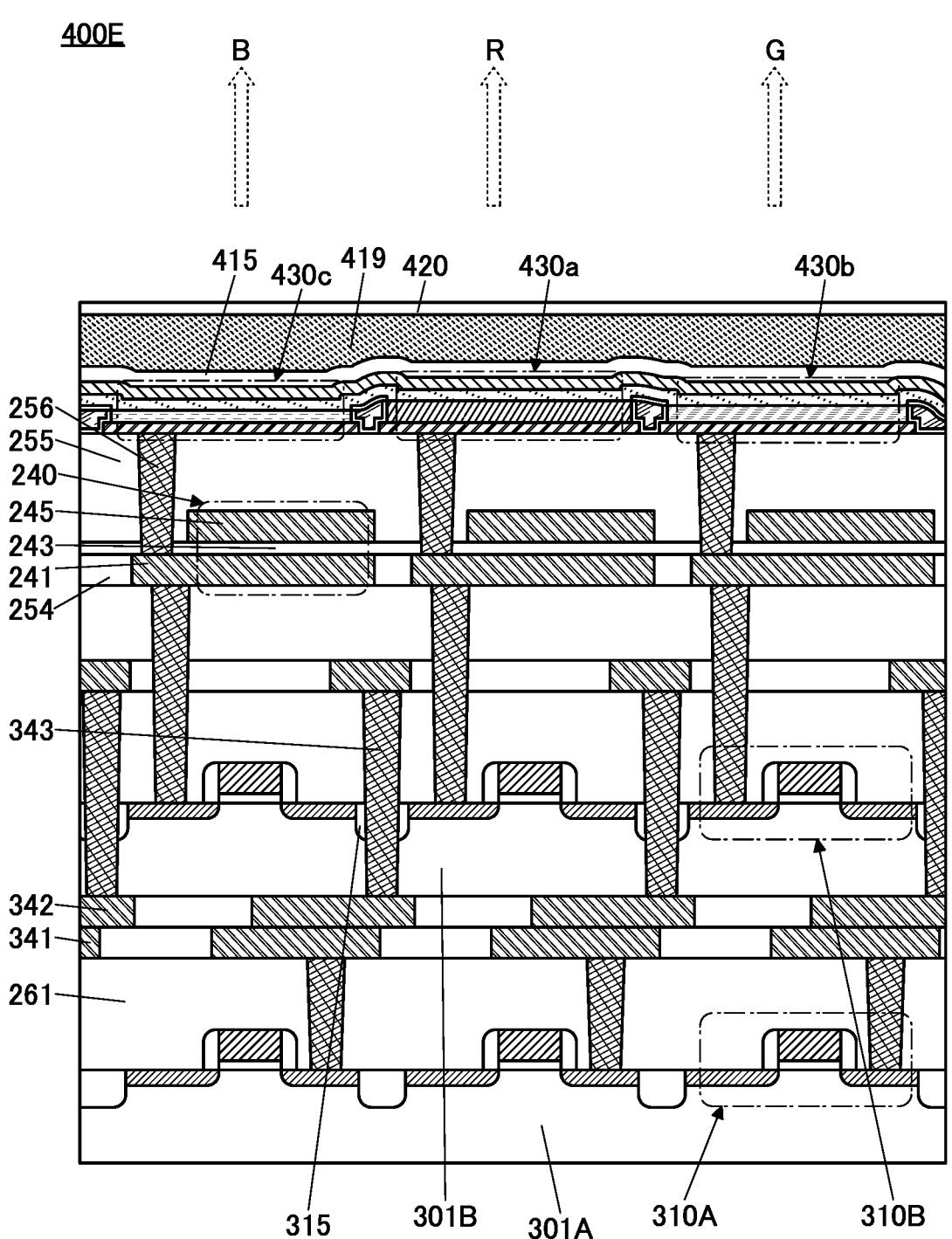
FIG. 18 is a cross-sectional view illustrating an example of a display device.

The display device 400E illustrated in FIG. 18 has a structure in which a transistor 310A and a transistor 310B each having a channel formed in a semiconductor substrate are stacked.

In the display device 400E, a substrate 301B provided with the transistor 310B, the capacitor 240, and the light-emitting devices is attached to a substrate 301A provided with the transistor 310A.

The substrate 301B is provided with a plug 343 that penetrates the substrate 301B. The plug 343 is electrically connected to a conductive layer 342 provided on the rear surface (the surface that is opposite to the substrate 420 side) of the substrate 301. Meanwhile, over the substrate 301A, a conductive layer 341 is provided over the insulating layer 261.

The conductive layer 341 and the conductive layer 342 are bonded to each other, whereby the substrate 301A and the substrate 301B are electrically connected to each other.

The conductive layer 341 and the conductive layer 342 are preferably formed using the same conductive material. For example, a metal film containing an element selected from Al, Cr, Cu, Ta, Ti, Mo, and W, a metal nitride film containing the above element as a component (a titanium nitride film, a molybdenum nitride film, or a tungsten nitride film), or the like can be used. Copper is particularly preferably used for the conductive layer 341 and the conductive layer 342. In that case, it is possible to employ Cu-to-Cu (copper-to-copper) direct bonding technique (a technique for achieving electrical continuity by connecting Cu (copper pads). Note that the conductive layer 341 and the conductive layer 342 may be bonded to each other with a bump therebetween.

[Display Device 400F]

Figure 19:
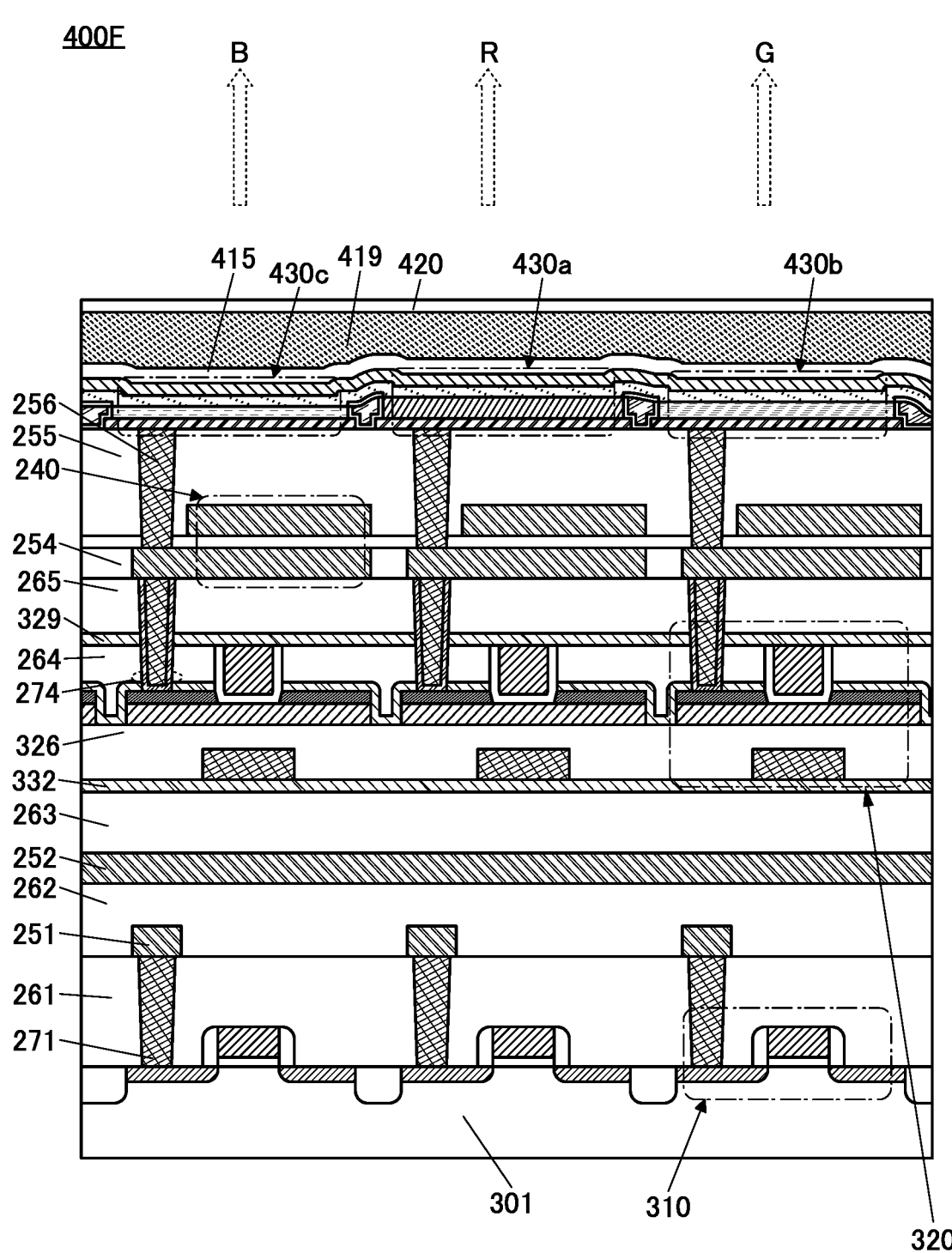
FIG. 19 is a cross-sectional view illustrating an example of a display device.

The display device 400F illustrated in FIG. 19 has a structure in which the transistor 310 whose channel is formed in the substrate 301 and the transistor 320 including a metal oxide in the semiconductor layer where the channel is formed are stacked. Note that portions similar to those in the display devices 400C and 400D are not described in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting elements; thus, the display device can be downsized as compared with the case where a driver circuit is provided around a display region.

At least part of any of the structure examples, the drawings corresponding thereto, and the like described in this embodiment can be combined with the other structure examples, the other drawings, and the like as appropriate.

Embodiment 4

In this embodiment, a light-emitting element (also referred to as a light-emitting device) that can be used in the display device of one embodiment of the present invention will be described.

Structure Example of Light-Emitting Device

Figure 20A:
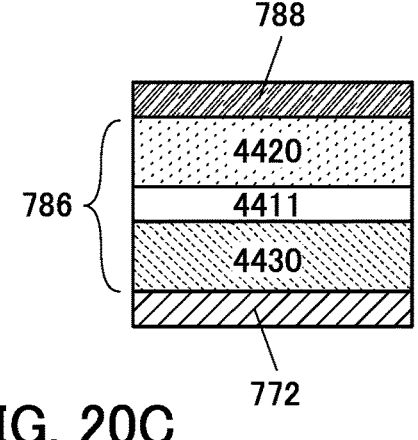
FIG. 20A to FIG. 20F are diagrams each illustrating a structure example of a light-emitting element.

As illustrated in FIG. 20A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can serve as a single light-emitting unit, and the structure in FIG. 20A is referred to as a single structure in this specification.

Figure 20B:
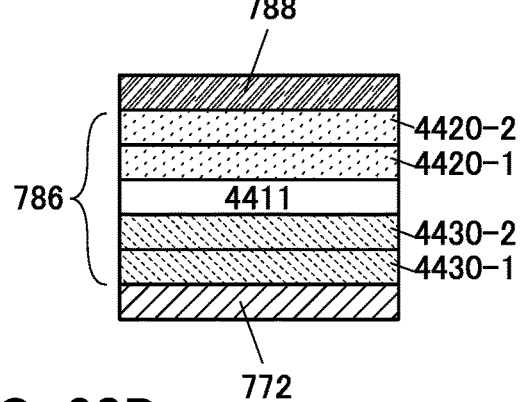

FIG. 20B is a variation example of the EL layer 786 included in the light-emitting device illustrated in FIG. 20A. Specifically, the light-emitting device illustrated in FIG. 20B includes a layer 4430-1 over the lower electrode 772, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 788 over the layer 4420-2. For example, when the lower electrode 772 functions as an anode and the upper electrode 788 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 772 functions as a cathode and the upper electrode 788 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be enhanced.

Figure 20C:
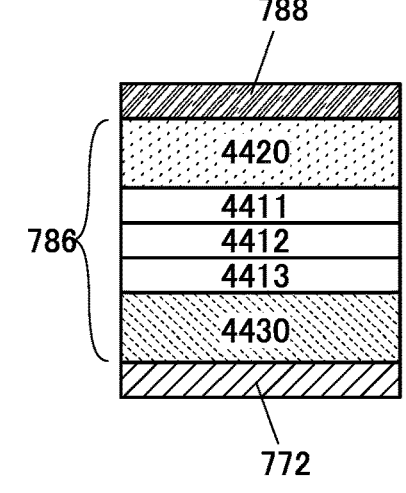
Figure 20D:
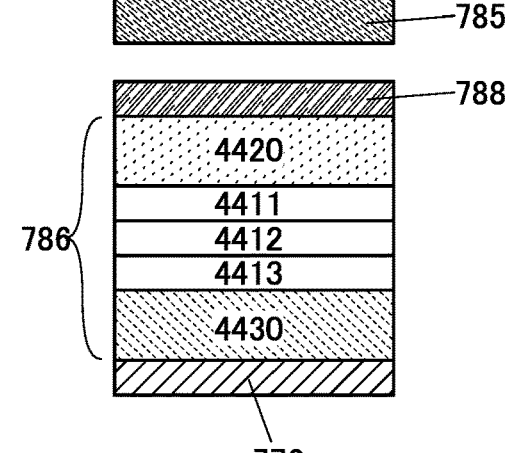

Note that the structure where a plurality of light-emitting layers (light-emitting layers 4411, 4412, and 4413) are provided between the layer 4420 and the layer 4430 as illustrated in FIG. 20C and FIG. 20D is a variation of the single structure.

Figure 20E:
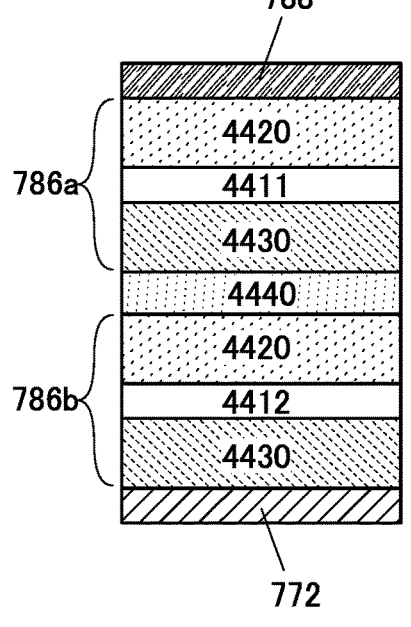
Figure 20F:
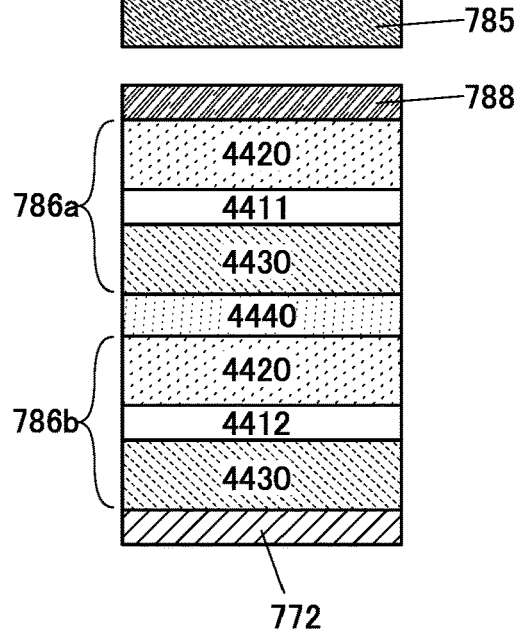

The structure where a plurality of light-emitting units (an EL layer 786a and an EL layer 786b) is connected in series with an intermediate layer (charge generation layer) 4440 therebetween as illustrated in FIG. 20E and FIG. 20F is referred to as a tandem structure in this specification. In this specification and the like, the structure illustrated in FIG. 20E and FIG. 20F is referred to as a tandem structure; however, without being limited to this, a tandem structure may be referred to as a stack structure, for example. Note that the tandem structure enables a light-emitting device to emit light at high luminance.

In FIG. 20C, light-emitting materials that emit the same light may be used for the light-emitting layer 4411, the light-emitting layer 4412, and the light-emitting layer 4413. Alternatively, different light-emitting materials may be used for the light-emitting layer 4411, the light-emitting layer 4412, and the light-emitting layer 4413. White light emission can be obtained when the light-emitting layer 4411, the light-emitting layer 4412, and the light-emitting layer 4413 emit light of complementary colors. FIG. 20D illustrates an example where a coloring layer 785 functioning as a color filter is provided. When white light passes through a color filter, light of a desired color can be obtained.

In FIG. 20E, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light emission can be obtained when the light-emitting layer 4411 and the light-emitting layer 4412 emit light of complementary colors. FIG. 20F illustrates an example where the coloring layer 785 is further provided.

Note that also in FIG. 20C, FIG. 20D, FIG. 20E, and FIG. 20F, the layer 4420 and the layer 4430 may each have a stacked-layer structure of two or more layers as illustrated in FIG. 20B.

A structure where EI layers corresponding to emission colors (here, blue (B), green (G), and red (R)) of light-emitting devices are separately formed can be referred to as an SBS (Side By Side) structure.

The emission color of the light-emitting device can be red, green, blue, cyan, magenta, yellow, white, or the like depending on the material that constitutes the EL layer 786. Furthermore, the color purity can be further increased when the light-emitting device has a microcavity structure.

The light-emitting device that emits white light preferably contains two or more kinds of light-emitting substances in the light-emitting layer. In the case of obtaining white light emission with the use of two light-emitting substances, the two light-emitting substances may be selected such that their emission colors are complementary colors. For example, when the emission color of a first light-emitting layer and the emission color of a second light-emitting layer are complementary colors, the light-emitting device can be configured to emit white light as a whole. In the case of a light-emitting device including three or more light-emitting substances, the light-emitting device is configured to emit white light as a whole by combining emission colors of the three or more light-emitting substances.

The light-emitting layer preferably contains two or more light-emitting substances that emit light of R (red), G (green), B (blue), Y (yellow), 0 (orange), and the like. Alternatively, the light-emitting layer preferably contains two or more light-emitting substances that emit light containing two or more of color spectral components of R, G, and B.

A specific structure example of the light-emitting device will be described here.

The light-emitting devices include at least the light-emitting layer. The light-emitting device may further include, as a layer other than the light-emitting layer, a layer including a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer.

The hole-injection layer is a layer injecting holes from an anode to the hole-transport layer and containing a material with a high hole-injection property. Examples of a material with a high hole-injection property include an aromatic amine compound and a composite material containing a hole-transport material and an acceptor material (electron-accepting material).

The hole-transport layer is a layer transporting holes, which are injected from the anode by the hole-injection layer, to the light-emitting layer. The hole-transport layer is a layer containing a hole-transport material. As the hole-transport material, a substance having a hole mobility higher than or equal to $1 \times 10^{-6}$ cm$^2$/Vs is preferable. Note that other substances can also be used as long as they have a property of transporting more holes than electrons. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer transporting electrons, which are injected from a cathode by the electron-injection layer, to the light-emitting layer. The electron-transport layer is a layer containing an electron-transport material. As the electron-transport material, a substance having an electron mobility higher than or equal to $1 \times 10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer and containing a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used.

For the electron-injection layer, for example, an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiO$_x$), or cesium carbonate can be used.

Alternatively, as the above-described electron-injection layer, an electron-transport material may be used. For example, a compound having an unshared electron pair and an electron deficient heteroaromatic ring can be used as the electron-transport material. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of the organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-dis(naphthalen-2-yl)-4,7-diphenyl-1,10-phenanthroline (abbreviation: NBPhen), diquinoxalino [2,3-a:2',3'-c]phenazine (abbreviation: HATNA), 2,4,6-tris [3'-(pyridin-3-yl)biphenyl-3-yl]-1,3,5-triazine (abbreviation: TmPPPyTz), or the like can be used for the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of a light-emitting device can be achieved at the same time.

This embodiment can be combined with the other embodiments as appropriate.

Embodiment 5

In this embodiment, a metal oxide (also referred to as an oxide semiconductor) that can be used in the OS transistor described in the above embodiment will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a CVD method such as an MOCVD method, an ALD method, or the like.

<Classification of Crystal Structures>

Amorphous (including completely amorphous), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

A crystal structure of a film or a substrate can be evaluated with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the one described above when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions described above is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Thus, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction described above, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has a small amount of impurities and defects (e.g., oxygen vacancies). Hence, an oxide semiconductor including the CAAC-OS is physically stable. Accordingly, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using 0120 scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of the oxygen gas to the total flow rate of the deposition gas at the time of deposition is preferably as low as possible; for example, the ratio of the flow rate of the oxygen gas to the total flow rate of the deposition gas at the time of deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, leakage current can be inhibited.

Thus, in the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

A transistor using a CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is obtained by SIMS, is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 6

In this embodiment, electronic devices of one embodiment of the present invention will be described with reference to FIG. 21 to FIG. 24.

An electronic device in this embodiment includes the display device of one embodiment of the present invention. Resolution, definition, and sizes of the display device of one embodiment of the present invention are easily increased. Thus, the display device of one embodiment of the present invention can be used for display portions of a variety of electronic devices.

The display device of one embodiment of the present invention can be manufactured at low cost, which leads to a reduction in manufacturing cost of an electronic device.

Examples of electronic devices include electronic devices with a relatively large screen, such as a television device, a desktop or laptop personal computer, a monitor of a computer or the like, digital signage, and a large game machine such as a pachinko machine; a digital camera; a digital video camera; a digital photo frame; a mobile phone; a portable game machine; a portable information terminal; and an audio reproducing device.

In particular, the display device of one embodiment of the present invention can have a high resolution, and thus can be suitably used for an electronic device having a relatively small display portion. As such an electronic device, a watch-type or bracelet-type information terminal (wearable device); and a wearable device worn on a head, such as a device for VR such as a head-mounted display and a glasses-type device for AR can be given, for example. Examples of wearable devices include an SR (Substitutional Reality) device and an MR (Mixed Reality) device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840× 2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a display device with high definition and high resolution, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, a video, information, and the like can be displayed on a display portion. When the electronic device includes an antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 21A:
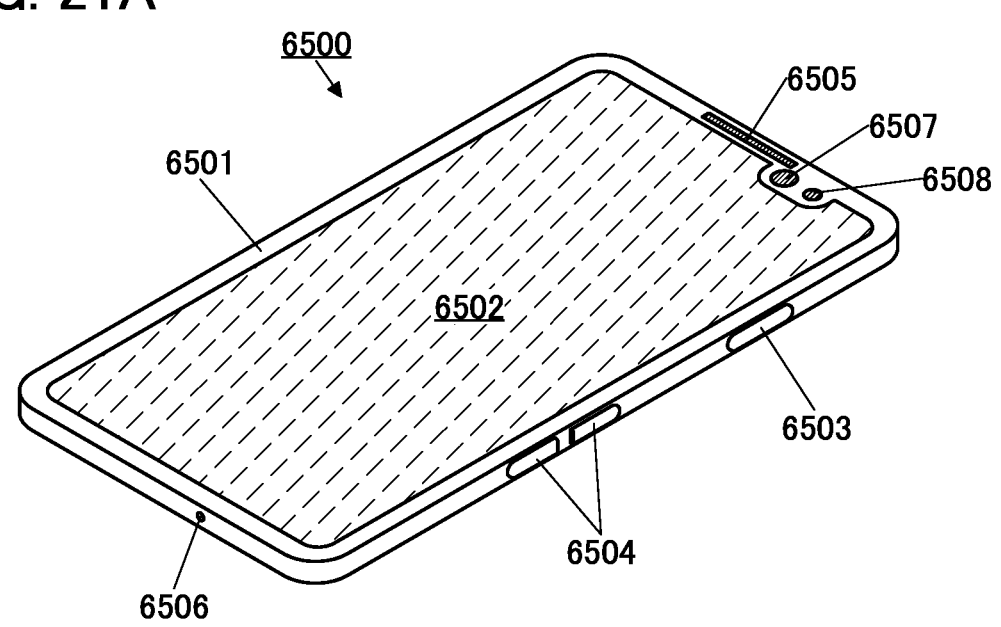
FIG. 21A and FIG. 21B are diagrams illustrating an example of an electronic device.

An electronic device 6500 illustrated in FIG. 21A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 21B:
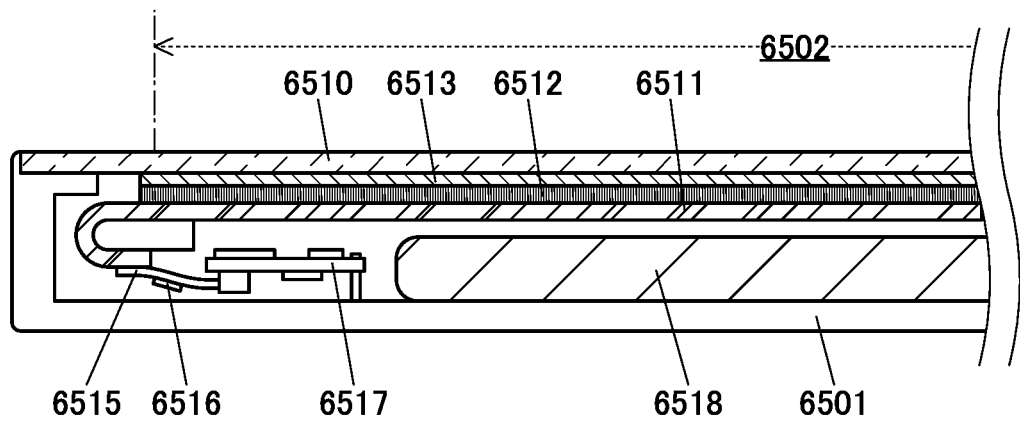

FIG. 21B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display (a display device having flexibility) of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is controlled. Moreover, part of the display panel 6511 is folded back so that a connection portion with the FPC 6515 is provided on the back side of a pixel portion, whereby an electronic device with a narrow bezel can be achieved.

FIG. 22A illustrates an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 22A can be performed with an operation switch provided in the housing 7101 and a separate remote control 7111. Alternatively, the display portion 7000 may include a touch sensor, and the television device 7100 may be operated by touch on the display portion 7000 with a finger or the like. The remote control 7111 may be provided with a display portion for displaying information output from the remote control 7111. With operation keys or a touch panel provided in the remote control 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 22B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

FIG. 22C and FIG. 22D illustrate examples of digital signage.

Digital signage 7300 illustrated in FIG. 22C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 22D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 22C and FIG. 22D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 22C and FIG. 22D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

FIG. 23A is a diagram illustrating the appearance of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power button or the like.

The display device of one embodiment of the present invention can be used in the display portion 8002 of the camera 8000 and the display portion 8102 of the finder 8100. Note that a finder may be incorporated in the camera 8000.

FIG. 23B is a diagram illustrating the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive video information and display it on the display portion 8204. The main body 8203 includes a camera, and information on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with the use of current flowing through the electrodes. The mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, and the like.

The display device of one embodiment of the present invention can be used in the display portion 8204.

FIG. 23C to FIG. 23E are diagrams illustrating the appearance of a head-mounted display 8300. The head-mounted display 8300 includes a housing 8301, a display portion 8302, a band-like fixing member 8304, and a pair of lenses 8305.

A user can see display on the display portion 8302 through the lenses 8305. The display portion 8302 is preferably curved so that the user can feel high realistic sensation. Another image displayed on another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

The display device of one embodiment of the present invention can be used for the display portion 8302. The display device of one embodiment of the present invention achieves an extremely high resolution. For example, a pixel is not easily perceived by the user even when the user perceives display that is magnified by the use of the lenses 8305 as illustrated in FIG. 23E. In other words, a video with a strong sense of reality can be seen by the user with the use of the display portion 8302.

FIG. 23F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism, and the focus adjustment mechanism can adjust the position of the lens 8405 according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy videos and sounds only by wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable in order to easily perform cleaning or replacement.

Electronic devices illustrated in FIG. 24A to FIG. 24F each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 24A to FIG. 24F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The display device of one embodiment of the present invention can be used for the display portion 9001.

The electronic devices illustrated in FIG. 24A to FIG. 24F will be described in detail below.

Figure 24A:
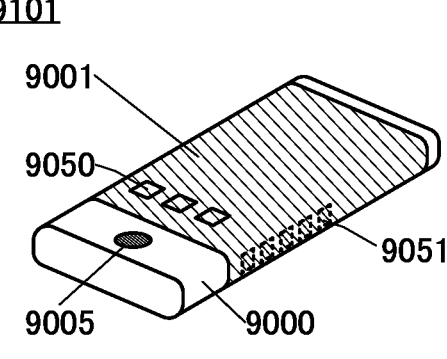
FIG. 24A to FIG. 24F are diagrams illustrating examples of electronic devices.

FIG. 24A is a perspective view illustrating a portable information terminal 9101. The portable information terminal 9101 can be used as a smartphone, for example. Note that the portable information terminal 9101 may include the speaker 9003, the connection terminal 9006, the sensor 9007, or the like. The portable information terminal 9101 can display characters and image information on its plurality of surfaces. FIG. 24A illustrates an example where three icons 9050 are displayed. Furthermore, information 9051 indicated by dashed rectangles can be displayed on another surface of the display portion 9001. Examples of the information 9051 include notification of reception of an e-mail, an SNS, an incoming call, or the like, the title and sender of an e-mail, an SNS, or the like, the date, the time, remaining battery, and the reception strength of an antenna. Alternatively, the icon 9050 or the like may be displayed at the position where the information 9051 is displayed.

Figure 24C:
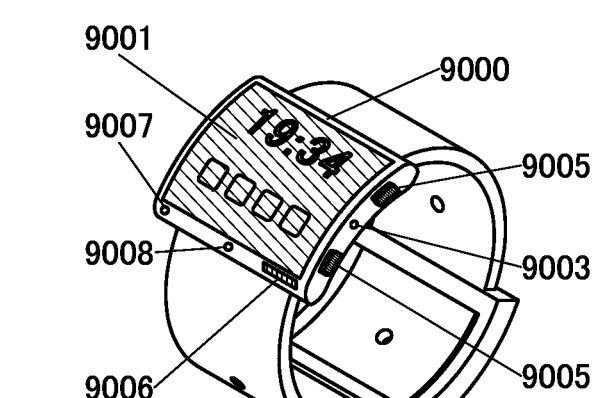
Figure 24B:
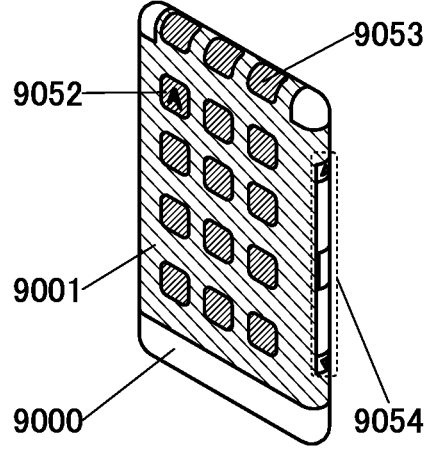

FIG. 24B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 24C is a perspective view illustrating a watch-type portable information terminal 9200. For example, the portable information terminal 9200 can be used as a Smartwatch (registered trademark). The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 24D:
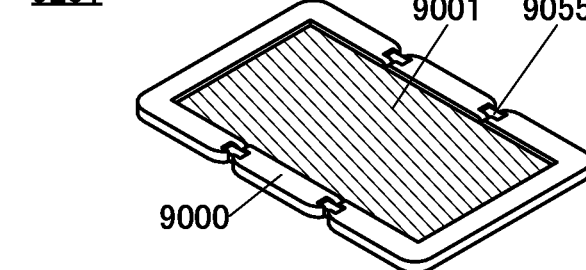
Figure 24E:
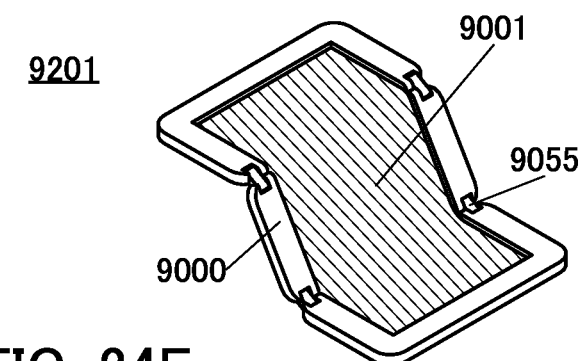
Figure 24F:
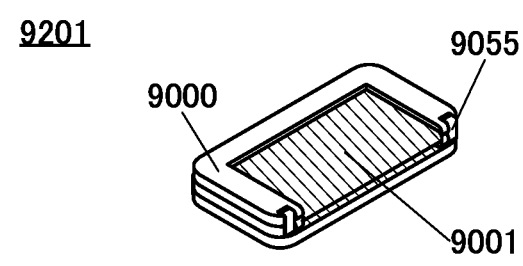

FIG. 24D to FIG. 24F are perspective views illustrating a foldable portable information terminal 9201. FIG. 24D is a perspective view of an opened state of the portable information terminal 9201, FIG. 24F is a perspective view of a folded state thereof, and FIG. 24E is a perspective view of a state in the middle of change from one of FIG. 24D and FIG. 24F to the other. The portable information terminal

9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

At least part of any of the structure examples, the drawings corresponding thereto, and the like described in this embodiment can be combined with the other structure examples, the other drawings, and the like as appropriate.

REFERENCE NUMERALS

100: display device, 101: substrate, 103: pixel, 103*a*: subpixel, 103*b*: subpixel, 103*c*: subpixel, 110: light-emitting element, 110B: light-emitting element, 110G: light-emitting element, 110R: light-emitting element, 111: pixel electrode, 111B: pixel electrode, 111C: connection electrode, 111G: pixel electrode, 111R: pixel electrode, 112: EL layer, 112B: EL layer, 112Bf: EL film, 112G: EL layer, 112Gf: EL film, 112R: EL layer, 112Rf: EL film, 113: common electrode, 114: common layer, 121: protective layer, 124*a*: pixel, 124*b*: pixel, 130: region, 131: insulating layer, 131*a*: insulating layer, 131*af*: insulating film, 131*ap*: insulating layer, 131*b*: insulating layer, 131*b*1: insulating layer, 131*b*1*f*: insulating film, 131*b*2: insulating layer, 131*b*2*f*: insulating film, 131*bf*: insulating film, 132: insulating layer, 132*f*: insulating film, 143*a*: resist mask, 143*b*: resist mask, 143*c*: resist mask, 144: sacrificial film, 144B: sacrificial film, 144G: sacrificial film, 144R: sacrificial film, 145: sacrificial layer, 145B: sacrificial layer, 145G: sacrificial layer, 145R: sacrificial layer, 148: resist mask, 201: transistor, 204: connection portion, 205: transistor, 209: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 228: region, 231: semiconductor layer, 231*i*: channel formation region, 231*n*: low-resistance region, 240: capacitor, 241: conductive layer, 242: connection layer, 243: insulating layer, 245: conductive layer, 251: conductive layer, 252: conductive layer, 254: insulating layer, 255: insulating layer, 256: plug, 261: insulating layer, 262: insulating layer, 263: insulating layer, 264: insulating layer, 265: insulating layer, 271: plug, 274: plug, 274*a*: conductive layer, 274*b*: conductive layer, 280: display module, 281: display portion, 282: circuit portion, 283: pixel circuit portion, 283*a*: pixel circuit, 284: pixel portion, 284*a*: pixel, 285: terminal portion, 286: wiring portion, 290: FPC, 291: substrate, 292: substrate, 301: substrate, 301A: substrate, 301B: substrate, 310: transistor, 310A: transistor, 310B: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 341: conductive layer, 342: conductive layer, 343: plug, 400A: display device, 400C: display device, 400D: display device, 400E: display device, 400F: display device, 410: protective layer, 411*a*: pixel electrode, 411*b*: pixel electrode, 411*c*: pixel electrode, 414: insulating layer, 415: protective layer, 416*a*: EL layer, 416*b*: EL layer, 416*c*: EL layer, 417: light-blocking layer, 418*a*: conductive layer, 418*b*: conductive layer, 418*c*: conductive layer, 419: resin layer, 420: substrate, 421: insulating layer, 421*b*: insulating layer, 430*a*: light-emitting element, 430*b*: light-emitting element, 430*c*: light-emitting element, 442: adhesive layer, 443: space, 451: substrate, 452: substrate, 462: display portion, 464: circuit, 465: wiring, 466: conductive layer, 472: FPC, 473: IC, 772: lower electrode, 785: coloring layer, 786: EL layer, 786*a*: EL layer, 786*b*: EL layer, 788: upper electrode, 4411: light-emitting layer, 4412: light-emitting layer, 4413: light-emitting layer, 4420: layer, 4420-1: layer, 4420-2: layer, 4430: layer, 4430-1: layer, 4430-2: layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote control, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:
a first pixel, a second pixel adjacent to the first pixel, a first insulating layer, a second insulating layer over the first insulating layer, and a third insulating layer over the second insulating layer,
wherein the first pixel comprises a first pixel electrode, a first EL layer over the first pixel electrode, and a common electrode over the first EL layer,
wherein the second pixel comprises a second pixel electrode, a second EL layer over the second pixel electrode, and the common electrode over the second EL layer,
wherein the first insulating layer and the third insulating layer each contain an inorganic material,

wherein the second insulating layer contains an organic material,
wherein the second insulating layer overlaps a side surface of the first EL layer and a side surface of the second EL layer with the first insulating layer therebetween,
wherein the second insulating layer overlaps the common electrode with the third insulating layer therebetween, and
wherein the third insulating layer is in contact with the first insulating layer in a region not overlapping with the second insulating layer.

2. The display device according to claim 1, wherein the first insulating layer covers a side surface of the first pixel electrode, the side surface of the first EL layer, a side surface of the second pixel electrode, and the side surface of the second EL layer.

3. The display device according to claim 1, wherein a bottom surface of the third insulating layer is in contact with a top surface of the second insulating layer.

4. The display device according to claim 1, wherein the third insulating layer contains silicon nitride.

5. The display device according to claim 1,
wherein the first insulating layer comprises a fourth insulating layer and a fifth insulating layer over the fourth insulating layer,
wherein the fourth insulating layer contains aluminum oxide, and
wherein the fifth insulating layer contains silicon nitride.

6. The display device according to claim 1,
wherein a first region of the first insulating layer is positioned over the first EL layer and overlaps a top surface of the first EL layer,
wherein a second region of the first insulating layer is positioned over the second EL layer and overlaps a top surface of the second EL layer,
wherein the display device further comprises a first layer containing an inorganic material between the first region and the first EL layer, and
wherein the display device further comprises a second layer containing an inorganic material between the second region and the second EL layer.

7. The display device according to claim 1, wherein each of the top surface of the first EL layer, the top surface of the second EL layer, and a top surface of the third insulating layer comprises a region in contact with the common electrode.

8. The display device according to claim 1,
wherein the first pixel comprises a common layer between the first EL layer and the common electrode,
wherein the second pixel comprises the common layer between the second EL layer and the common electrode, and
wherein each of the top surface of the first EL layer, the top surface of the second EL layer, and the top surface of the third insulating layer comprises a region in contact with the common layer.

9. The display device according to claim 1, wherein in a cross-sectional view of the display device, the top surface of the second insulating layer has a concave shape.

* * * * *